United States Patent
Shmel et al.

(10) Patent No.: US 10,541,722 B2
(45) Date of Patent: Jan. 21, 2020

(54) PHOTONIC COMPRESSED SENSING NYQUIST FOLDING RECEIVER

(71) Applicant: The United States of America, as represented by the Secretary of the Navy, Arlington, VA (US)

(72) Inventors: Richard Nicholas Shmel, Bentonville, AR (US); Phillip E. Pace, San Juan Bautista, CA (US)

(73) Assignee: The United States of America, as represented by the Secretary of the Navy, Arlington, VA (US)

( * ) Notice: Subject to any disclaimer, the term of this patent is extended or adjusted under 35 U.S.C. 154(b) by 0 days.

(21) Appl. No.: 16/191,871

(22) Filed: Nov. 15, 2018

(65) Prior Publication Data

US 2019/0149191 A1 May 16, 2019

Related U.S. Application Data

(60) Provisional application No. 62/586,958, filed on Nov. 16, 2017.

(51) Int. Cl.
| | |
|---|---|
| *H04B 1/71* | (2011.01) |
| *H04B 1/7163* | (2011.01) |
| *H04B 1/717* | (2011.01) |
| *H04B 1/69* | (2011.01) |

(52) U.S. Cl.
CPC ....... *H04B 1/71637* (2013.01); *H04B 1/7174* (2013.01); *H04B 2001/6912* (2013.01)

(58) Field of Classification Search
CPC .............. H04B 1/71637; H04B 1/7174; H04B 2001/6912

USPC .......................................................... 375/139
See application file for complete search history.

(56) References Cited

U.S. PATENT DOCUMENTS

| | | | |
|---|---|---|---|
| 6,031,879 | A | 2/2000 | Pace et al. |
| 8,269,658 | B1 | 9/2012 | Pace et al. |
| 9,590,740 | B1 | 3/2017 | Pace et al. |
| 9,654,208 | B2 | 5/2017 | Bucholtz et al. |

OTHER PUBLICATIONS

M. Nixon and A. Aguado, Feature Extraction and Image Processing, 1st ed. Jordon Hill, Oxford: Newnes, 2004, pp. 76-79.
A. Yariv and P. Yeh, Photonics: Optical Electronics in Modern Communications, 6th ed. New York, NY: Oxford University Press, 2007, pp. 426-427, 521-523.

(Continued)

*Primary Examiner* — Michael R Neff
(74) *Attorney, Agent, or Firm* — Naval Postgraduate School; Lisa A. Norris

(57) ABSTRACT

Disclosed herein is a design, simulation, and hardware build of a photonic compressed sensing Nyquist folding receiver that is able to directly undersample wideband RF signals and detect the original Nyquist zone and frequency information. According to an exemplary embodiment, this is achieved by generating a frequency modulated optical impulse train for directly undersampling the RF environment at the antenna. The impulse train undersamples the signals using an optical modulator configuration at 1550 nm and collects the detected samples in a low pass interpolation filter which is subsequently processed to extract the undersampled signals.

24 Claims, 37 Drawing Sheets
(31 of 37 Drawing Sheet(s) Filed in Color)

(56) References Cited

OTHER PUBLICATIONS

P.E. Pace, Detecting and Classifying Low Probability of Intercept Radar, 2nd ed. Norwood, MA: Artech House, 2009, pp. 86-94.
P. E. Pace, Advanced Techniques for Digital Receivers, 1st ed. Norwood, MA: Artech House, 2000, pp. 84-85.
K. Igarashi and K. Kikuchi, "Optical signal processing by phase modulation and subsequent spectral filtering aiming at applications to ultrafast optical communication systems," IEEE Journal of Selected Topics in Quantum Electronics, vol. 14, No. 3, pp. 551-565, May 2008.
M. R. Arvizo, J. Calusdian, K. B. Hollinger, and P. E. Pace, "Robust symmetrical number system preprocessing for minimizing encoding errors in photonic analog-to-digital converters," Optical Engineering, vol. 50, No. 8, 2011, pp. 084602-1-084602-11.
G. L. Fudge, R. E. Bland, M. A. Chivers, S. Ravindran, J. Haupt, and P. E. Pace, "A nyquist folding analog-to-information receiver," in 42nd Asilomar Conference on Signals, Systems and Computers, Oct. 2008, pp. 541-545.
R. Maleh, G. L. Fudge, F. A. Boyle, and P. E. Pace, "Analog-to-information and the nyquist folding receiver," IEEE Journal on Emerging and Selected Topics in Circuits and Systems, vol. 2, No. 3, pp. 564-578, Sep. 2012.
P.E. Pace, A. Kusmanoff, and G. L. Fudge, "Nyquist folding analog-to-information receiver: Autonomous information recovery using quadrature mirror filtering," in Conference Record of the Forty-Third Asilomar Conference on Signals, Systems and Computers, Nov. 2009, pp. 1581-1585.
T. W. Tedesso, "Use of symmetrical number systems in electronic warfare," Ph.D. dissertation, Dept. Elect. and Comp. Eng., Naval Postgraduate School, Monterey, CA, 2013.
Y. Li, Y. Zhang, and Y. Huang, "Slope value detection-based ditherless bias control technique for Mach-Zehnder modulator," Optical Engineering, vol. 52, No. 8, 2013, pp. 087109-1-087109-6.
T. Okamoto and F. Ito, "Ultrafast linear optical sampling technique for optical communication systems," in Opto-Electronics and Communications Conference, Jun. 2015, pp. 1-3.
R. Shmel and P. E. Pace, "Photonic compressed sensing nyquist folding receiver," in IEEE International Photonics Conference, Oct. 2017, pp. 633-634.
Wiley, R. ELINT: The Interception and Analysis of Radar Signals, 2nd ed. Norwood, MA: Artech House, 2006, pp. 1-8.

FIG. 15

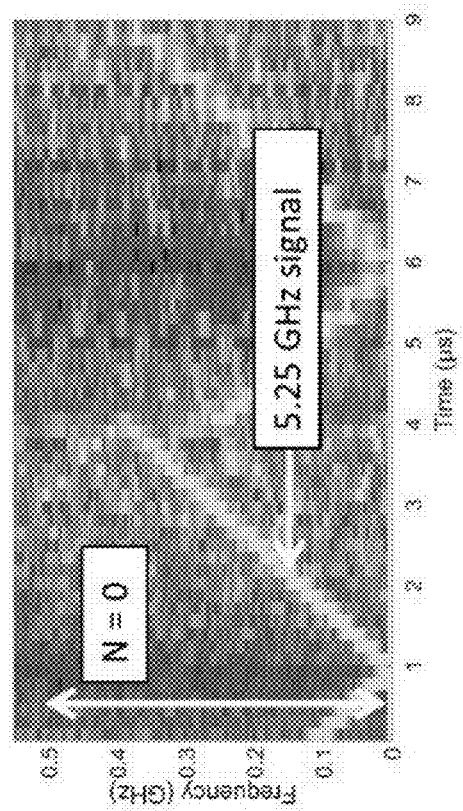
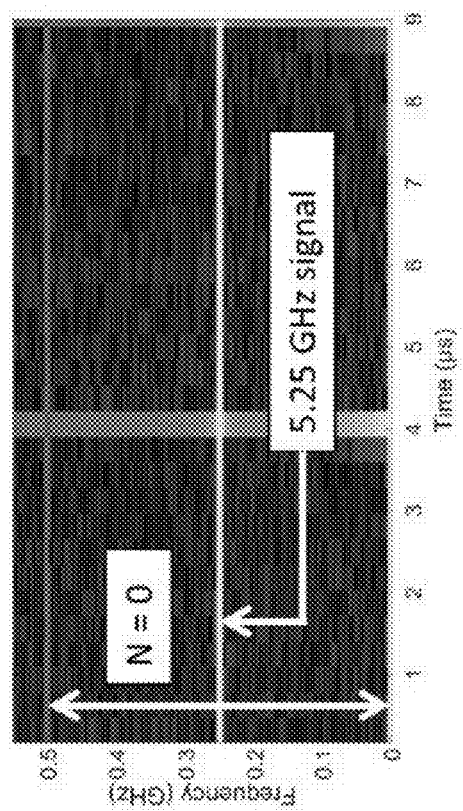
FIG. 19B
FIG. 19A

PHOTONIC COMPRESSED SENSING NYQUIST FOLDING RECEIVER

CROSS-REFERENCE TO RELATED APPLICATIONS

This application claims priority to U.S. Provisional Patent Application No. 62/586,958 filed on Nov. 16, 2017, entitled "PHOTONIC COMPRESSED SENSING NYQUIST FOLDING RECEIVER", the complete disclosure of which, in its entirety, is herein incorporated by reference.

BACKGROUND

The present disclosure relates to the compressed sensing of an electromagnetic environment using a Nyquist folding receiver (NYFR). It finds particular application in conjunction with the compressed sensing of a radio frequency (RF) environment using a NYFR and operatively associated antenna, and will be described with particular reference thereto. However, it is to be appreciated that the present exemplary embodiment is also amenable to other like applications.

Electronic intelligence (ELINT) is intelligence gathering using electronic sensors focused on RF signals-of-interest. Target signals vary wildly, ranging from radar, navigation beacons, jammers, radio control links, guidance systems, and identification friend or foe (IFF) systems (see R. Wiley, *The interception and analysis of radar signals,* 2nd ed. Norwood, Mass.: Artech House, 2006, pp. 1-8). Signals intelligence (SIGINT) is related to ELINT but is primarily focused on communication signals. These terms are often used interchangeably in electronic warfare (EW) literature. EW Receivers measure pulsed and low probability of intercept (LPI) signals and determine their carrier frequencies, pulse characteristics, phase or frequency variations, and polarization (see R. Wiley, *The interception and analysis of radar signals,* 2nd ed. Norwood, Mass.: Artech House, 2006, pp. 1-8.) The Nyquist folding receiver (NYFR) described herein is able to provide pulse rate, carrier frequency, phase variation, and frequency variation information while utilizing a compressed sensing methodology.

Wideband spectrum analysis of electromagnetic waveforms is constrained by many factors. Traditional receivers are limited by sampling speeds that must meet the Nyquist criterion and components with limited bandwidths, both of which prevent wideband interception of the radio frequency (RF) environment. The design, simulation, and prototyping of a photonic Nyquist folding receiver that alleviates many of the limiting factors that restrict current wideband signal collection are discussed in this thesis.

Prior work on Nyquist folding receivers has resulted in successful implementations of electrical receivers, but these are limited by their components in terms of bandwidth and sampling speed. This disclosure and the exemplary embodiments described herein addresses these concerns by developing a photonic compressed sensing receiver that takes advantage of advances in integrated optical components to sample and unfold wideband RF signals from the environment.

One motivation or benefit associated with the described exemplary embodiments is the application of compressed sensing techniques to a NYFR design implemented with wideband integrated optical components. Progress with photonic devices is rapidly surpassing conventional electronic systems. Digital EW receivers are taking advantage of these advances in order to digitize and process wide spectrum bandwidths. Specifically, optical receivers have an advantage in bandwidth, sampling speed, and immunity to electromagnetic interference. Photonic LiNbO3 modulators now have bandwidths on the order of 40 GHz and can efficiently couple RF-antenna signals directly into the optical domain (see K. Igarashi and K. Kikuchi, "Optical signal processing by phase modulation and subsequent spectral filtering aiming at applications to ultrafast optical communication systems," IEEE Journal of Selected Topics in Quantum Electronics, vol. 14, no. 3, pp. 551-565, May 2008). Mode-locked lasers used for sampling now have tunable femtosecond-wide pulse widths with pulse-repetition frequencies (PRF) on the order of 300 GS/s to allow over sampling of complex modulations (see M. R. Arvizo, J. Calusdian, K. B. Hollinger, and P. E. Pace, "Robust symmetrical number system preprocessing for minimizing encoding errors in photonic analog-to-digital converters," *Optical Engineering,* vol. 50, no. 8, 2011).

INCORPORATION BY REFERENCE

Reference is made to the following documents, the disclosures of which are incorporated herein by reference in their entireties.

U.S. Pat. No. 9,654,208, by Bucholtz et al., issued May 16, 2017 and entitled "SYSTEM AND METHOD FOR PHOTONIC COMPRESSIVE SAMPLING".

R. Wiley, *The interception and analysis of radar signals,* 2nd ed. Norwood, Mass.: Artech House, 2006, pp. 1-8.

K. Igarashi and K. Kikuchi, "Optical signal processing by phase modulation and subsequent spectral filtering aiming at applications to ultrafast optical communication systems," *IEEE Journal of Selected Topics in Quantum Electronics,* vol. 14, no. 3, pp. 551-565, May 2008.

M. R. Arvizo, J. Calusdian, K. B. Hollinger, and P. E. Pace, "Robust symmetrical number system preprocessing for minimizing encoding errors in photonic analog-to-digital converters," *Optical Engineering,* vol. 50, no. 8, 2011.

G. L. Fudge, R. E. Bland, M. A. Chivers, S. Ravindran, J. Haupt, and P. E. Pace, "A nyquist folding analog-to-information receiver," in 42*nd Asilomar Conference on Signals, Systems and Computers,* October 2008, pp. 541-545.

R. Maleh, G. L. Fudge, F. A. Boyle, and P. E. Pace, "Analog-to-information and the nyquist folding receiver," IEEE Journal on Emerging and Selected Topics in Circuits and Systems, vol. 2, no. 3, pp. 564-578, September 2012.

P. E. Pace, A. Kusmanoff, and G. L. Fudge, "Nyquist folding analog-to-information receiver: Autonomous information recovery using quadrature mirror filtering," in *Conference Record of the Forty-Third Asilomar Conference on Signals, Systems and Computers,* November 2009, pp. 1581-1585.

P. E. Pace, A. Kusmanoff, and G. L. Fudge, "Nyquist folding analog-to-information receiver: Autonomous information recovery using quadrature mirror filtering," in *Conference Record of the Forty-Third Asilomar Conference on Signals, Systems and Computers,* November 2009, pp. 1581-1585.

A. Yariv and P. Yeh, *Photonics: Optical Electronics in Modern Communications,* 6th ed. New York, N.Y.: Oxford University Press, 2007, p. 426.

T. W. Tedesso, "Use of symmetrical number systems in electronic warfare," Ph.D. dissertation, Dept. Elect. and Comp. Eng., Naval Postgraduate School, Monterey, Calif., 2013.

Y. Li, Y. Zhang, and Y. Huang, "Slope value detection-based ditherless bias control technique for Mach-Zehnder modulator," *Optical Engineering*, vol. 52, no. 8, pp. 87-109, 2013.

A. Yariv and P. Yeh, Photonics: *Optical Electronics in Modern Communications*, 6th ed. New York, N.Y.: Oxford University Press, 2007, pp. 521-523.

P. E. Pace, *Detecting and Classifying Low Probability of Intercept Radar*, 2nd ed. Norwood, Mass.: Artech House, 2009, pp. 86-94.

T. Okamoto and F. Ito, "Ultrafast linear optical sampling technique for optical communication systems," in *Opto-Electronics and Communications Conference*, June 2015, pp. 1-3.

P. E. Pace, *Advanced Techniques for Digital Receivers*, 1st ed. Norwood, Mass.: Artech House, 2000, pp. 84-85.

R. Shmel and P. E. Pace, "Photonic compressed sensing nyquist folding receiver," in *IEEE International Photonics Conference*, October 2017.

M. Nixon and A. Aguado, *Feature Extraction and Image Processing*, 1st ed. Jordon Hill, Oxford: Newnes, 2004, pp. 76-79.

BRIEF DESCRIPTION

According to one exemplary embodiment of this disclosure, described is a photonic Nyquist Folding Receiver (NYFR) System for compressed sensing of a radio frequency (RF) environment, the photonic NYFR system comprising: a continuous wave (CW) laser source generating a CW laser output with a fixed wavelength; an electrical modulation signal source generating an electrical modulation impulse train signal output which is linearly swept to vary an amplitude and frequency of the electrical modulation impulse train; a wideband radio frequency (RF) antenna operatively associated amplifier generating a wideband electrical RF signal representative of a received RF signal; a first modulator operatively connected to the CW laser output and the electrical modulation impulse train signal output, the first modulator converting the CW laser to a sampling frequency modulated (FM) optical pulse train with a linearly swept pulse repetition frequency (PRF) and optical pulse intensity as a function of the frequency and amplitude of the electrical modulation impulse train signal, and the first modulator outputting to an output the sampling FM optical pulse train; a second modulator operatively connected to receive the wideband electrical RF signal generated by the wideband RF antenna, and operatively connected to the first modulator output to receive the sampling FM optical pulse train, the second modulator modulating the amplitude of the sampling optical pulses with the wideband electrical RF signal generated by the wideband RF antenna, thereby encoding the RF signal as an amplitude modulated (AM) envelope of the sampling optical pulse train; a photonic to electrical converter operatively connected to the second modulator, the photonic to electrical converter converting the AM envelope of the sampling FM optical pulse train to a representative electrical signal; and a low pass interpolation filter (LPF) operatively connected to the photonic to electrical converter to receive the representative electrical signal of the AM envelope of the sampling FM optical pulse train, the LPF outputting a Nyquist band compressed representation of the AM envelope of the sampling FM optical pulse train.

According to another exemplary embodiment of this disclosure, described is a photonic Nyquist Folding Receiver (NYFR) for compressed sensing of a radio frequency (RF) environment, the photonic NYFR comprising: an electrical modulation signal source generating an electrical modulation impulse train signal output which is linearly swept to varying an amplitude and frequency of the electrical modulation impulse train; a first modulator operatively associated with receiving a continuous wave (CW) laser output and the electrical modulation impulse train signal output, the first modulator converting the CW laser output to a sampling frequency modulated (FM) optical pulse train with a linearly swept pulse repetition frequency (PRF) and optical pulse intensity as a function of the frequency and amplitude of the electrical modulation impulse train signal and the first modulator outputting to an output the sampling FM optical pulse train; a second modulator operatively associated with receiving a wideband electrical RF signal generated by a wideband RF antenna, and operatively connected to the first modulator output to receive the sampling FM optical pulse train, the second modulator modulating the amplitude of the sampling optical pulses with the wideband electrical RF signal generated by the wideband RF antenna, thereby encoding the RF signal as an amplitude modulated (AM) envelope of the sampling optical pulse train; a photonic to electrical converter operatively connected to the second modulator, the photonic to electrical converter converting the AM envelope of the sampling FM optical pulse train to a representative electrical signal; and a low pass interpolation filter (LPF) operatively connected to the photonic to electrical converter to receive the representative electrical signal of the AM envelope of the sampling FM optical pulse train, the LPF outputting a Nyquist band compressed representation of the AM envelope of the sampling FM optical pulse train.

According to still another exemplary embodiment of this disclosure, described is a photonic Nyquist Folding Receiver (NYFR) System for compressed sensing of a radio frequency (RF) environment, the photonic NYFR system comprising: a continuous wave (CW) laser source configured to generate a CW laser output with a fixed wavelength; an electrical modulation signal source configured to generate an electrical modulation impulse train signal output which is linearly swept to vary an amplitude and frequency of the electrical modulation impulse train; a wideband radio frequency (RF) antenna system configured to generate a wideband electrical RF signal representative of a received RF signal; a first modulator operatively connected to the CW laser output and the electrical modulation impulse train signal output, the first modulator configured to convert the CW laser to a sampling frequency modulated (FM) optical pulse train with a linearly swept pulse repetition frequency (PRF) and optical pulse intensity as a function of the frequency and amplitude of the electrical modulation impulse train signal, and the first modulator configured to output to an output the sampling FM optical pulse train; a second modulator operatively connected to receive the wideband electrical RF signal generated by the wideband RF antenna, and operatively connected to the first modulator output to receive the sampling FM optical pulse train, the second modulator configured to modulate the amplitude of the sampling optical pulses with the wideband electrical RF signal generated by the wideband RF antenna, thereby encoding the RF signal as an amplitude modulated (AM) envelope of the sampling optical pulse train; a photonic to electrical converter operatively connected to the second modular, the photonic to electrical converter configured to convert the AM envelope of the sampling FM optical pulse train to a representative electrical signal; and a low pass interpolation filter (LPF) operatively connected to the photonic to electrical converter configured to receive the representative electrical signal of the AM envelope of the sampling FM optical pulse train, the LPF configured to output a Nyquist band compressed representation of the AM envelope of the sampling optical pulse train.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The following is a brief description of the drawings, which are presented for the purposes of illustrating the exemplary embodiments disclosed herein and not for the purposes of limiting the same.

FIG. 15 illustrates an unfolding of the original 2.75 GHz signal.

FIGS. 19A and 19B illustrate a 5.25 GHz RF results from an unmodulated sampling signal and modulated sampling signal, respectively.

FIG. 34A is the raw ADC signal, FIG. 34B is the initial de-nosing and normalization, FIG. 34C is the optimal thresholding, and FIG. 34D is the final signal after edge detection, according to an exemplary embodiment of this disclosure.

FIG. 36A is the raw ADC signal, FIG. 36B is the initial de-nosing and normalization, FIG. 36C is the optimal thresholding, and FIG. 36D is the final signal after edge detection.

DETAILED DESCRIPTION (1) Introduction

Figure 1A:
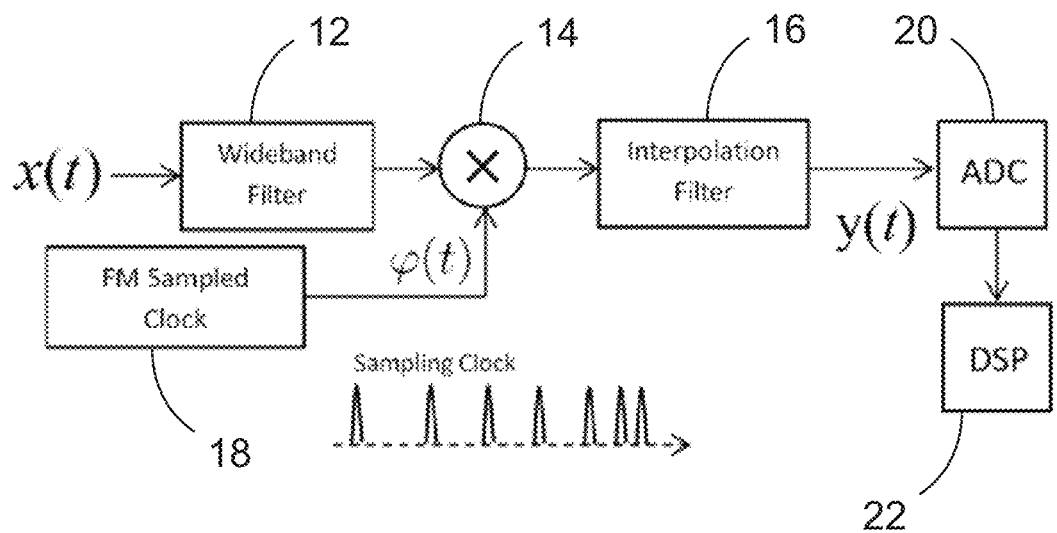
FIGS. 1A and 1B illustrate an Analog-to-Information Receiver showing a NYFR operation and signed Nyquist zones, respectively, according to an exemplary embodiment of this disclosure.

This disclosure and the exemplary embodiments described herein apply compressed sensing techniques to a new receiver design implemented with wideband integrated optical components. A photonic Nyquist folding receiver (NYFR) is designed and confirmed with computer simulations. A proof-of-concept hardware prototype is also described and shown with reference to the figures, which advances the NYFR beyond simulations and provides a physical construction.

The use of integrated optical components and how they can be used to implement a compressed sensing microwave photonic receiver are investigated in this thesis. The scope of this research covers the design, simulation, and hardware build of a photonic compressed sensing Nyquist folding receiver that is able to directly undersample wideband RF signals and detect the original Nyquist zone and frequency information. This is achieved by generating a frequency modulated optical impulse train for directly undersampling the RF environment at the antenna. The impulse train undersamples the signals using an optical modulator configuration at 1550 nm and collects the detected samples in a low pass interpolation filter. Two independent photonic receiver architectures are designed and analyzed over the course of this research. Both receiver designs are simulated in the OPTSIM photonic design suite and are able to successfully extract the undersampled signals. The first receiver design proved more effective at representing the signal environment and was constructed using electro-optical hardware. Using off-the-shelf components in a proof-of-concept hardware prototype, we confirmed the simulation results by correctly identifying input test frequencies up to an order of magnitude higher than the sampling frequency.

A more complete understanding of the components, processes, apparatuses, and methods disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings and are not intended to define or limit the scope of the disclosure. In the drawings and the following description below, it is to be understood that like numeric designations refer to components of like function.

Numerical values in the specification and claims of this application should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently combinable (for example, the range of "from 2 to 10" is inclusive of the endpoints, 2 and 10, and all the intermediate values).

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

As used herein, the term "ADC" stands for Analog-to-Digital Converter.

As used herein, the term "CW" stands for Continuous Wave.

As used herein, the term "ELINT" stands for Electronic Intelligence.

As used herein, the term "EW" stands for Electronic Warfare.

As used herein, the term "FM" stands for Frequency Modulated.

As used herein, the term "LNA" stands for Low Noise Amplifier.

As used herein, the term "LPF" stands for Low Pass Filter.

As used herein, the term "MZI" stands for Mach-Zehnder Interferometer.

As used herein, the term "NYFR" stands for Nyquist folding receiver.

As used herein, the term "PRF" stands for Pulse-Repetition Frequency.

As used herein, the term "PRI" stands for Pulse-Repetition Interval.

As used herein, the term "RF" stands for Radio Frequency.

As used herein, the term "SIGINT" stands for Signals Intelligence.

This disclosure provides a novel compressed sensing receiver that takes advantage of optical signal processing techniques. Detailed herein is the entire engineering process from the initial architectural designs, through computer simulations, and ending in a hardware prototype proof of concept. Additional contributions provided include a robust method of generating frequency modulated optical pulses and analyzing the functional limitations of photonic sampling. Lastly, the construction of a hardware prototype confirms the physical operation of the receiver design.

The disclosed NYFR receiver relies on frequency swept optical pulses to function as a sampling impulse train. Initially, two separate designs were investigated for implementing a modulated sampling impulse function. The first design examined using two separate optical modulators coupled together with one modulator generating an optical sampling impulse train and the other incepting the target RF signal. Sampling pulses are generated electrically using an electrical pulse generator which is connected to a modulator to convert electrical impulses into optical impulses. The sampling frequency modulated (FM) Dirac function is coupled to a second modulator that incepts the antenna signal onto the optical pulses. After sampling the RF environment, the optical waveform is coupled to a photodiode and amplifier for envelope detection and later digitization. A second architecture developed utilizes a single modulator to incept the RF signal which is sampled by an analog-to-digital converter (ADC). The trigger for the ADC is modulated in order to achieve non-uniform sampling.

Next, both designs were simulated in the OPTSIM photonic design suite in order to confirm the functionality of the NYFR compressed sensing receiver. The test results using simulated RF signals showed that the designs are successful in unfolding undersampled waveforms in the optical domain and confirming the receiver's effectiveness. Test results indicated that the two modulator architecture had superior performance.

After successful undersampling with RF signals above the Nyquist rate, a prototype hardware build was completed. Translating a theoretical model into a functional receiver included designing a novel electrical pulse-generator circuit that outputs a pulse train with a frequency modulated pulse-to-pulse interval. After successfully incepting imitation RF signals from a signal generator, the receiver output was sampled and analyzed using digital signal processing (DSP) spectrogram techniques. The signals were analyzed in a time-frequency representation including de-noising and edge detecting the signals. Hardware tests confirmed the simulation results by correctly unfolding the undersampled signals. Ultimately, the prototype hardware design proved successful in incepting and extracting RF signals using NYFR compressed sensing receiver as disclosed herein.

(2) Nyquist Folding Methodology

The model of the photonic receiver disclosed is a compressed sensing method known as Nyquist folding. The relevant NYFR theory, governing equations, and operation is described in this section. In order to effectively sample a signal using only one piece of information, the sampling frequency must be greater than twice the maximum signal bandwidth. This is the Nyquist criterion and is written as $$f_{sam} > 2B_{sig} \tag{2.1}$$

where $f_{sam}$ is the sampling rate, and $B_{sig}$ is the signal bandwidth.

Sampling at a rate lower than $f_{sam}$ is called undersampling and causes aliased signals that are symmetrical around $f_{sam}/2$. The NYFR takes advantage of aliasing in order to fold large bandwidths of the RF spectrum into undersampled narrow bandwidths which are later recovered.

(2.1) Analog-to-Information Receiver

Figure 1B:
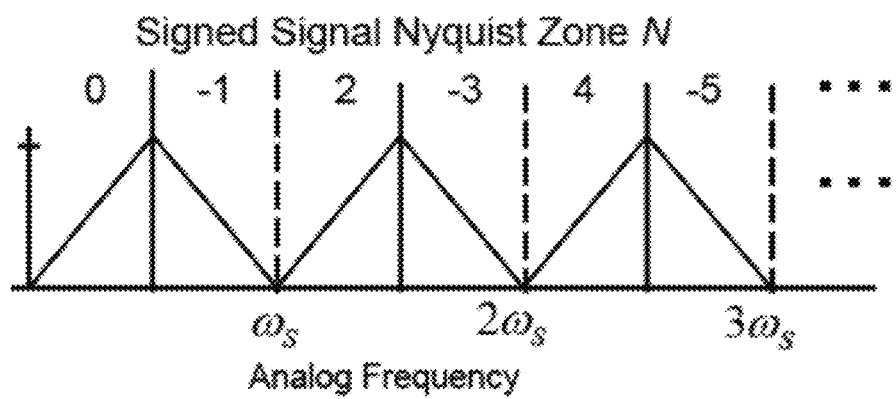

The NYFR functional block diagram is shown in FIG. 1A along with an illustration of the signed Nyquist zones in FIG. 1B. The NYFR uses a wideband front-end filter 12 to select RF frequencies of interest from the environment. The passband must be selected so that the bandwidth is less than or equal to the NYFR maximum intercept frequency. Signals from the wideband filter 12 are sampled by a FM swept clock 18 which is coupled 14 to a narrow band interpolation low pass filter (LPF). Lastly, a uniform sampling analog-to-digital converter 20 digitizes the signal. Unlike traditional receivers which use a uniform sampling rate, the NYFR uses an undersampling rate many times lower than the bandwidth of interest (see G. L. Fudge, R. E. Bland, M. A. Chivers, S. Ravindran, J. Haupt, and P. E. Pace, "A nyquist folding analog-to-information receiver," in 42nd Asilomar Conference on Signals, Systems and Computers, October 2008, pp. 541-545).

Target RF signals are aliased into lower frequency zones which are symmetrical around intervals of the undersampling rate $\omega_s$. These are referred to as Nyquist zones and are diagrammed in FIG. 1B. The Nyquist zones are named in an alternating sign convention and are each $\omega_s/2$ rad/s wide. If the sampling rate is uniform, these aliased signals are indistinguishable from the true center frequency; however, the NYFR samples with a modulated linear chirp slope. The sampling waveform imparts a modulation on the target signal which is dependent on the original Nyquist zone of origin (see R. Maleh, G. L. Fudge, F. A. Boyle, and P. E. Pace, "Analog-to-information and the nyquist folding receiver," IEEE Journal on Emerging and Selected Topics in Circuits and Systems, vol. 2, no. 3, pp. 564-578, September 2012).

The FM sampling clock generates a sampling signal centered around an undersampling frequency $\omega_s$ with a RF sampling clock modulation $\theta(t)$ as $$\varphi(t) = \omega_s t + \theta(t) \tag{2.2}$$

and is used to sample the RF spectrum. An example target signal is modeled as $$x(t) = \cos(\omega_c t + \psi(t)) \tag{2.3}$$

where $\omega_c$ is the center frequency and $\psi$ represents the RF signal information content.

Convolving the two signals through the LPF yields the interpolation filter output $$y(t) = \cos(\omega_f t + \beta \psi(t) - M\theta(t)) \tag{2.4}$$

where $\omega_f$ is the output folded frequency in Nyquist zone N=0, $\beta = \text{sgn}(\omega_c - \omega_s k)$ and is the folded spectral orientation, and $M = 1/\beta k$ which is the modulation scale factor (see R. Maleh, G. L. Fudge, F. A. Boyle, and P. E. Pace, "Analog-to-information and the nyquist folding receiver," IEEE Journal on Emerging and Selected Topics in Circuits and Systems, vol. 2, no. 3, pp. 564-578, September 2012). Also, $k = \text{round}(\omega_c/\omega_s)$ and is called the sampling harmonic factor (see G. L. Fudge, R. E. Bland, M. A. Chivers, S. Ravindran, J. Haupt, and P. E. Pace, "A nyquist folding analog-to-information receiver," in 42nd Asilomar Conference on Signals, Systems and Computers, October 2008, pp. 541-545 and R. Maleh, G. L. Fudge, F. A. Boyle, and P. E. Pace, "Analog-to-information and the nyquist folding receiver," IEEE Journal on Emerging and Selected Topics in Circuits and Systems, vol. 2, no. 3, pp. 564-578, September 2012.

The induced modulation scale factor M is measurable and $\theta(t)$ is known, so the original signal Nyquist zone can be estimated. Expanding $\omega_f$ from equation (2.4) results in the output folded frequency $$\omega_f = |\omega_c - \omega_s k| \tag{2.5}$$

which shows the relationship between the sampling modulation and RF center frequency (see R. Maleh, G. L. Fudge, F. A. Boyle, and P. E. Pace, "Analog-to-information and the nyquist folding receiver," IEEE Journal on Emerging and Selected Topics in Circuits and Systems, vol. 2, no. 3, pp. 564-578, September 2012).

(2.2) Unfolding the Undersampled Signals

In order to extract original frequency information from the aliased signals in Nyquist zone N=0, they must be unfolded and the ambiguities resolved. From equations (2.4) and (2.5) and it is shown that the modulated RF signal frequency is a function of the original center frequency and the applied chirp modulation. The minimum difference between the signal modulation and clock modulation scaled by the Nyquist zone indicates the signal's original frequency region. The target frequency is extracted from the aliased signal in the N=0 Nyquist zone by first generating an array Z[i] of the modulated signal slope $S_m$ minus the FM clock slope $S_c$ scaled by the signed Nyquist zones M(i). The array is modeled as $$Z[i] = (S_m - M(i)S_c)^2 \tag{2.6}$$

where $S_c$ is the slope of the clock modulation, $S_m$ is the slope of the pulse train in time-frequency analysis, and M(i) is the signed Nyquist zones N=[0, −1, 2, −3 . . . ], respectively.

The next step is to find the index i of the minimum value of the array so that i=min (Z[i]). Lastly, the unfolded Nyquist zone is defined by $$N=\text{sgn}(M(i))(i-1) \qquad (2.7)$$

where N is the original signed Nyquist zone of the RF signal. Adding the center frequency from Nyquist zone N=0 yields $\omega_c$ (see P. E. Pace, A. Kusmanoff, and G. L. Fudge, "Nyquist folding analog-to-information receiver: Autonomous information recovery using quadrature mirror filtering," in Conference Record of the Forty-Third Asilomar Conference on Signals, Systems and Computers, November 2009, pp. 1581-1585). This is shown in Section 4.1 for a 2.75-GHz test signal applied to the photonic NYFR simulation.

The NYFR compressed sensing theory and operation is detailed in this chapter by first modeling the NYFR architecture and then describing the governing equations. The analog-to-information process uses clock modulation to impart a slope onto an undersampled signal, which is then used to unfold the aliased waveform. The photonic NYFR designs as well as the integrated optical components used in the architecture are detailed in the next chapter.

(3) Receiver Operation and Design

Correct implementation of a photonic NYFR prototype first requires a detailed design and analysis of required components. Additionally, operating limits and constraints must be taken into account during the design phase. In order to test the feasibility of a photonic compressed sensing receiver, two independent designs were investigated. The first is a purely optical primary design, the second receiver is an electro-optical solution that functions as an interim design and technology demonstrator for the proposed architecture.

The design phase and the integrated optical components used in the photonic NYFR are described in this section. The two receivers are discussed in detail with emphasis on design choices and operating methodology. The constraints of optical sampling components along with each receiver's operating limitations are described in the last section.

(3.1) Integrated Optical Components

The optical components of the NYFR are described in this section. Both design solutions integrate laser sources, optical modulators, and optical detectors in order to undersample and modulate a signal waveform. The specific component types and their operations are expanded upon in subsections.

(3.1.1) Semiconductor Laser Source

A continuous wave (CW) semiconductor laser is used as the optical emitter for the NYFR. The specific design is a buried heterostructure laser consisting of a gallium arsenide (GaAs) bandgap junction embedded in an AlGaAs substrate. A wavelength of 1550 nm was used to limit attenuation over the connecting single mode fiber optic cable. The laser operates by applying current above a threshold value $I_t$, increasing the probability of carrier recombination in the GaAs bandgap and resulting in stimulated emission. The emitted optical power is written as $$P_e = \frac{(I-I_t)\eta_i}{e}h\nu \qquad (3.1)$$

where I is the applied electric current, h is Planck's constant, $\nu$ is the frequency, e is elementary charge, and $\eta_i$ the probability of carrier recombination in the gap region (see P. E. Pace, A. Kusmanoff, and G. L. Fudge, "Nyquist folding analog-to-information receiver: Autonomous information recovery using quadrature mirror filtering," in Conference Record of the Forty-Third Asilomar Conference on Signals, Systems and Computers, November 2009, pp. 1581-1585). In cases where the laser is modulated directly through the supply current, the applied electric current has both AC and DC components (see P. E. Pace, A. Kusmanoff, and G. L. Fudge, "Nyquist folding analog-to-information receiver: Autonomous information recovery using quadrature mirror filtering," in *Conference Record of the Forty-Third Asilomar Conference on Signals, Systems and Computers*, November 2009, pp. 1581-1585).

$$I=I_0+i_0 e^{i\omega_m t} \qquad (3.2)$$

where $\omega_m$ is the modulation frequency and $I_0$ and $i_0$ are constant DC and AC current magnitudes.

(3.1.2) Optical Modulators

Figure 2A:
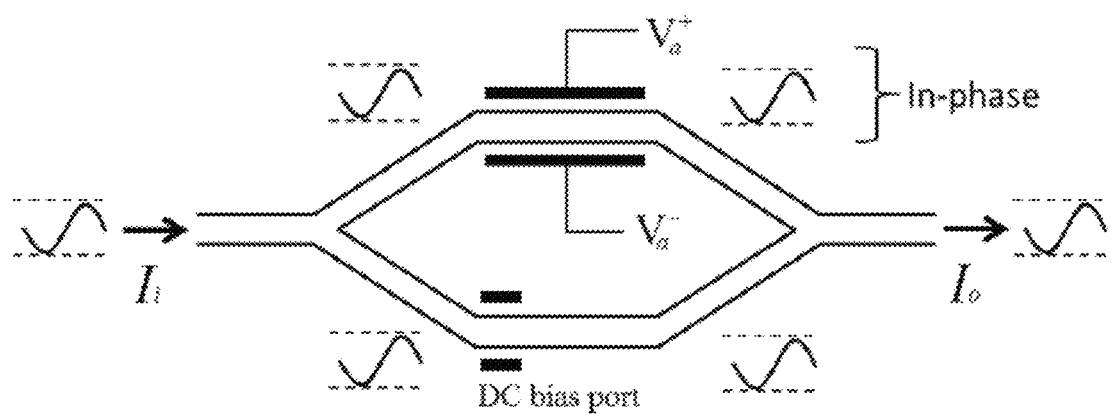
FIGS. 2A and 2B illustrate a diagram of single-arm MZI showing an in-phase constructive interference and out-of-phase destructive interference, respectively, according to an exemplary embodiment of this disclosure.
Figure 2B:
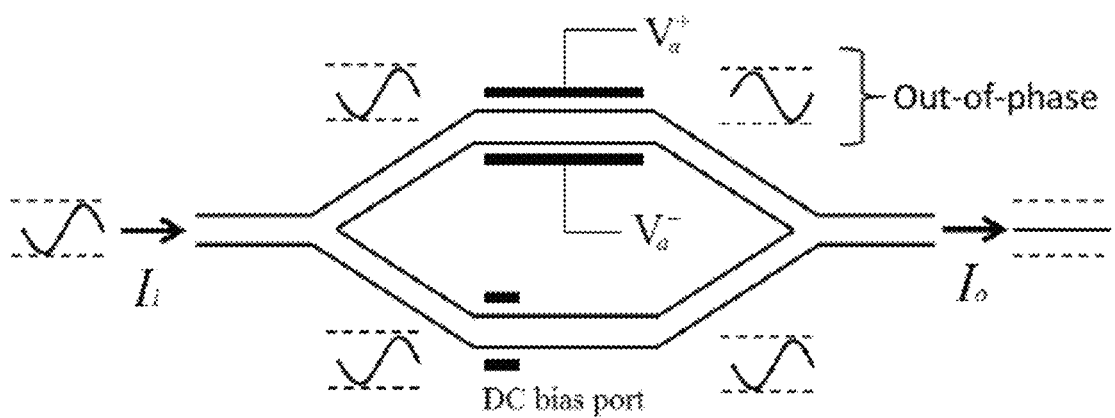

Both receiver designs used one or more electro-optic modulators to modulate a CW laser source. Mach-Zehnder Interferometers (MZIs) are used to facilitate amplitude modulation through splitting and recombination of in-phase and out-of-phase beams. The photonic NYFR designs used single-arm MZIs composed of a metallic-infused lithium niobate waveguide channel which splits into two branches at a Y-junction. The upper branch is bracketed by electrodes which apply a voltage potential to the upper waveguide. Voltage applied to the electrodes creates an electromagnetic field through the niobate structure. This alters the β propagation constant on the branch and changes the traveling wave's phase. A second Y-junction recombines the two branches. Depending on the phase difference Δϕ, we see that the two waves undergo either constructive or destructive interference which modulates the output optical intensity (see A. Yariv and P. Yeh, Photonics: *Optical Electronics in Modern Communications,* 6th ed. New York, N.Y.: Oxford University Press, 2007, p. 426). This is illustrated in FIGS. 2A and 2B for an applied electrode voltage $V_\alpha$.

The output optical intensity $I_0$ of an MZI is a function of the Δϕ path length phase difference and is $$I_0 = \frac{I_i}{2}[1+\cos(\Delta\phi)] \qquad (3.3)$$

where $I_i$ is the incident optical intensity. The phase difference between the recombining waveforms from each MZI branch is $$\Delta\phi = \left(\pi\frac{V_\alpha}{V_\pi} + \varphi_0\right) \qquad (3.4)$$

where $V_\pi$ is the switching/threshold voltage, $V_\alpha$ is the applied electrode voltage, and $\varphi_0$ is an initial phase offset that is built into the device or created with a DC voltage known as a DC bias (see T. W. Tedesso, "Use of symmetrical number systems in electronic warfare," Ph.D. dissertation, Dept. Elect. and Comp. Eng., Naval Postgraduate School, Monterey, Calif., 2013).

When there is a phase difference of $\Delta\phi=\pi$, the output has its lowest value, while a phase difference of zero results in the highest output value. Combining equations (3.3) and (3.4), the expanded MZI output intensity is obtained as $$I_0 = \frac{I_i}{2}\left[1 + \cos\left(\pi\frac{V_a}{V_\pi} + \varphi_0\right)\right]. \quad (3.5)$$

Figure 3:
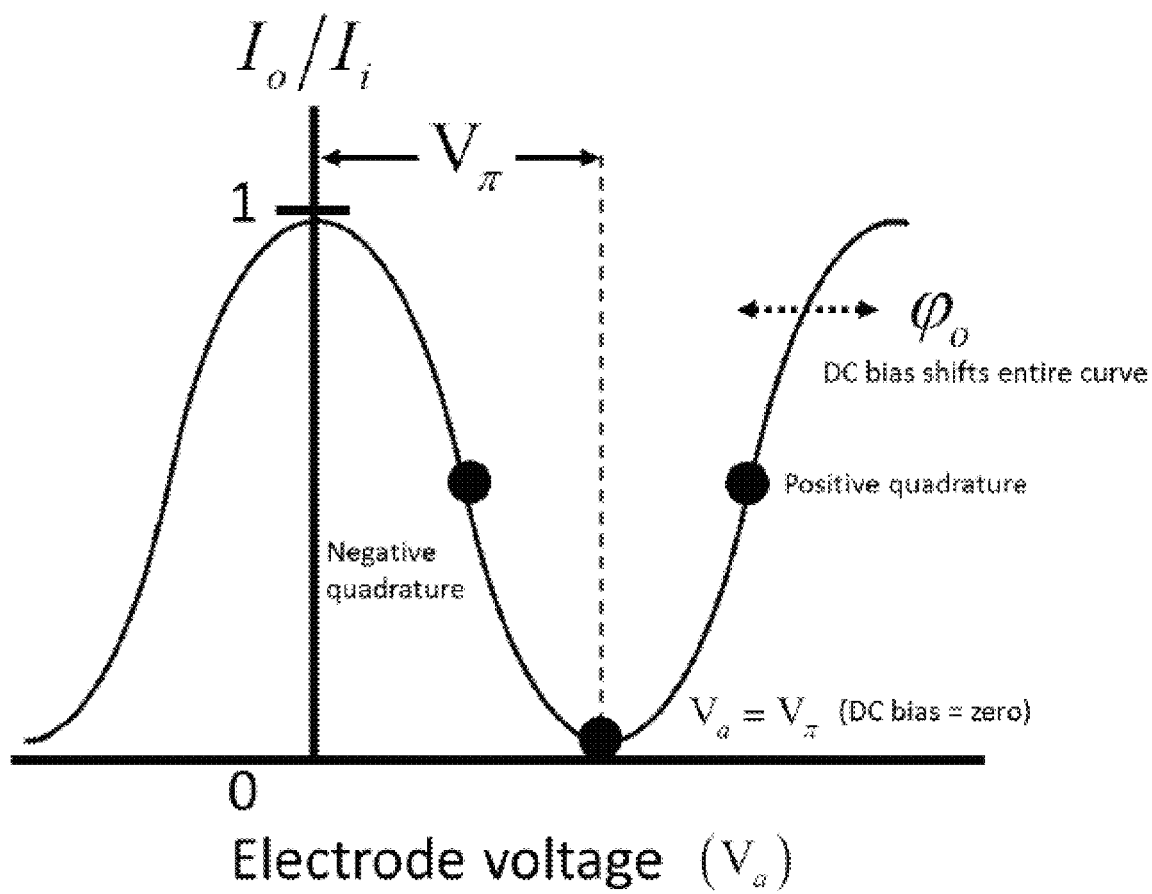
FIG. 3 illustrates a graphic representation of MZI function with both the quadrature and dc bias marked, according to an exemplary embodiment of this disclosure.

The modulator input/output intensity relationship, or transfer function, is represented graphically in FIG. 3.

For a modulator with equal guided-wave path lengths, the application of a DC bias translates the curve left and right. The use of an attenuator or amplifier at the antenna increases or decreases the value of $V_\pi$ respectively. This shows the output intensity as a function of the electrode voltage and illustrates the $V_\pi$ switching voltage. The quadrature point is created by an initial phase constant of $\varphi_0=\pi$ manufactured into the MZI so that any voltage applied shifts the output in the most linear region of operation (see Y. Li, Y. Zhang, and Y. Huang, "Slope value detection-based ditherless bias control technique for Mach-Zehnder modulator," *Optical Engineering*, vol. 52, no. 8, pp. 87-109, 2013). This configuration is ideal for coupling an AC small signal onto an optical carrier. The effect of a DC bias is shown as well, where a DC voltage is used to shift the curve such that the initial $V_a=0$ point is perfectly destructive interference and $V=V_\pi$ is the peak intensity point. This configuration is used for optical pulse generation.

(3.1.3) Optical Detectors

The exemplary photonic NYFR designs use PIN photodiode detectors to convert optical signals into electrical signals. These detectors consist of p-type and n-type doped silicon separated by an intrinsic region of high resistivity material. Absorption of photons in the silicon material causes electrons to drift and creates current (see A. Yariv and P. Yeh, Photonics: *Optical Electronics in Modern Communications*, 6th ed. New York, N.Y.: Oxford University Press, 2007, pp. 521-523). The NYFR photodiodes are matched to the 1550 nm wavelength of the CW laser. The two most important factors for PIN diodes are gain and frequency response. The NYFR photodiodes have an internal low noise amplifier (LNA) with a 10 dB gain and a frequency response bandwidth of 20 GHz. This response is primarily limited by the transit time of charge carriers separating from the substrate and moving to opposite ends of the depletion region. An internal shunting effect is also present and is calculated as $$\omega_P = \frac{1}{R_i C_i} \quad (3.6)$$

where $\omega_p$ is the photodiode cutoff frequency in rad/s and $R_i$ and $C_i$ are the internal resistance and capacitance of the diode, respectively (see A. Yariv and P. Yeh, Photonics: *Optical Electronics in Modern Communications*, 6th ed. New York, N.Y.: Oxford University Press, 2007, pp. 521-523).

(3.2) Double-Modulator Design Concept

The double-modulator NYFR (DM-NYFR) architecture is an implementation of a photonic compressed sensing receiver. It is designed around two MZI modulators. The first functions as a sampling impulse train generator while the second incepts the RF bandwidth. In the photonic NYFR architecture, the CW laser functions as a carrier for the signal and is analogous to electric current on a wire.

(3.2.1) DM-NYFR Operation and Block Diagram

Figure 4:
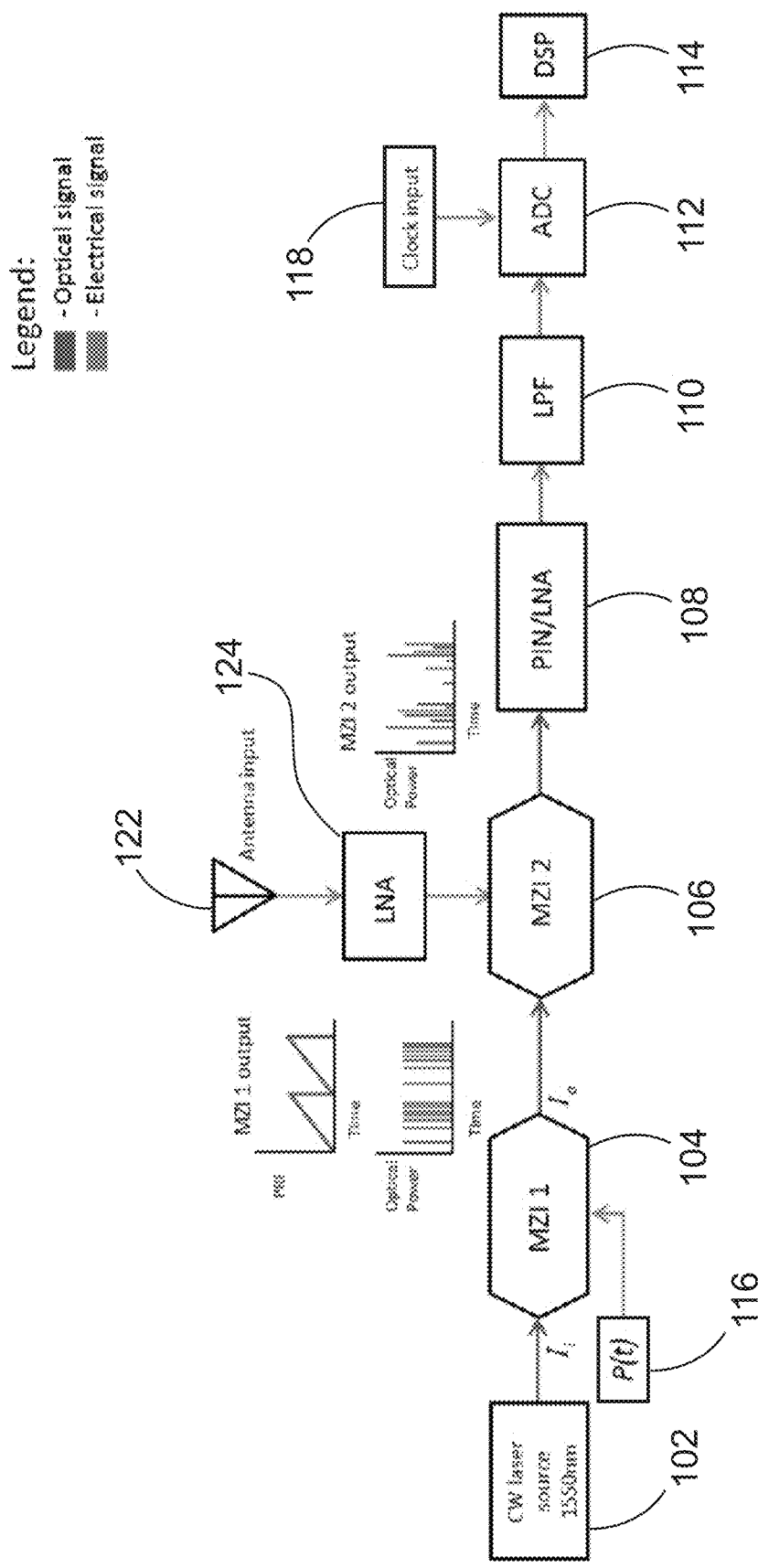
FIG. 4 illustrates a Double Modulator-NYFR (DM-NYFR) block diagram showing the overall architecture of the receiver, according to an exemplary embodiment of this disclosure.

The overall block diagram of the DM-NYFR is shown in FIG. 4. The front end of the architecture is a fiber-coupled CW laser at 1550 nm 102. This is connected to the first MZI 104 which converts the CW laser 102 into a sampling pulse train with a linearly swept pulse repetition frequency (PRF). An electrical signal P(t) 116 is connected to the single-arm electrodes of MZI1 104 and drives the modulation scheme by linearly sweeping a short electrical impulse train. The output optical pulse intensity, represented as $I_0$, is a function of the frequency and amplitude of the electric signal as well as the MZI transmission of equation (3.5). The front end optical pulse generation is discussed in detail in Section 3.2.2 below.

Figure 5:
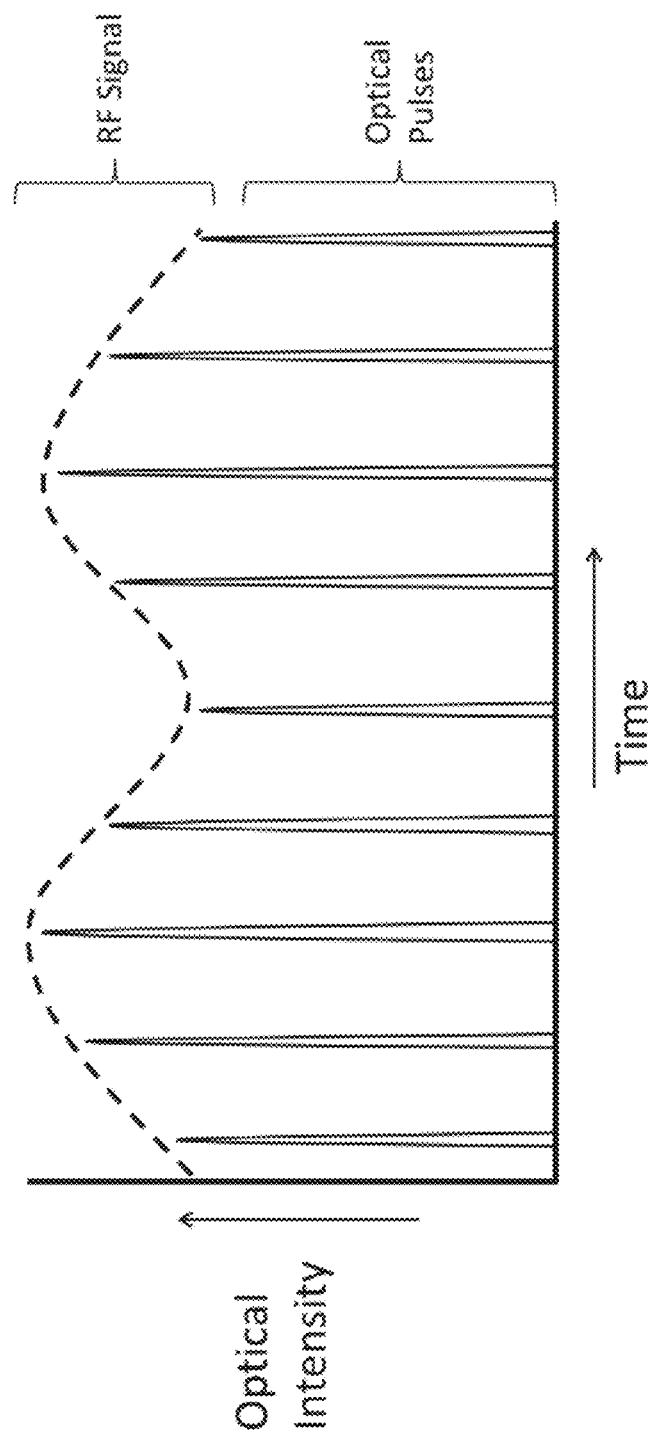
FIG. 5 illustrates an example of an arbitrary signal sampled by an optical pulse train, according to an exemplary embodiment of this disclosure.

The FM pulse train functions as a sampling signal. When coupled into the second MZI with the RF-signal input, the short-time duration pulses emulate the sampling electrical signal from equation (2.2). As the FM optical pulse train is passed into MZI2 106, RF signals from the environment are amplified 124 from an antenna 122 and used to drive MZI2's 106 electrode inputs. The amplitude of the input optical pulses from MZI1 104 are modulated with the amplified antenna signal voltage, encoding the RF signals as an amplitude modulated (AM) envelope on the sampling pulses. This concept/process is illustrated in FIG. 5, in which a diagram of an arbitrary sinusoidal signal encoded on a sampling pulse train is shown, providing an accurate representation of MZI2's optical output.

The output from MZI2 106 is coupled into a PIN photodiode 108 with an internal LNA in order to convert the optical signal into electrical current. An interpolation low pass filter (LPF) 110 is connected in series to the detector 108 output. The output of the interpolation filter 110 from the photonic NYFR is equivalent to y(t) of equation (2.4). The LPF bandwidth must be greater than or equal to $\omega_s/2$, which is the first Nyquist zone upper frequency shown in FIG. 1B. A sampling ADC 112 driven by a clock input 118 at $2\omega_s$ digitizes the information at the required Nyquist rate. Lastly, the ADC 112 passes this information to the digital signal processing (DSP) 114 block where the data is denoised and unfolded to extract the RF information from the environment.

(3.2.2) Optical Pulse Generation

The front end optical pulse generation using MZI1 106 shown in FIG. 4 is the most important part of the DM-NYFR architecture. Generating FM optical pulses with small pulse widths enables the NYFR to differentially alias signals to lower Nyquist zones for detection. In the DM-NYFR, optical pulses are generated by applying a pulse signal P(t) to MZI1 so that the coupled CW laser is selectively switched at a linear chirp rate. The electrical pulse signal at the input is modeled as an FM Dirac comb impulse train, comprised of n number of $\delta(t)$ delta functions. This is an approximation, because the Dirac comb impulses have zero pulse width, which is impossible to achieve in actual operation. If the pulse width is much smaller than the RF signal's period, a zero-width impulse train is a good approximation. As a result, P(t) is represented as a sum of impulses $$P(t) = V_\pi \Sigma \delta(t-n(t)) \quad (3.7)$$

where $V_\pi$ is the voltage amplitude of the MZI switching voltage and n is the impulse trigger.

In order to model the variable PRF of P(t), the delta functions must be triggered from a linear FM sinusoid. In the DM-NYFR architecture, this is modeled as a chirp signal $S_{c2}(t)$, with n(t) set on every positive-to-negative zero crossing such that $$n(t) = ZCR^-(S_c(t)) \tag{3.8}$$

where $ZCR^-$ is the notation for a single-ended zero crossing.

For the DM-NYFR, two types of linear chirp signals are used, a sawtooth waveform $S_{c1}(t)$ and a triangular waveform $S_{c2}(t)$. The sawtooth chirp is given by $$S_{c1}(t) = \sin 2\pi\left(f_c t + \frac{\Delta F}{2t_m}t^2\right) \tag{3.9}$$

where $f_c$ is the center frequency, $\Delta F$ is the chirp bandwidth, and $t_m$ is the chirp period.

The triangular waveform is defined as $$S_{c2}(t) = \sin 2\pi[S_1(t) + S_2(t)] \tag{3.10}$$

with $S_1$ as the rising chirp sweep and $S_2$ as the falling chirp sweep.

The chirp sweep functions are given by $$S_1(t) = \left(f_c + \frac{\Delta F}{2}\right)t - \frac{\Delta F}{2t_m}t^2 \tag{3.11}$$

for the positive slope and $$S_2(t) = \left(f_c - \frac{\Delta F}{2}\right)t + \frac{\Delta F}{2t_m}t^2 \tag{3.12}$$

for the negative slope, where $f_c$ is the center frequency, $\Delta F$ is the chirp bandwidth, and $t_m$ is the chirp period (see P. E. Pace, *Detecting and Classifying Low Probability of Intercept Radar*, 2nd ed. Norwood, Mass.: Artech House, 2009, pp. 86-94).

Figure 6:
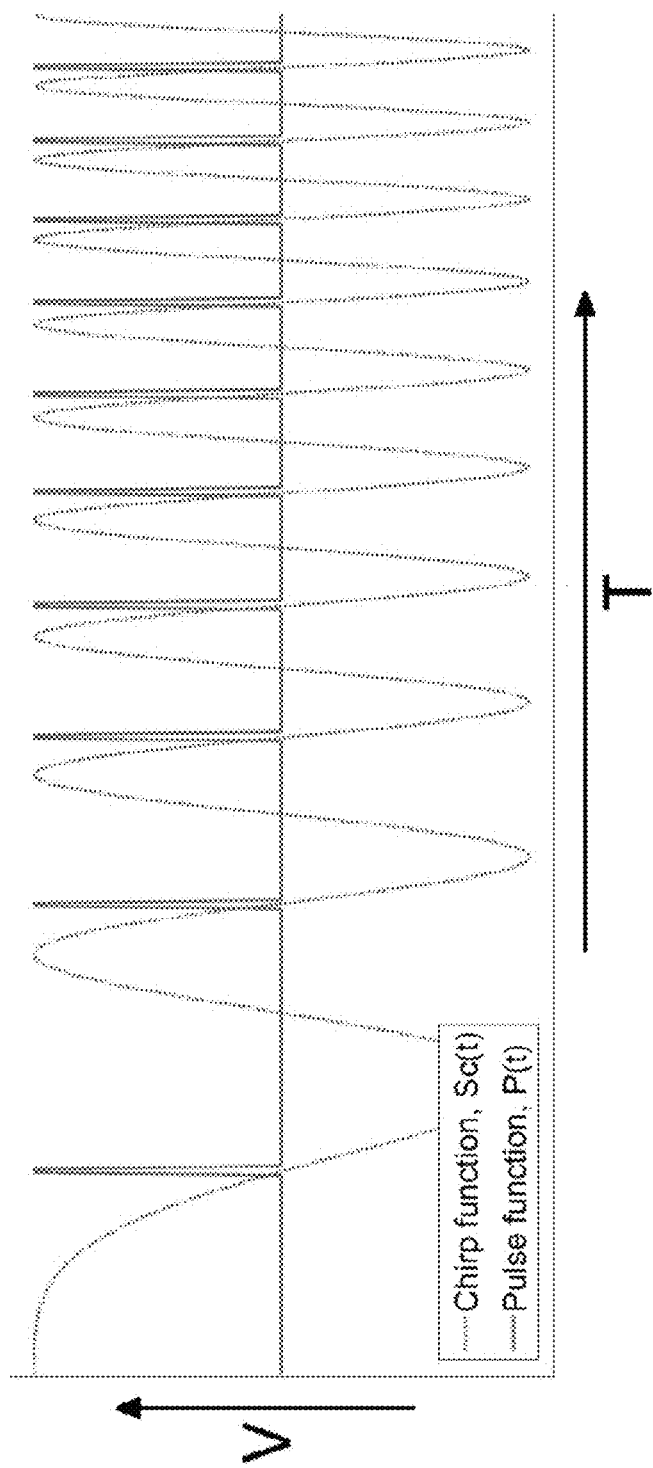
FIG. 6 illustrates an example linear chirp used to generate a FM DIRAC comb every positive-to-negative zero crossing, according to an exemplary embodiment of this disclosure.

The linear chirp sinusoid represented as equation (3.9) plotted along with the pulse function represented as equation (3.8) is detailed in FIG. 6. Setting the amplitude of the pulse signal to $V_\pi$ switches the optical modulator at the pulse repetition frequency (PRF) defined by equation (3.7) and coverts the input CW laser into a sampling impulse train. This illustrates how the front-end pulse generation block works for the DM-NYFR architecture disclosed.

(3.3) Single-Modulator Design Concept

Figure 7:
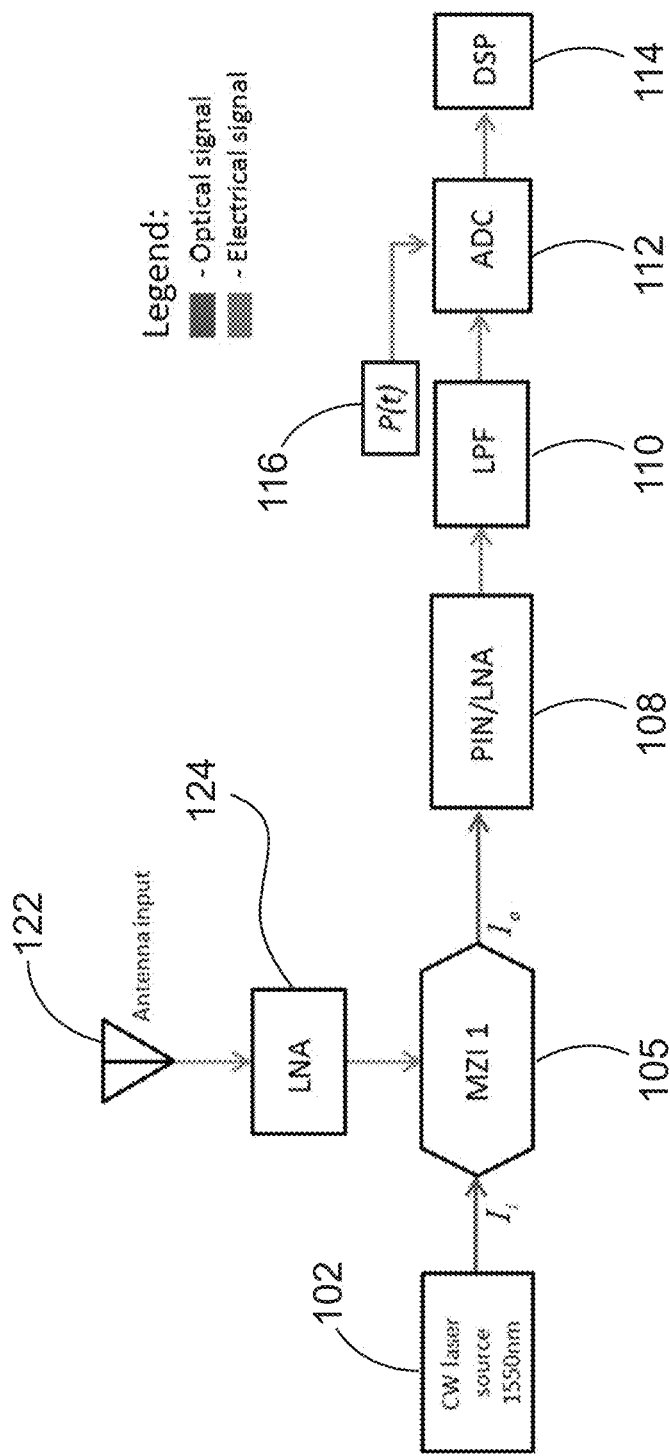
FIG. 7 illustrates a Single Modulator-NYFR (SM-NYFR) block diagram showing the overall architecture of the receiver, according to an exemplary embodiment of this disclosure.

The single modulator design that serves as a simplified technology demonstrator for the photonic NYFR is described in this section. Conceived as an alternative architecture, the single-MZI NYFR (SM-NYFR) is an electro-optical hybrid solution that takes advantage of the high bandwidth of photonic components but with the low cost and complexity of electronic sampling devices. The trade off in the electro-optical design is a lower maximum RF-interception frequency than the DM-NYFR solution and higher receiver noise level. The SM-NYFR block diagram is shown in FIG. 7.

The SM-NYFR uses a CW laser 102 coupled to a single-arm MZI 105 biased at quadrature. The electrodes are attached to an antenna 122/LNA 124 pair which incepts RF signals from the environment. The high bandwidth of optical components, greater than 40 GHz, ensures that a large RF spectrum is modulated onto the laser. The MZI 105 output is connected to a PIN photodiode 108, which converts the photonic signal into an electrical signal. The signal is filtered with an interpolating LPF 110 that has a bandwidth greater than the maximum frequency of the first Nyquist zone. An ADC 112 samples the electrical signal driven by a clock pulse P(t) 116 represented in equation (3.7). The digital information is processed by a DSP114, which unfolds and extracts the RF frequencies from the environment.

(3.4) Design Constraints and Considerations

The photonic NYFR's primary operating boundaries and constraints come from the optical sampling with interferometers. The optical pulse width and ADC resolution determine the maximum frequency that can be modulated onto a laser source. Both pulse width and sampling limitations are examined in detail in this section. The performance of potential hardware builds is also analyzed in order to determine the maximum RF-signal intercept frequencies.

(3.4.1) Pulse Width Limitations

The photonic NYFR relies on signal sampling by optical pulses where the instantaneous power of the pulse train is proportional to the sampled waveform. In order to effectively sample a target RF signal, the pulse width must be smaller than the temporal variation of the modulating signal (see T. Okamoto and F. Ito, "Ultrafast linear optical sampling technique for optical communication systems," in *Opto-Electronics and Communications Conference*, June 2015, pp. 1-3). The 3 dB bandwidth $B_p$ of an optical pulse is the inverse of the pulse width $T_p$ or $B_p = 1/T_p$. From the Nyquist criterion, the sampling frequency $f_s$ for an arbitrary signal with bandwidth B is $f_s = 2B$, written in terms of pulse width as $$T_P < \frac{T_s}{2} \tag{3.13}$$

where $T_p$ is the largest allowable pulse width that can effectively sample a signal with a period of T.

For the photonic NYFR design, this means that optical pulse widths limit the maximum frequency that can be sampled by MZI2, and pulses must be smaller than half the largest RF signal period.

(3.4.2) Electro-Optical Sampling Limitations

The optically sampled signal from MZI2 106 is coupled into a PIN photodiode 108 which converts optical power into an electrical signal. The output voltage must then be quantized by a sampling ADC 112 with finite resolution. Digitizing an analog waveform imparts a sampling error which constrains the photonic NYFR's operating limits. Letting the signal applied to the MZI electrodes be $$V(t) = A \sin(2\pi f_m t) \tag{3.14}$$

where $f_m$ is the maximum signal frequency and A is the signal amplitude (see P. E. Pace, *Advanced Techniques for Digital Receivers*, 1st ed. Norwood, Mass.: Artech House, 2000, pp. 84-85).

For a sampling pulse width $t_p$, the error in voltage $\delta V$ for an arbitrary signal at time $t_i$ a traveling wave optical device is represented by $$\delta V = \frac{1}{T_p} \int_{t_i + \frac{T_p}{2}}^{t_i - \frac{T_p}{2}} A \sin(2\pi f_m t) dt - A \sin(2\pi f_m t_i). \tag{3.15}$$

The voltage error is the difference in instantaneous voltage integrated over the width of a sampling pulse. Using a Taylor series expansion to evaluate the integral of equation (3.15) for the maximum voltage error yields $$|\delta V|_{max} = \frac{(\pi f_m T_p)^2 A}{6}. \tag{3.16}$$

For a n-bit sampling ADC, the voltage error must be less than half of the level spacing which is $$|\delta V|_{max} = < \frac{2A}{2^n}\left(\frac{1}{2}\right) = \frac{A}{2^n}. \tag{3.17}$$

This results in a $T_p$ pulse width limitation of $$T_p < \frac{\left(\frac{3}{2^{n-1}}\right)^{\frac{1}{2}}}{\pi f_m} \tag{3.18}$$

where $f_m$ is the maximum target frequency and n is the resolution of the ADC (see P. E. Pace, *Advanced Techniques for Digital Receivers*, 1st ed. Norwood, Mass.: Artech House, 2000, pp. 84-85).

(3.4.3) Implications for Photonic NYFR Design

Figure 8:
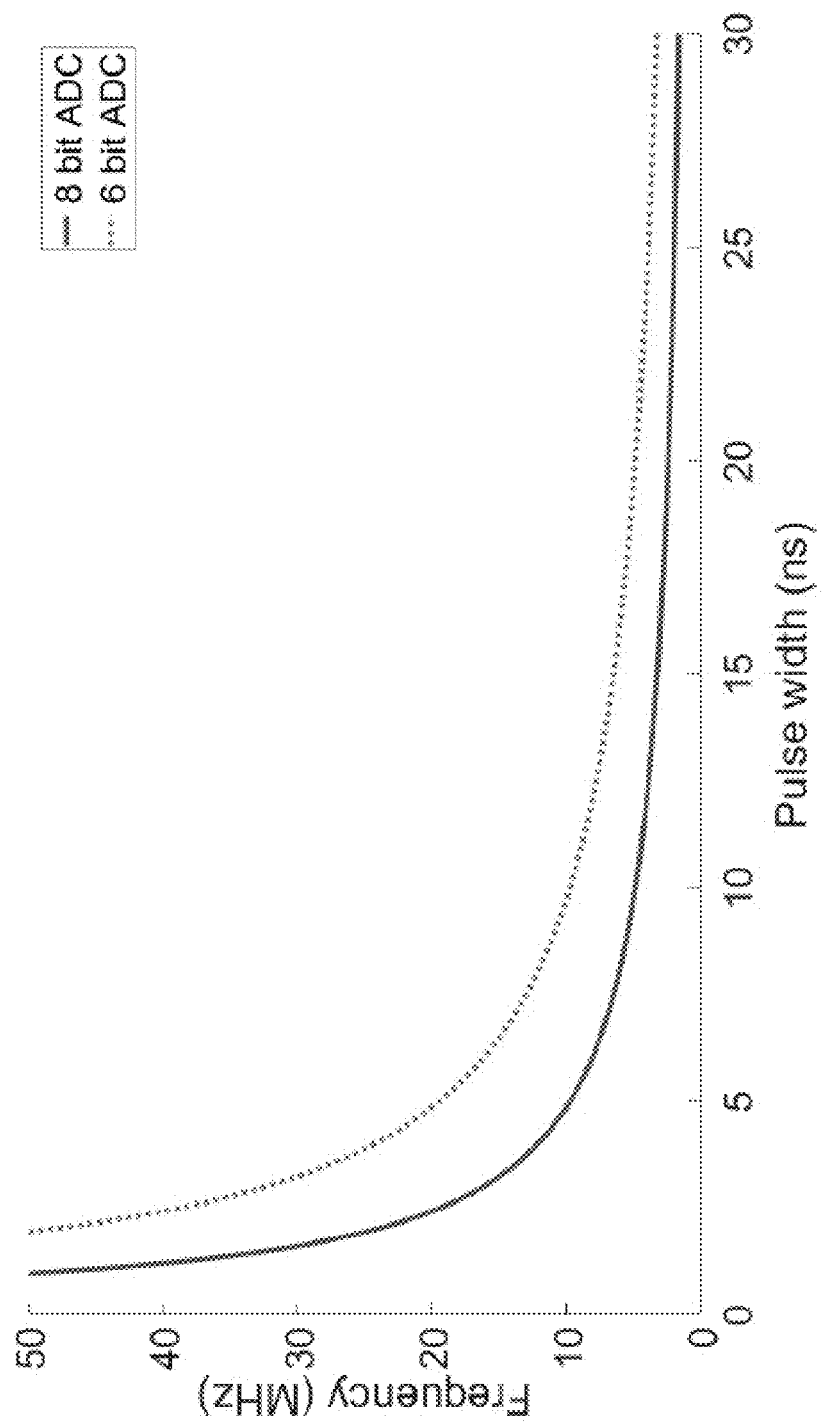
FIG. 8 illustrates a maximum intercept frequency for nanosecond pulse-widths illustrating a low-cost prototype build, according to an exemplary embodiment of this disclosure.
Figure 9:
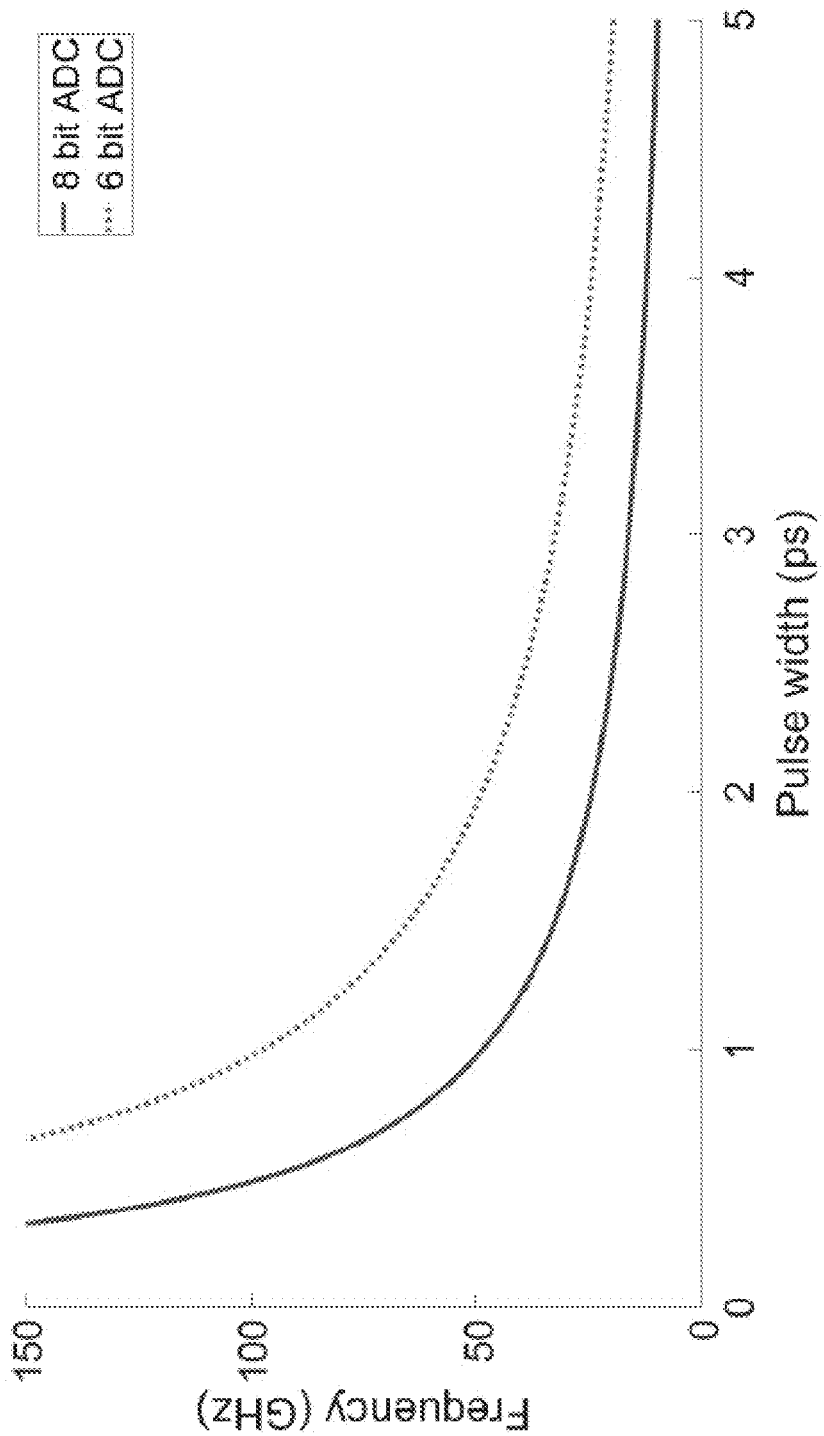
FIG. 9 illustrates a maximum intercept frequency for picosecond and sub-picosecond pulse-widths illustrating a potential high-cost build, according to an exemplary embodiment of this disclosure.

The electro-optical sampling error associated with the ADC is the dominate limitation for the photonic NYFR architecture. Design implications are shown in FIGS. 8 and 9, which are plots of the maximum intercept frequency as a function of pulse width for six and eight bit ADCs, as well as for two separate hardware designs. FIG. 8 is an illustration of a prototype build using inexpensive off-the-shelf components with pulse widths in the nanosecond range. The upper limit build illustrating picosecond and sub-picosecond pulse widths, which are achievable with either high quality electrical pulse generators or mode locked fiber lasers, is shown in FIG. 9. There is a clear design tradeoff between maximum intercept frequency and ADC resolution, with higher resolutions corresponding to lower target RF signals. Additionally, higher frequencies require shorter pulse widths, which increases costs.

In summary, both photonic NYFR designs and their operating methodologies were described in this section as well as the constraints, limitations, and design tradeoffs for the photonic NYFR architectures. Modeling shows that the optical sampling error and the resulting optical pulse width is the primary limiting factor.

(4) Photonic NYFR Computer Simulations

The computer simulations of the two receiver designs are described in this section. Both the DM-NYFR and the SM-NYFR architectures were modeled and simulated in order to test their operation. The final models for both the double and single modulator designs, as well the key test results for each architecture, are detailed in this chapter. Simulation test results were successful in demonstrating correct inception and unfolding of target RF signals.

(4.1) DM-NYFR Computer Simulation

Figure 10:
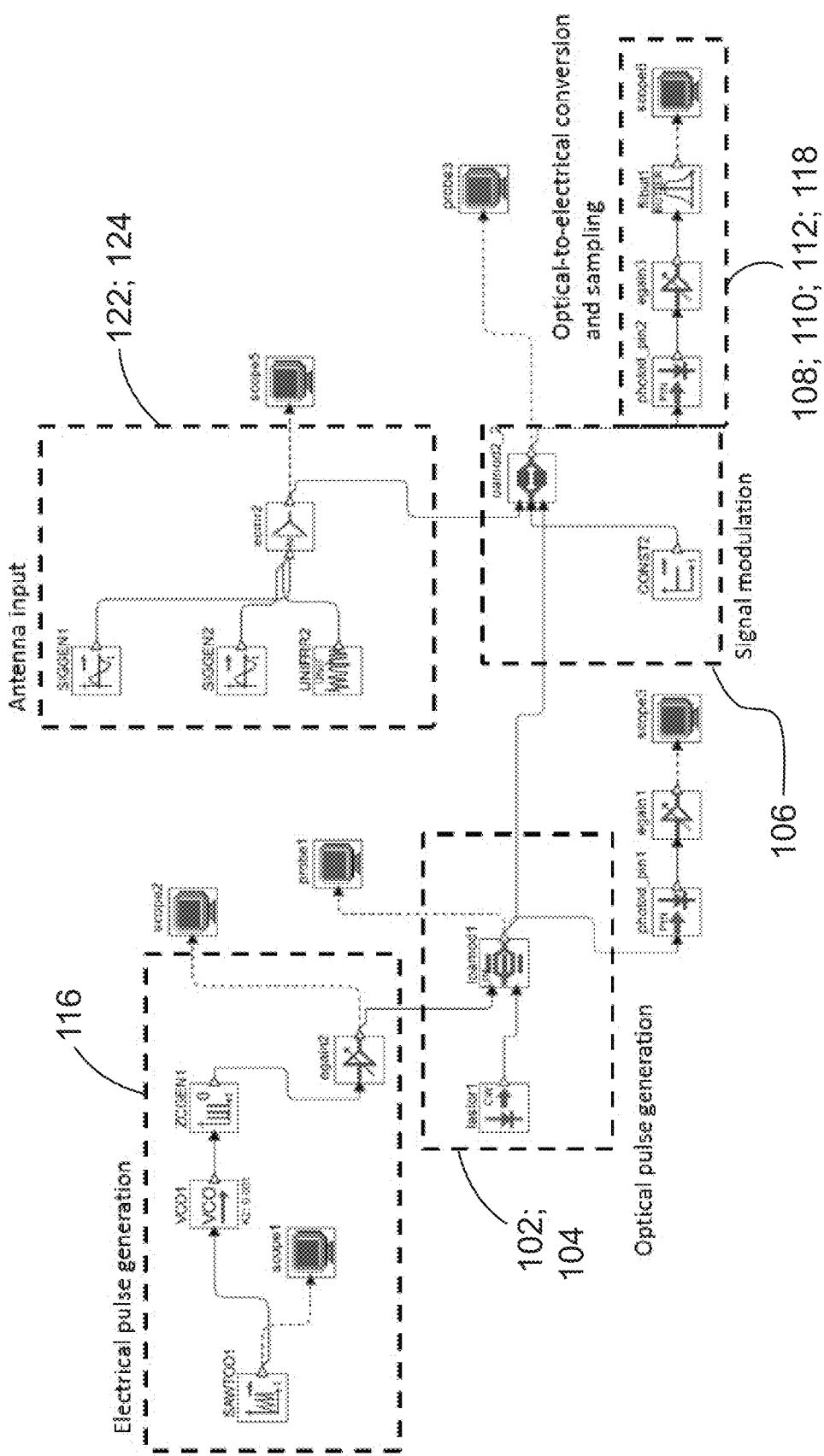
FIG. 10 illustrates a DM-NYFR computer simulation model showing all components and connections, according to an exemplary embodiment of this disclosure.

The DM-NYFR computer model is shown in FIG. 10 while Table 4.1, lists the model components and their functions.

TABLE 4.1

Component Labels, Names, and Descriptions
From the DM-NYFR Computer Simulation Model

| Label | Name | Function |
|---|---|---|
| SAWTOO1 | Sawtooth wave generator | Generates a electrical sawtooth wave from $V_{min}$ to $V_{max}$ that is fed into the VCO. |
| VCO1 | Voltage controlled oscillator | Generates a linearly chirped sinusoid from the sawtooth input based on voltage sweep. |
| ZCGEN1 | Zero crossing generator | Generates a picosecond wide electrical pulse every positive-to-negative zero |
| egain2 | Electrical gain | Amplify 1 V pulse to $V_\pi$ (5.5 V). |
| scope1 | Electrical scope | Electrical oscilloscope measuring tool. |
| scope2 | Electrical scope | Electrical oscilloscope measuring tool. |
| laslor1 | Laser source | 1550 nm CW laser source. |
| loamod1 | MZI1 | First optical modulator, uses FM electrical pulses to generate FM optical pulses. |
| probe1 | Optical probe | Optical signal measuring tool. |
| photod_pin1 | PIN Photodiode | Converts an optical signal into an electrical |
| egain1 | Electrical gain | Amplify electrical signal from the photodiode. |
| scope3 | Electrical scope | Electrical oscilloscope measuring tool. |
| SIGGEN1 | Signal generator | Generates an electrical target signal for the |
| SIGGEN2 | Signal generator | Generates an electrical target signal for the |
| UNIFRR2 | Uniform noise | Adds noise to the signal input |
| loamod2 | MZI2 | Modulates the FM pulse train to sample the antenna signal. |
| probe1 | Optical probe | Optical signal measuring tool. |

TABLE 4.1-continued

Component Labels, Names, and Descriptions
From the DM-NYFR Computer Simulation Model

| Label | Name | Function |
|---|---|---|
| photod_pin2 | PIN Photodiode | Converts an optical signal into an electrical |
| egain3 | Electrical gain | Amplify electrical signal from the photodiode. |
| filbut1 | Butterworth LPF | 8th order butterworth LPF set to 2 $f_s$. |
| scope6 | Electrical scope | Electrical oscilloscope measuring tool. |

The DM-NYFR design uses two coupled MZIs to both sample and incept a RF signal from the environment. The most important aspect of the design is a front-end optical pulse generation block that converts a CW laser into a FM optical pulse train. The computer model is broken up into functional sections that each perform a specific task. As shown in FIG. 10, the sections are electrical pulse generation 116, optical pulse generation 102; 104, signal modulation 106, antenna input 122; 124, and sampling 106. The rSOFT OPTSIM design suite from SYNOPSYS is used as a photonics modeling environment. This software package enables high fidelity simulation of integrated optical systems, and both receiver designs were successfully simulated and tested. OPTSIM uses a block simulation design environment where components and functions are modeled as discrete units that are linked in a user interface.

(4.1.1) Electrical Pulse Generation

Figure 11B:
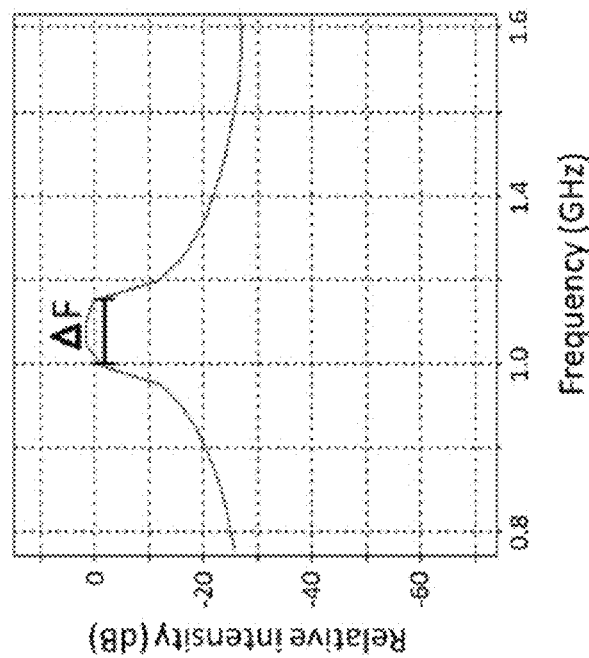
FIGS. 11A and 11B illustrate a electrical pulse generation simulation outputs with an input sawtooth waveform and output pulse train frequency representation including FM chirp, according to an exemplary embodiment of this disclosure.

The electrical pulse generation block models equation (3.8) in the rSOFT design suite and functions as a proof-of-concept for a hardware build. An electrical signal generator outputs a sawtooth waveform, varying the amplitude from $V_{min}$ to $V_{max}$ over a modulation period $t_m$. The signal is sent to a voltage controlled oscillator (VCO) that chirps a sinusoid wave from $f_{min}$ to $f_{max}$. For the VCO operation, $V_{min}$ maps to $f_{min}$ and $V_{max}$ maps to $f_{max}$. The modulation period matches $t_m$. The chirped sinusoidal wave from the VCO is sent to a zero crossing pulse generator that outputs a 1.0V electrical pulse with a picosecond-wide pulse width every positive-to-negative transition. In order to modulate the CW laser, the 1.0V pulse train is amplified to the MZI switching voltage $V_\pi$. This is shown in FIGS. 11A and 11B.

Figure 11A:
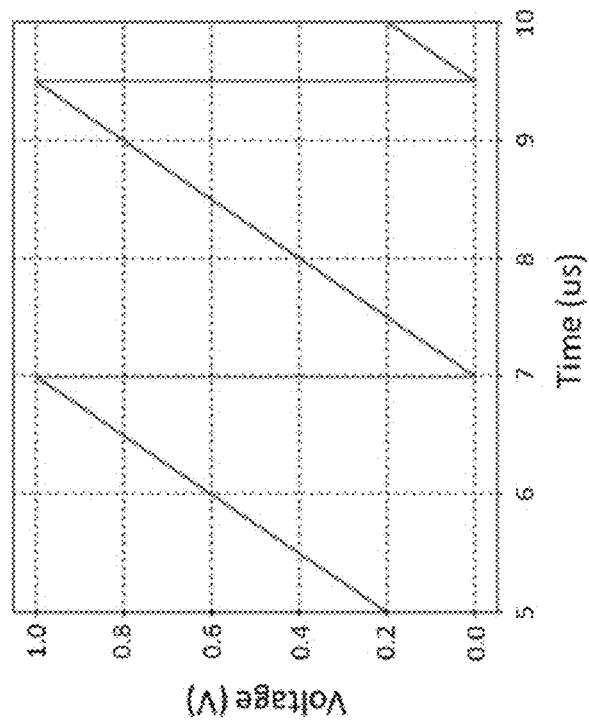

FIG. 11A is an illustration of the input sawtooth waveform as a time-amplitude representation from scope one. FIG. 11B is an illustration of the output bandwidth of the pulses sampled at scope two. The x-axis is frequency, and the y-axis is relative power in dB. This shows a wide bandwidth ΔF which is the chirp optical pulse train.

(4.1.2) Optical Pulse Generation

Figure 12:
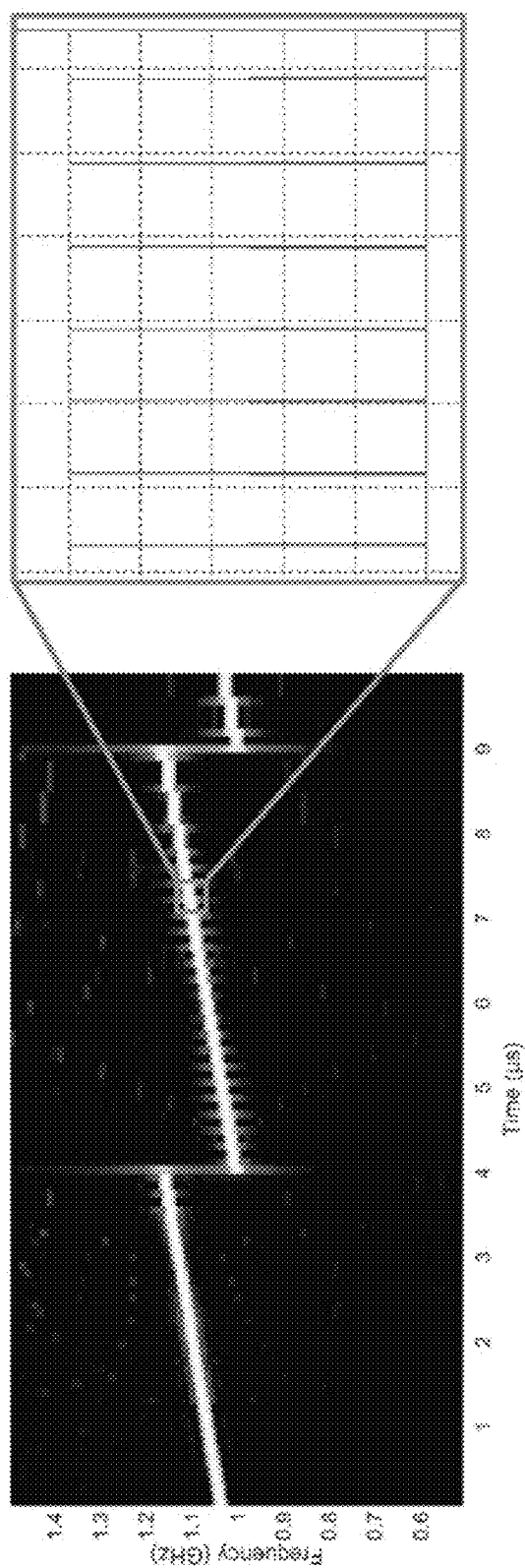
FIG. 12 illustrates an optical pulse train output from MZI1, according to an exemplary embodiment of this disclosure.

Electrical pulses are used to drive the first MZI and generate optical pulses as in represented by equation (3.7). The MZI is simulated as a single-arm cosine squared modulator. The FM optical pulse train is shown in FIG. 12, which is a MATLAB spectrogram of the data from probe one. Spectrograms use a short time Fourier transform (STFT) window scanned over a signal to make a time-frequency representation of the waveform. The optical pulses are chirped in a sawtooth pattern from the driver signal on the MZI. The input pulses are centered at 1.0 GHz and modulated with $t_{in}$=5 μs and ΔF=150 MHz. The output optical pulses in FIG. 12 match the MZI inputs, indicating a successful modulation technique.

(4.1.3) Antenna Input and Signal Modulation

The antenna input is comprised of an adjustable number of sinusoidal signal components combined in parallel with a uniform noise generation block. This allows variations in the signal-to-noise ratio (SNR) for testing. The input signals are single frequency tones due to software limitations. The antenna block 122; 124 drives MZI2, and the input optical pulses sample the RF signals. The resulting signal information is converted from the optical domain into the electrical domain and then filtered and collected in an interpolation LPF 108; 110; 112; 122. The LPF output is sampled by scope six with sampling rate $2\omega_s$ and piped into MATLAB for signal processing.

(4.1.4) DM-NYFR Simulation Results

The simulated DM-NYFR architecture was tested with target signals in order to determine if the model can successfully undersample and modulate signals for recovery by the DSP. The simulation was conducted with a sawtooth FM modulation. The modulation period $t_{in}$=5.0 μs with $f_{min}$=1 GHz and $f_{min}$=1.15 GHz resulting in a ΔF sweep bandwidth of 150 MHz. From FIG. 1B this gives Nyquist zones every 500 MHz, with zone N=0 from 0 to 500 MHz. The test results show the first two Nyquist zones (N=0, −1) as well as the modulation signal. Scope six, the sampling ADC, has a $2f_s$ sampling rate of 2.0 GHz, and the LPF cutoff frequency is $2f_s$. For all conducted tests, the SNR was 10 dB (see R. Shmel and P. E. Pace, "Photonic compressed sensing nyquist folding receiver," in *IEEE International Photonics Conference*, October 2017).

Test One: No Modulation

Figure 13:
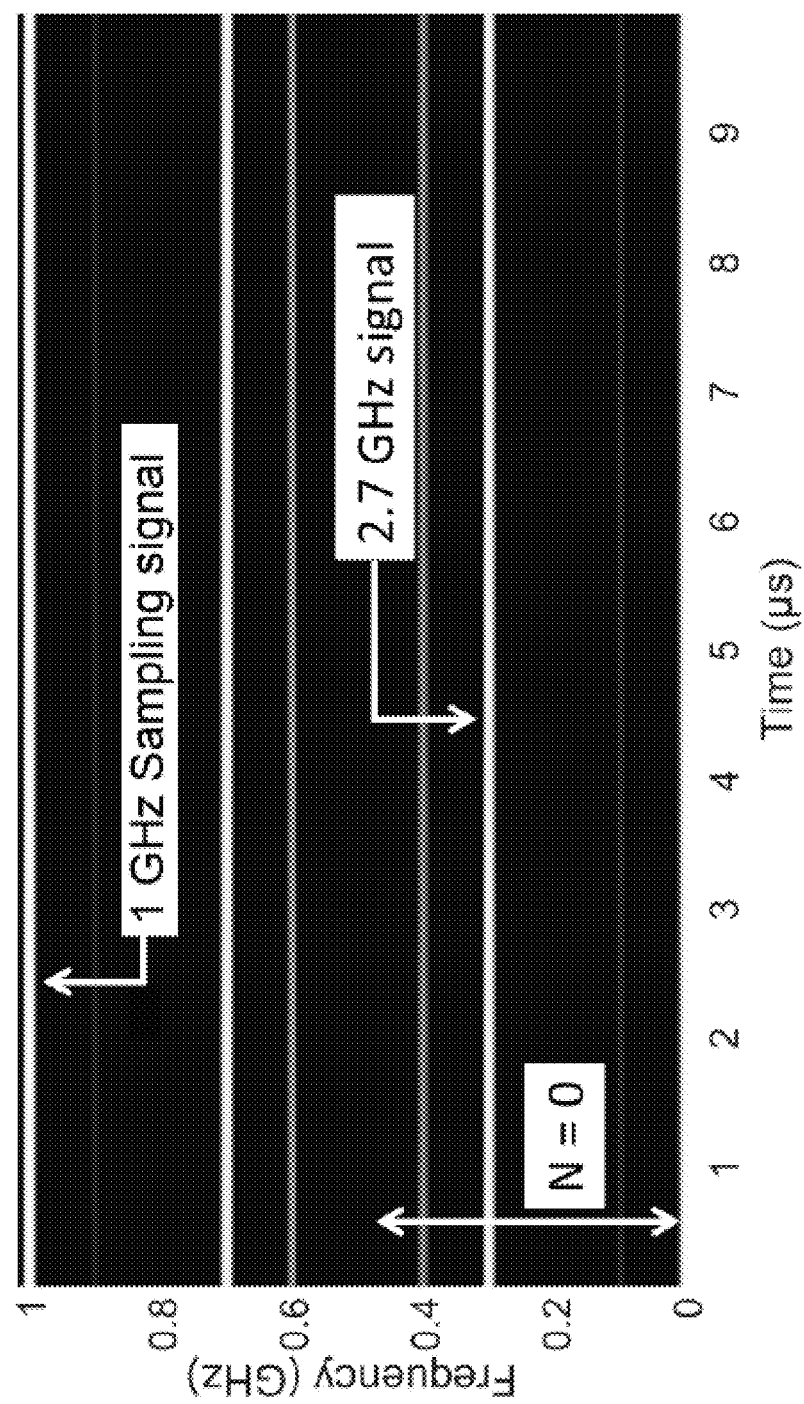
FIG. 13 illustrates a DM-NYFR test one: no modulation.

The first test checks the architectures response with no FM sweep applied to the first MZI and the results are shown in FIG. 13.

The VCO was disconnected, so the sampling pulse train had a constant frequency of 1.0 GHz. The applied signal is 2.7 GHz, so the expected results when examining the DSP output are aliased signals centered around 500.0 MHz. The output shown in FIG. 13 confirms the architecture with no modulation. Aliased signals at 0.3 GHz and 0.7 GHz are seen along with the 1.0 GHz sampling signal. Without modulation the undersampled signals cannot be resolved to their original frequencies.

Test Two: 2.75 GHz Signal

Figure 14:
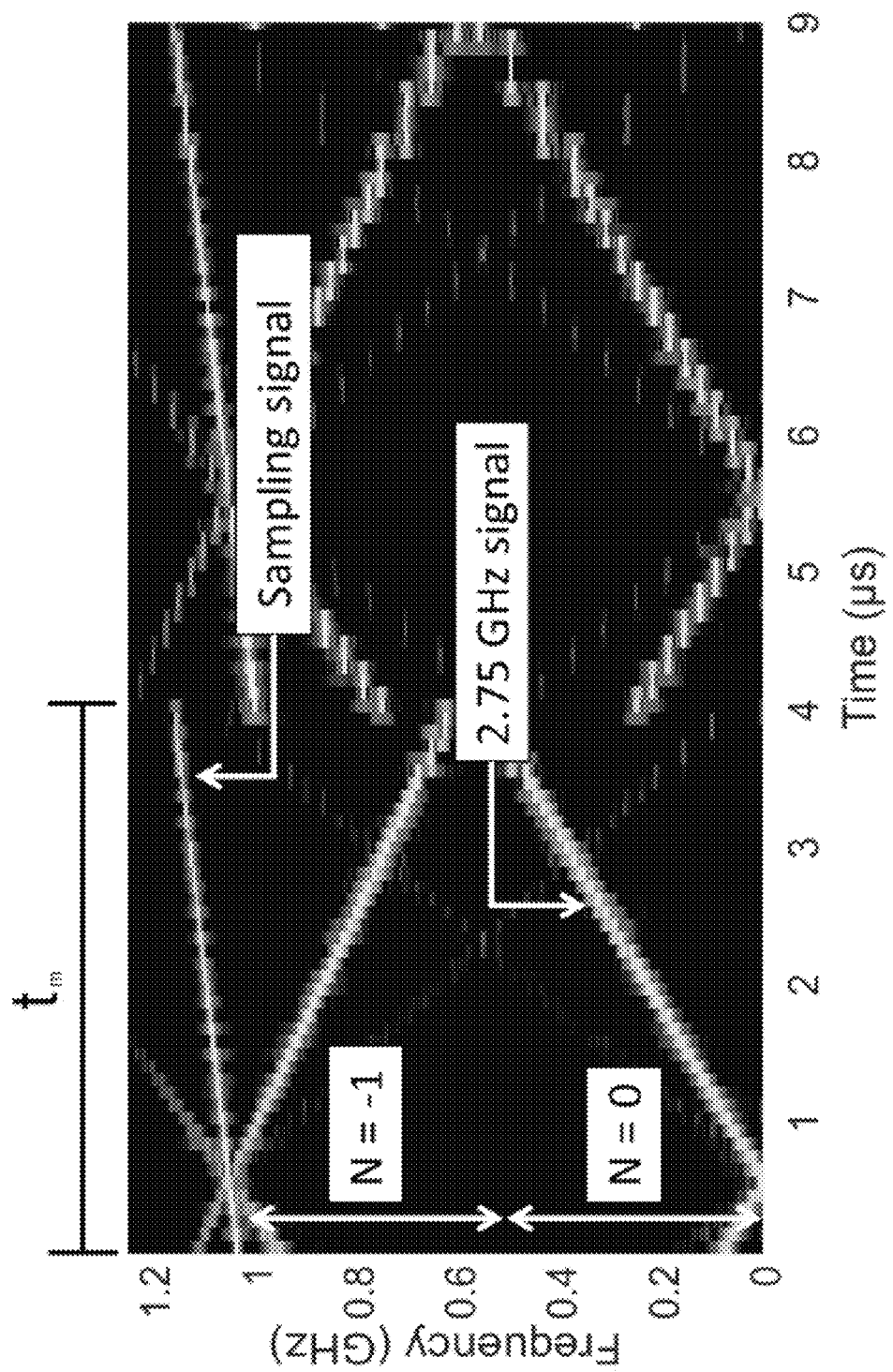
FIG. 14 illustrates a DM-NYFR test two: 2.75 GHz signal.

The second test is the architectures response with the FM sweep enabled. The optical pulse train has an FM chirp and successfully undersamples the signal. The target signal is 2.75 GHz, chosen because that is a common aerial search radar frequency. The received signal is shown in FIG. 14 in the N=0 Nyquist zone with a modulated slope from the MZI1 driver signal. The results are a time-frequency spectrogram computed in MATLAB. Two Nyquist zones, N=0, −1, are shown completely, and are mirror images of each other. Also visible is sampling signal from 1.0 to 1.15 GHz.

Figure 15:
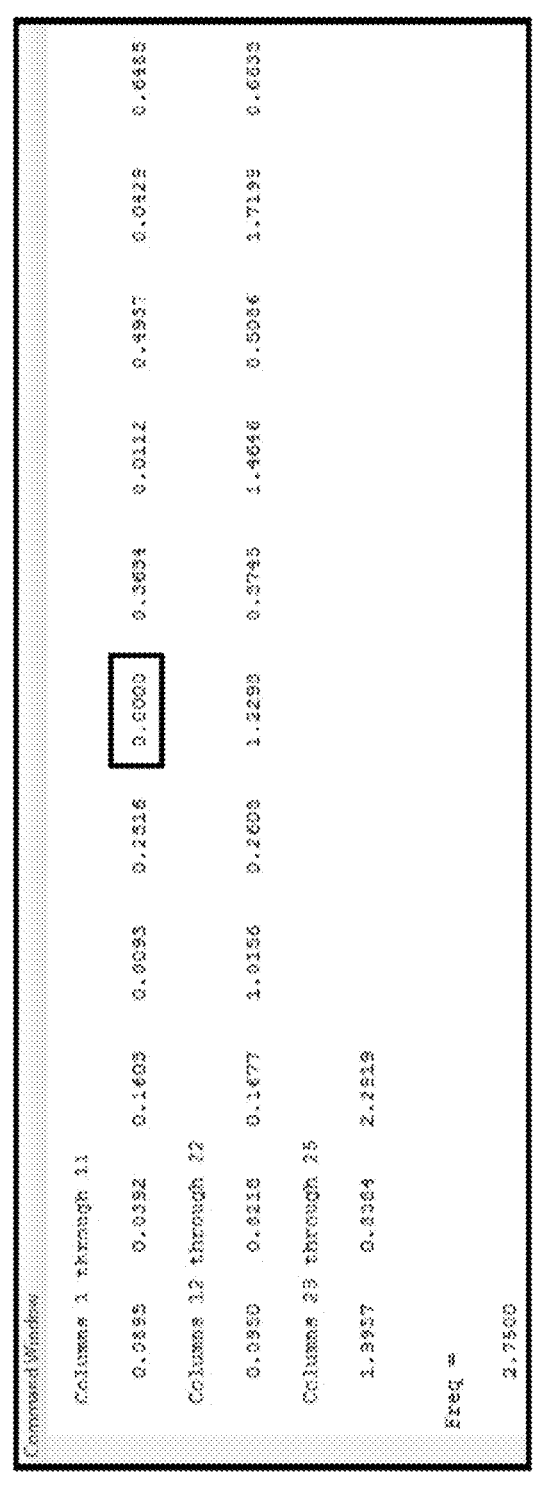

From equations (2.6) and (2.7), the original frequency can be extracted from the sampling signal and the folded signal. A MATLAB program is used to unfold the signal, and the results are displayed in FIG. 15. The lowest difference is Nyquist zone N=−5, which corresponds to signals between 2.5 and 3.0 GHz. Estimating a center frequency of approximately 0.15 GHz from FIG. 14 and adding it to the lower frequency bound of the Nyquist zone yields the correct original frequency of 2.75 GHz.

Test Three: 5.1 and 5.65 GHz Signals

Figure 16A:
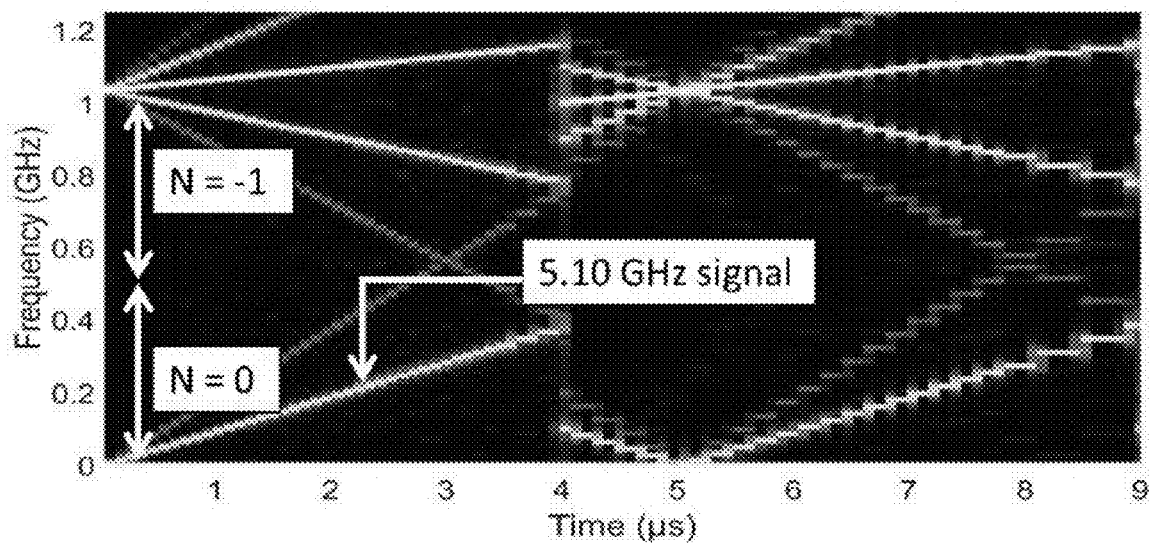
FIGS. 16A and 16B illustrate a DM-NYFR test three results displaying 5.10 GHz and 5.65 GHz signals, respectively.
Figure 16B:
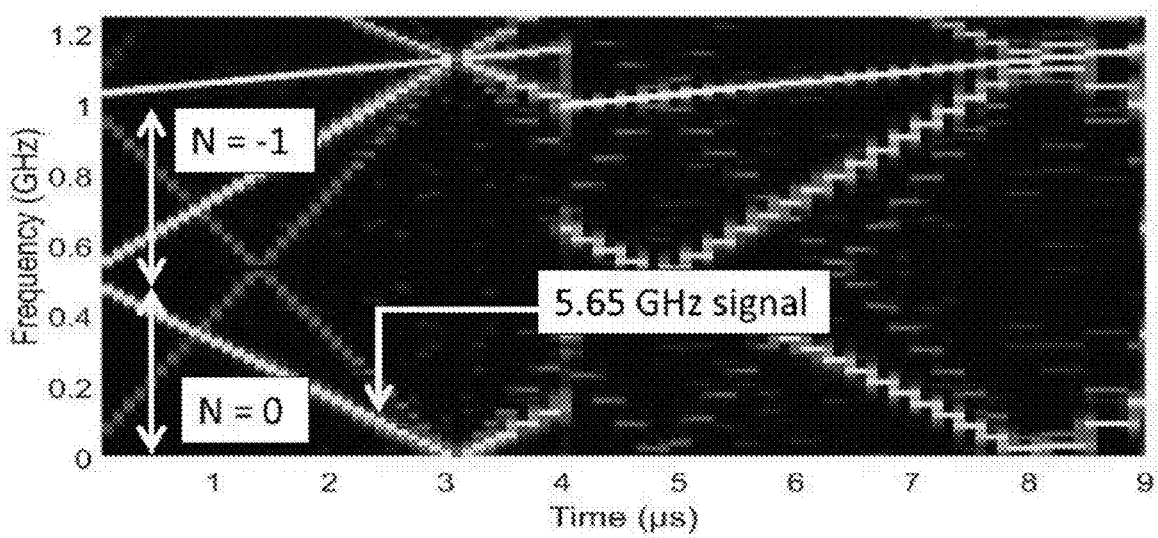

The next test was a 5.1 GHz signal and a 5.65 GHz signal, which are some typical C-band radar frequencies. Each signal was applied separately, and the results analyzed in MATLAB. The results are shown in FIGS. 16A and 16B, which displays both signals in the N=0 Nyquist zone. Comparing the signal slopes and modulation signals, the original frequency ranges can be extracted. Adding the center frequencies from the results yields the original frequencies of the signals. Visible in FIGS. 16A and 16B are weaker images that appear to be signals; however, these are actually aliased signals from higher Nyquist zones folding down due to the wide bandwidth of the interpolation LPF. Reducing the LPF cutoff frequency to the upper limit of Nyquist zone N=0 removes these artifacts.

Test Four: 2.7 and 9.1 GHz Combination Signal

Figure 17:
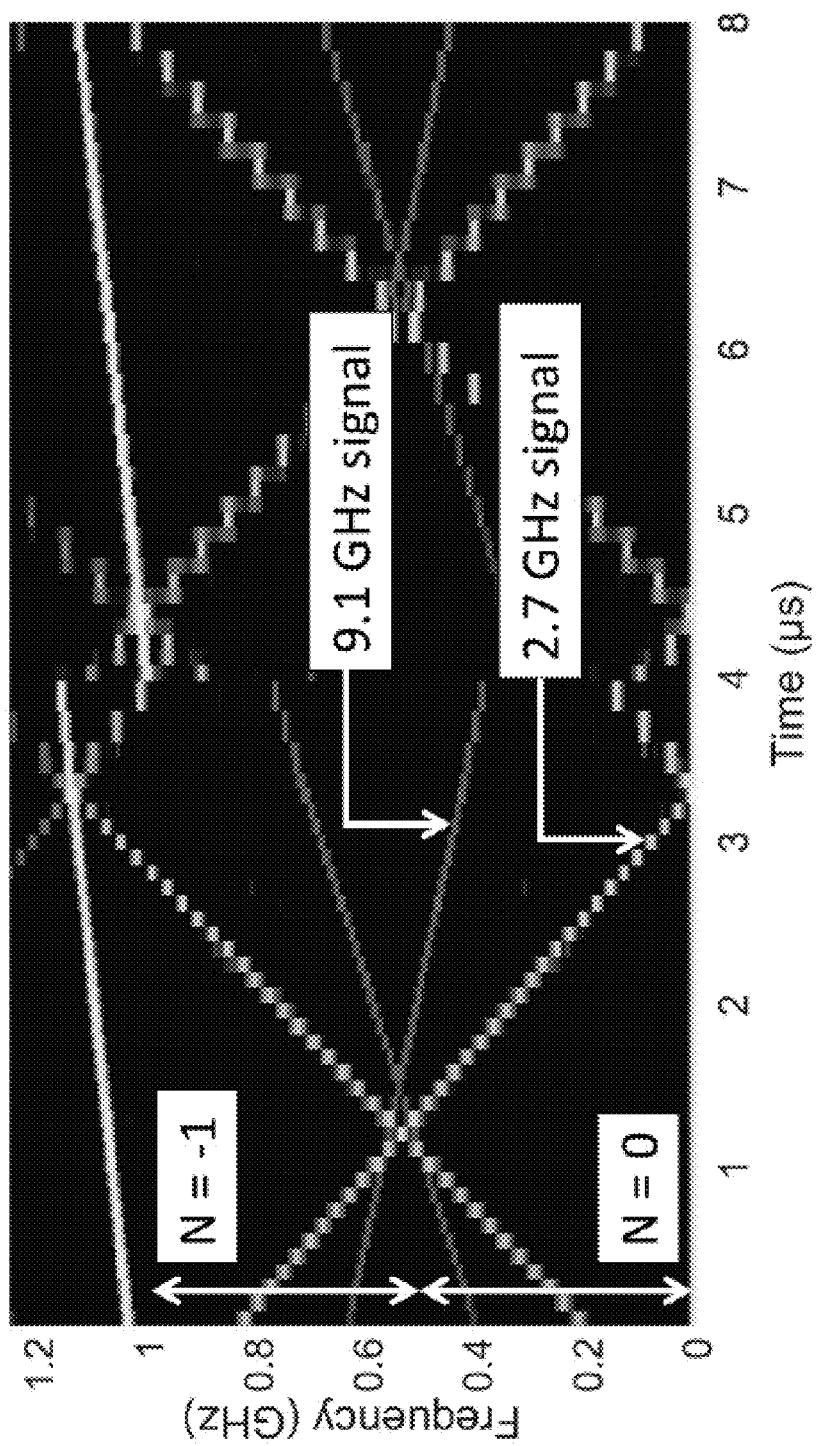
FIG. 17 illustrates a test four results displaying the spectrogram of folded 2.7 GHz and 9.1 GHz signals.

This test was conducted to determine how multiple target signals are resolved by the DM-NYFR simulation. Two target waveforms were applied to the antenna input: 2.7 GHz at 100 mVpp and 9.1 GHz at 50 mVpp. The uniform noise block was disconnected for this test. A spectrogram of the instantaneous optical power at MZI2's output is shown in FIG. 17. Visible is the FM signal at 1.0 GHz and the modulated target signals in Nyquist zone N=0. The antenna signals exhibit non-uniform aliasing expected from the NYFR, and two distinct signals are clearly identifiable. Given the slopes and center frequencies from the spectrogram, equations (2.6) and (2.7) can be used to successfully unfold the input RF signals to their original values.

(4.2) SM-NYFR Computer Simulation

Figure 18:
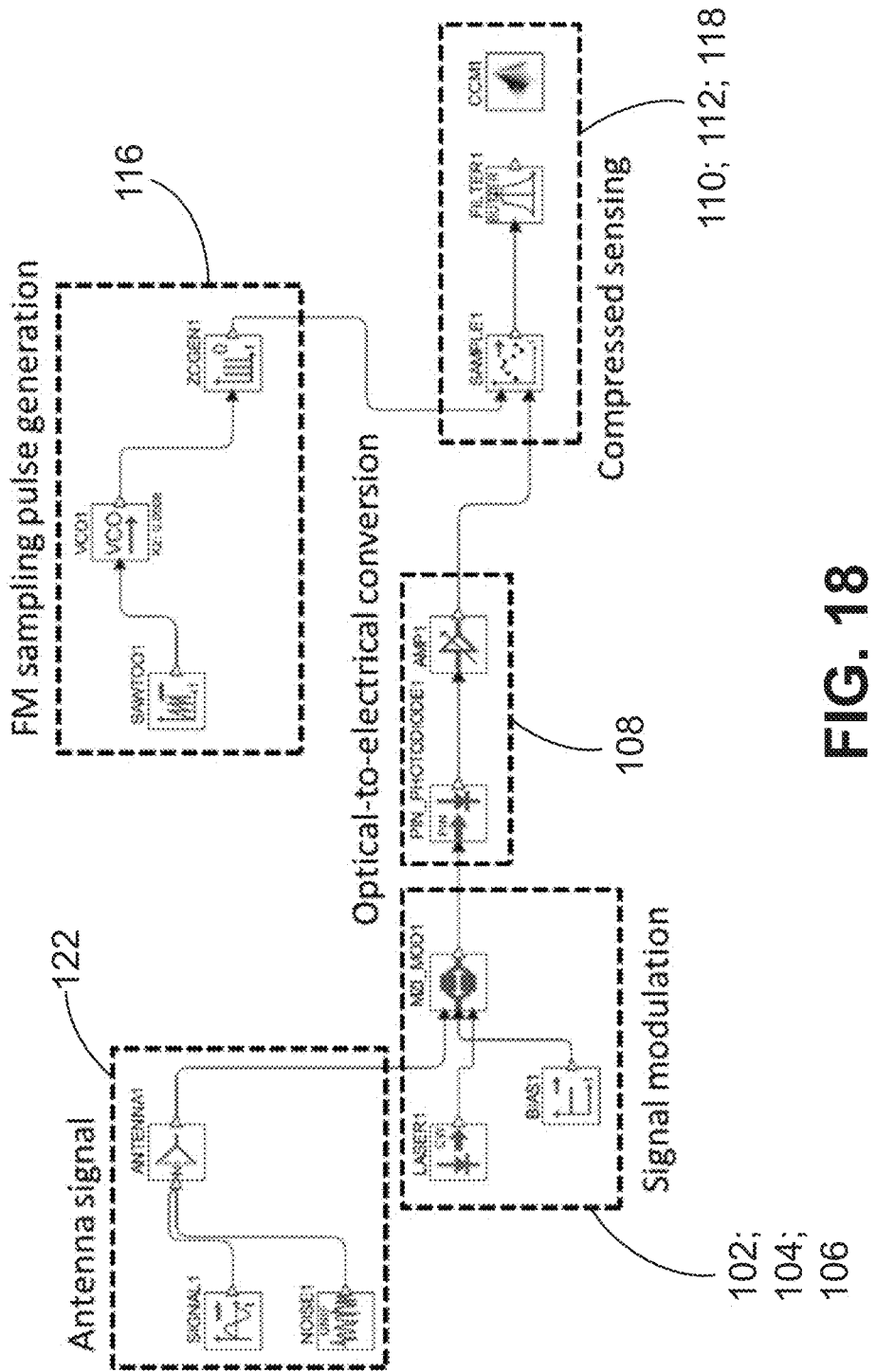
FIG. 18 is a block diagram of a SM-NYFR simulation model, according to an exemplary embodiment of this disclosure.

The SM-NYFR uses a single MZI that acts as a carrier for the target signal. The compressed sensing is performed by an ADC triggered with a FM chirp signal described by equation (3.8). The rSOFT simulation model is shown in FIG. 18 and is comprised of an antenna block, signal modulation block, optical-to-electrical conversion stage, compressed sensing block 122, and FM sampling pulse generation 116. Individual components are listed in Table 4.2 below. The FM timing signal for the ADC results in a modulated sampling scheme which allows the compressed signal to be unfolded.

TABLE 4.2

SM-NYFR Component Labels, Names, and Descriptions from the SM-NYFR Computer Simulation Model.

| Label | Name | Function |
|---|---|---|
| SAWTOO1 | Sawtooth wave generator | Generates an electrical sawtooth wave from $V_{min}$ to $V_{max}$ that is fed into the VCO. |
| VCO1 | Voltage controlled oscillator | Generates a linearly chirped sinusoid from the sawtooth input based on voltage sweep. |
| ZCGEN1 | Zero crossing generator | Generates a picosecond wide electrical pulse every positive-to-negative zero crossing. |
| SIGNAL1 | Electrical signal | Target RF signal. |
| NOISE1 | Noise generator | Generates uniform electrical noise. |
| MZI_MOD1 | MZI1 | Modulates antenna signal onto CW laser |
| LASER1 | Laser source | 1550 nm CW laser source. |
| PIN_PHOTO1 | Photodiode | Converts an optical signal into an electrical signal. |
| SAMPLE1 | ADC sampler | Converts analog signals to digital signals and is driven by ZCGEN1. |

(4.2.1) SM-NYFR Simulation Results

Simulations were conducted as described in Section 4.1.4 above. Testing was done to determine the performance of the SM-NYFR in comparison to the DM-NYFR. From test results, it is shown that the SM-NYFR has similar performance but a higher noise level with more artifacts in the results.

Test One: 5.25 GHz RF Signal

A 5.25 GHz signal was applied to the MZI electrode input and the results captured and exported to MATLAB. Two tests were run with the 5.25 GHz signal, the first with the VCO disconnected and no modulation present and the second with the VCO outputting a FM chirp to the zero-crossing generator to create an FM sampling pulse train used as an ADC trigger. The spectrogram of the 5.25 GHz signals are shown in FIGS. 19A and 19B. From the results, it can be observed that Nyquist zone N=0 and the modulated signal can be successfully unfolded to the correct frequency. The noise level appears higher than in the SM-NYFR results.

Test Two: 8.10 GHz RF Signal

Figure 20:
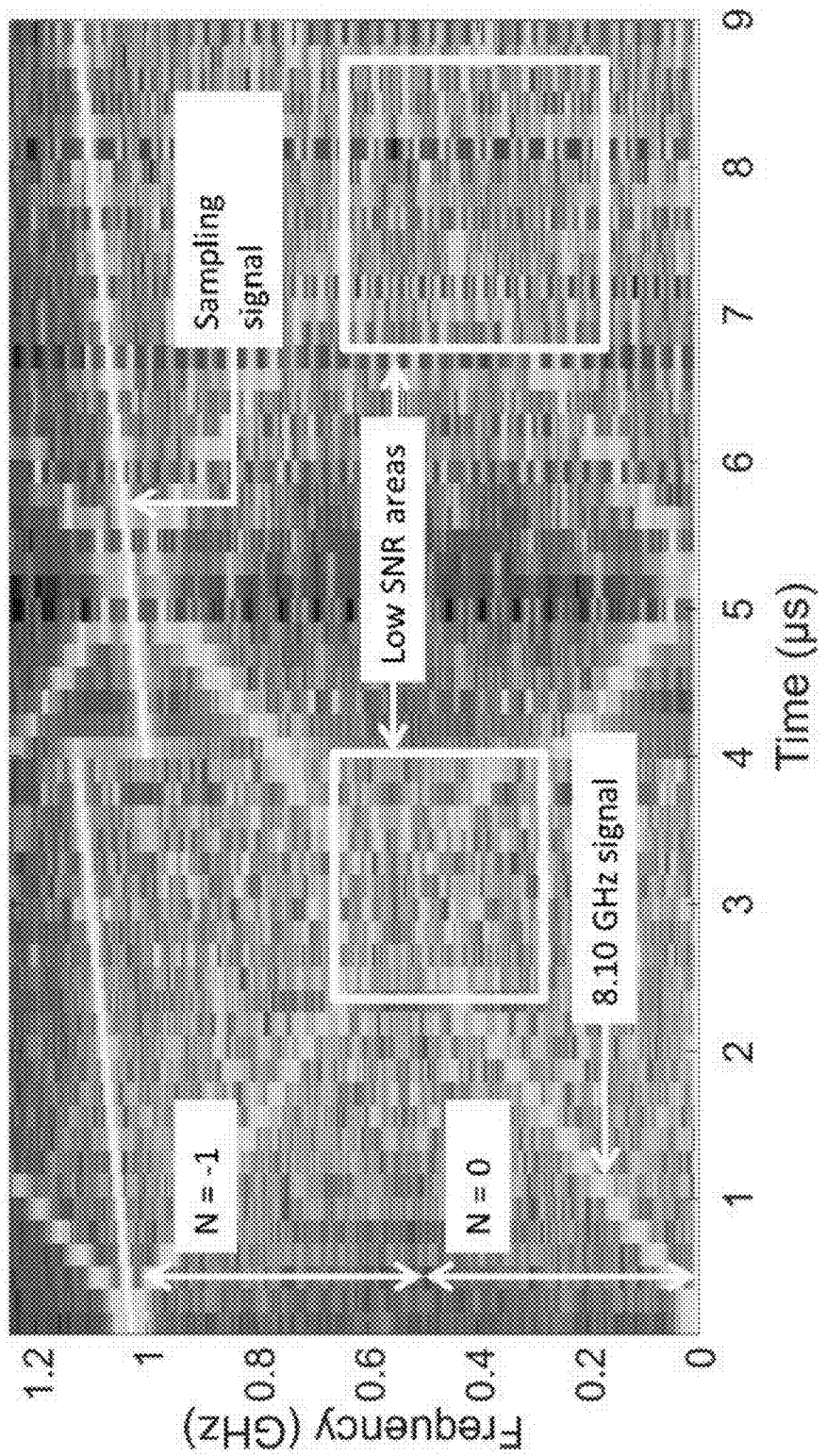
FIG. 20 illustrates an 8.1 GHz target signal response.

For a second test, an 8.10 GHz signal was applied to the antenna input. The result is shown in FIG. 20, and the original frequency was extracted. Unlike the DM-NYFR, from the results it is shown that a large amount of noise clutter is present that could obscure a low signal-to-noise ratio signal such as an LPI waveform. This is indicated in FIG. 20 by a label which marks an ambiguous area where the signal blends into the noise background. The High Noise of the SM-NYFR Design Makes low SNR signal detection difficult.

In summary, the computer simulations of the two receiver designs were described in this section. Both the DM-NYFR and the SM-NYFR architectures were modeled and simulated in order to test their operation. While both designs correctly unfolded compressed, incepted RF signals, the DM-NYFR design has a better noise response.

(5) Receiver Hardware Prototype Build

After successfully confirming the photonic NYFR designs in rSOFT's OPTSIM design suite, a prototype NYFR was built to demonstrate physical operation. The design, construction, and testing of a hardware DM-NYFR prototype and associated components are discussed in this section.

Notably, component cost and funding was a factor during the prototype build. Due to funding limitations, lower cost equipment was used that did not meet the intended performance specifications of the designed or simulated architecture. Consequently, the prototype build is a scaled-down design that functions as a technology demonstrator and proof-of-concept rather than a fieldable receiver. Specifically, although the NYFR was designed and simulated to function in the GHz range with Nyquist zone bandwidths of 500 MHz, the hardware prototype is only able to operate in the kHz/MHz range with zone sizes of 50 kHz. Despite these constraints, the prototype is able to successfully undersample at sub-Nyquist rates and extract the original frequency information.

(5.1) Overall Setup and Equipment Used

Figure 21:
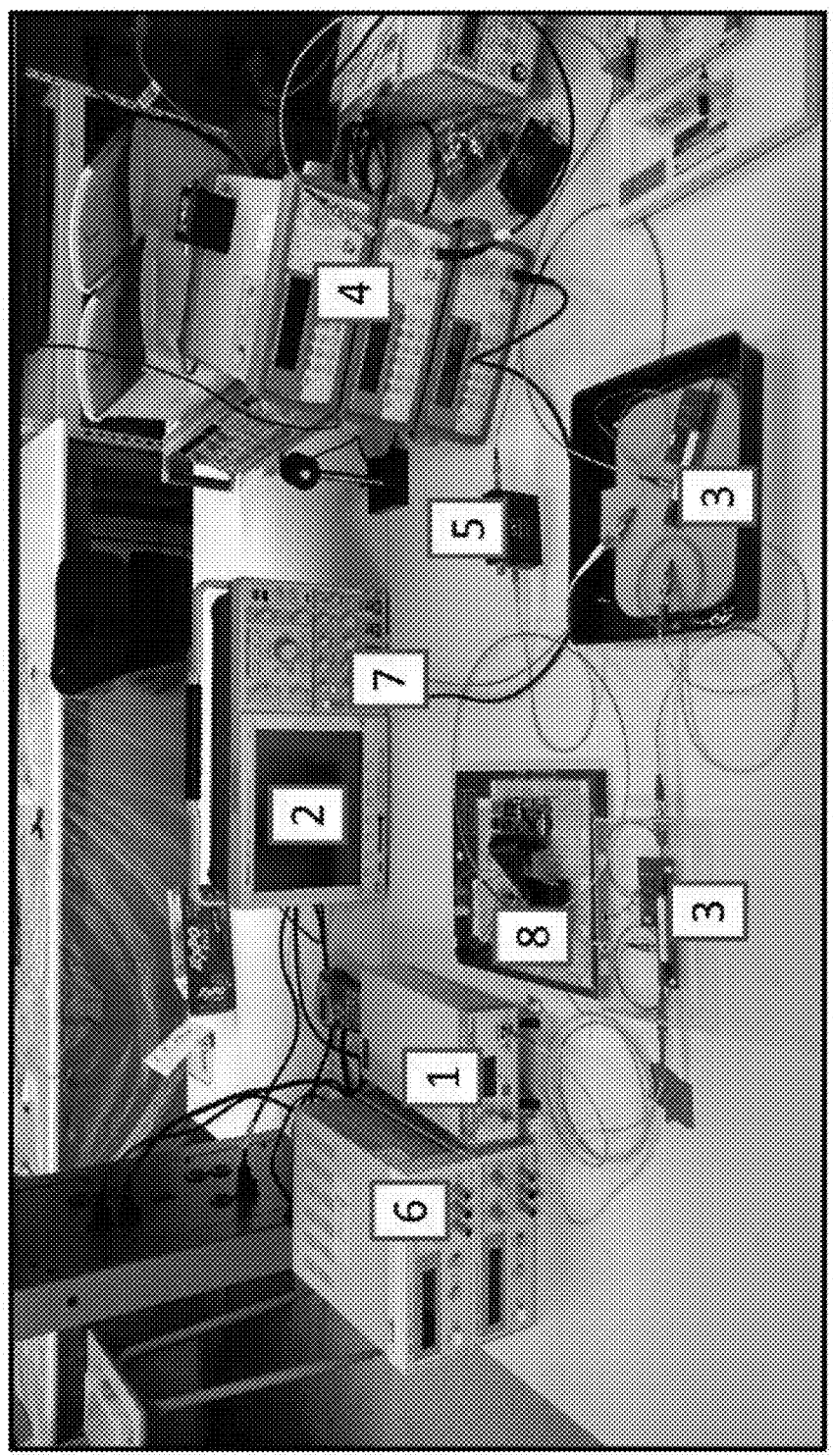
FIG. 21 illustrates a DM-NYFR hardware setup, according to an exemplary embodiment of this disclosure.
Figure 22:
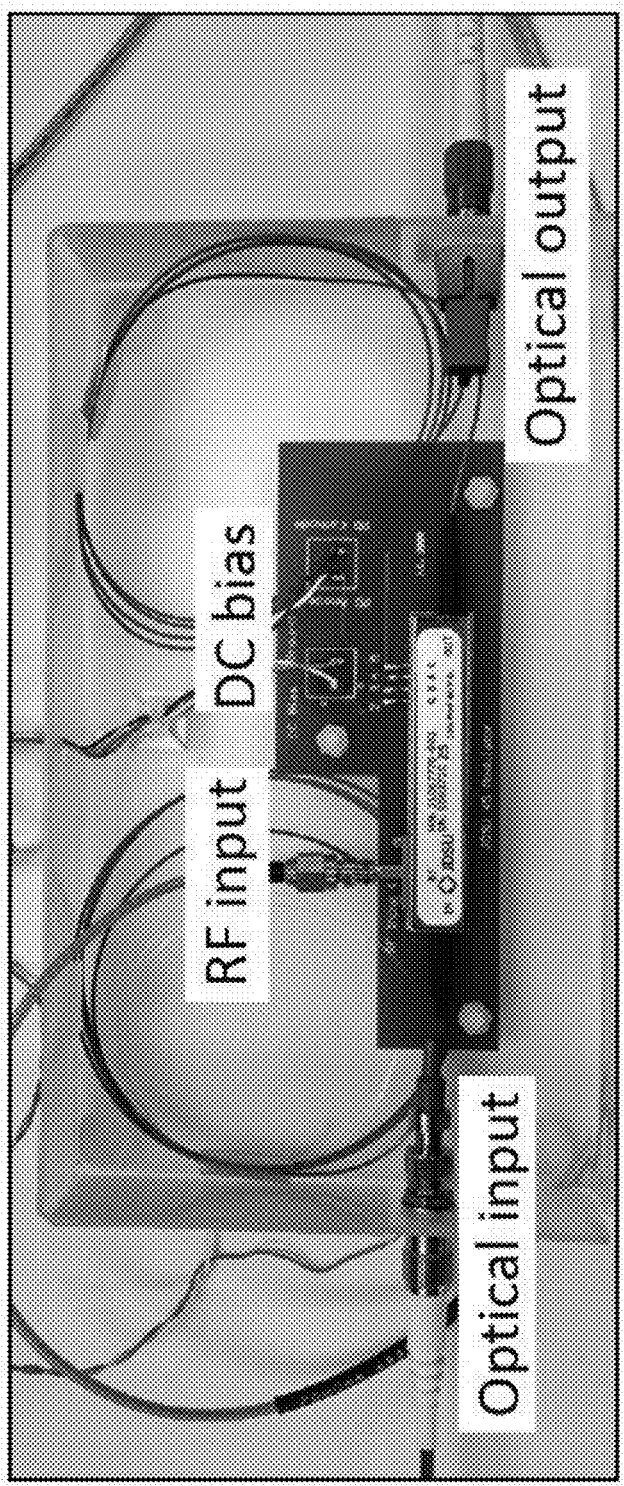
FIG. 22 illustrates a JDSU X5 MZI mounted on a printed circuit board (PCB), according to an exemplary embodiment of this disclosure.

The DM-NYFR prototype build matches the block diagram in FIG. 4 and is shown in FIG. 21. The components list is shown in Table 5.1. The prototype uses a THORLABS S1FC1550 1550 nm laser with an output power of 1.75 mW coupled into a JDSU X5 single-arm MZI with a DC bias to move the MZI out of positive quadrature as shown in FIG. 4. The DC bias is set so that an applied electrode voltage of 0.0V will combine the MZI arms out-of-phase, and an electrode voltage of 5.5V will combine the beams in-phase. The X5 electrodes are attached to an electrical pulse generator (EPG) driven by an AGILENT E3612A DC power supply and AGILENT 33220A 20 MHz function generator. The EPG is detailed in Section 5.3.

The MZI1 output is coupled to the MZI2 input, which is also a X5 modulator driven with another 33220A function generator which imitates an antenna input. The MZI2 DC bias is not used as the phase constant $\phi_0$ set during manufacture biases the modulator at positive quadrature. This allows the applied AC small signal to act on the most linear region of the MZI transfer function. The MZI2's output is connected to a NEWPORT D-30IR detector. The detector's output is coupled with a TEKTRONIX DPO4104 1.0 GHz digital oscilloscope which functions as an ADC and data collector, while a laptop computer running MATLAB performs the DSP. A THORLABS EF502 filter is connected between the detector and the oscilloscope as an interpolation LPF with a 100 kHz cutoff frequency. All fiber used is SMF28E single-mode optical fiber.

TABLE 5.1

DM-NYFR Prototype Hardware Build Component Descriptions

| Number | Part | Name | Function |
|---|---|---|---|
| 1 | S1FC11550 | THORLABS CW laser | 1550 nm CW laser source outputting at 1.75 mW. |
| 2 | DPO4104 | TEKTRONIX scope | Digital 1 GHz oscilloscope used as an ADC and data collector when connected to a laptop. |
| 3 | X5-MZI | JDSU MZI | Single-arm MZI biased at zero for pulse generation and positive quadrature for signal inception. The MZI has a 40 GHz bandwidth. One is coupled with the EPG to generate sampling pulses, the other is coupled with the RF signal input. Switching voltage is $V_\pi$ = 5.5 V. |
| 4 | 33220A | AGILENT function generator | Programmable 20 MHz function generator. One is used to drive the EPG and another is used as an RF signal source. |
| 5 | D-30IR | NEWPORT photodetector | PIN photodiode with an internal 10 dB LNA that converts optical signals into electrical |
| 6 | E3612A | DC power supply | Power supply used to power to the EPG |
| 7 | EF502 | THORLABS LPF | 100 kHz elliptical low pass filter (5th order) used as an interpolation filter between the detector and ADC. |
| 8 | EPG | Electrical pulse generator | Generates electrical pulses to drive MZI1. Design detailed in Section 5.3. |

(5.2) MZI Setup and Testing

The setup and testing of the MZIs used for modulating the CW laser is described in this section. The JDSU X5 MZIs are mounted on silicon boards shown in FIG. 2.2. Fiber attachments were soldered to the optical ports, and a coaxial cable attached to the RF input wire for the DC bias were attached to the MZI board. The MZI was mounted in a case to protect it from any physical damage.

Figure 23:
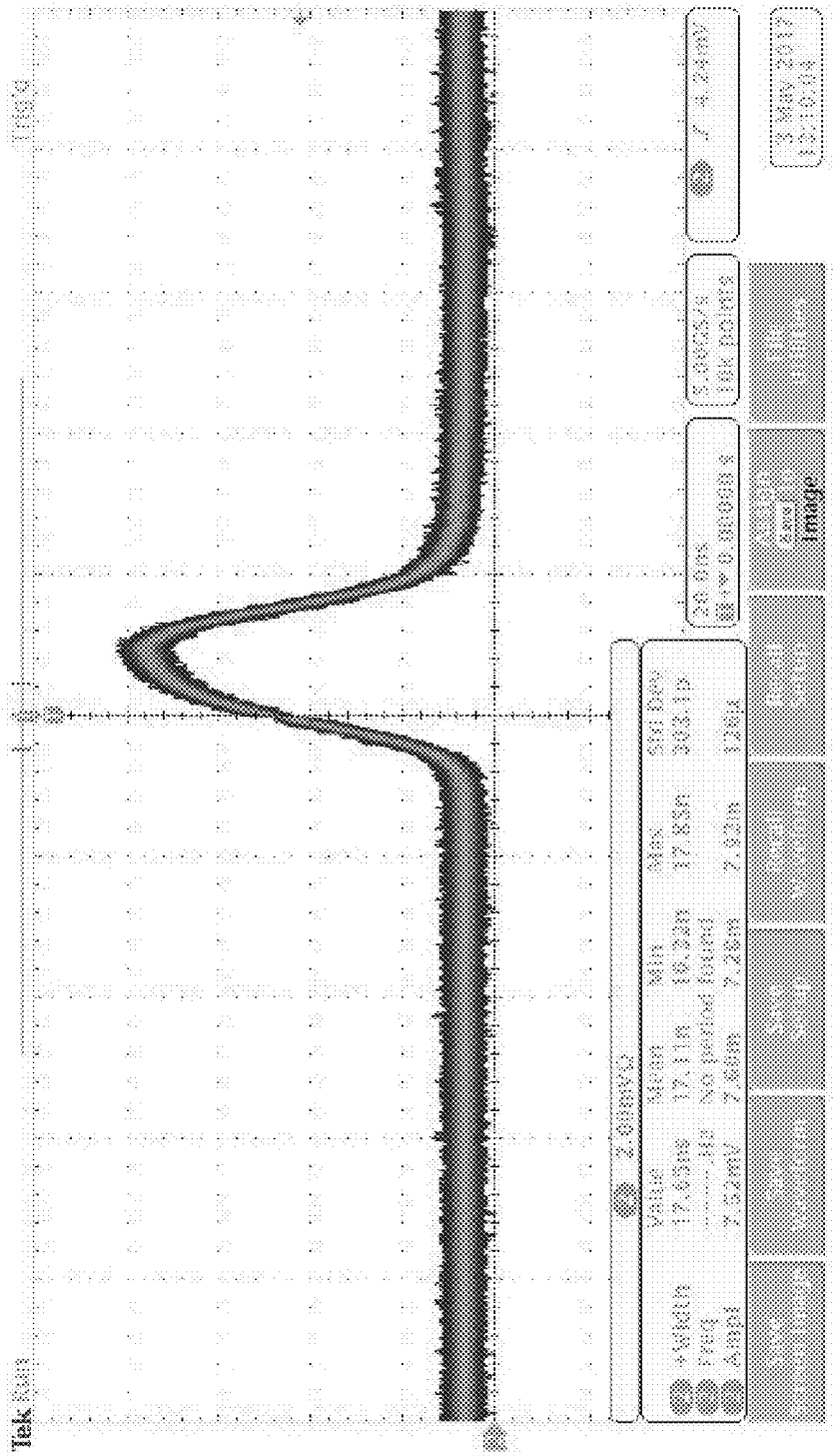
FIG. 23 illustrates an oscilloscope capture of a single 30 ns wide electrical pulse incident on a JDSU X5 MZI, according to an exemplary embodiment of this disclosure.

The EPG circuit, which outputs a 30.0-nanosecond wide electrical pulse at $V_\pi$=5.5V, was connected to the MZI, and an output optical pulse was examined in order to show the MZI response. The oscilloscope capture of the MZI optical output $I_0$ is shown in FIG. 23.

The −3.0 dB pulse width was measured as 17.11 ns at 7.60 mV. The pulse-width variance was 303.1 ps, and the amplitude jitter was 126.0 µV. The optical pulse width is smaller than the electrical pulse width due to the non-linear MZI input/output response (3.5).

(5.3) Pulse Generation Circuit

An EPG circuit was built in the NPS photonics laboratory using COTS components that can output a 30 ns wide electrical pulse train with an amplitude of 5.5V and a linear FM sweep as described in equation (3.8). The EPG is used to drive the first MZI and generate optical pulses sufficient for a prototype proof-of-concept build.

(5.3.1) Circuit Design and Simulation

Figure 24:
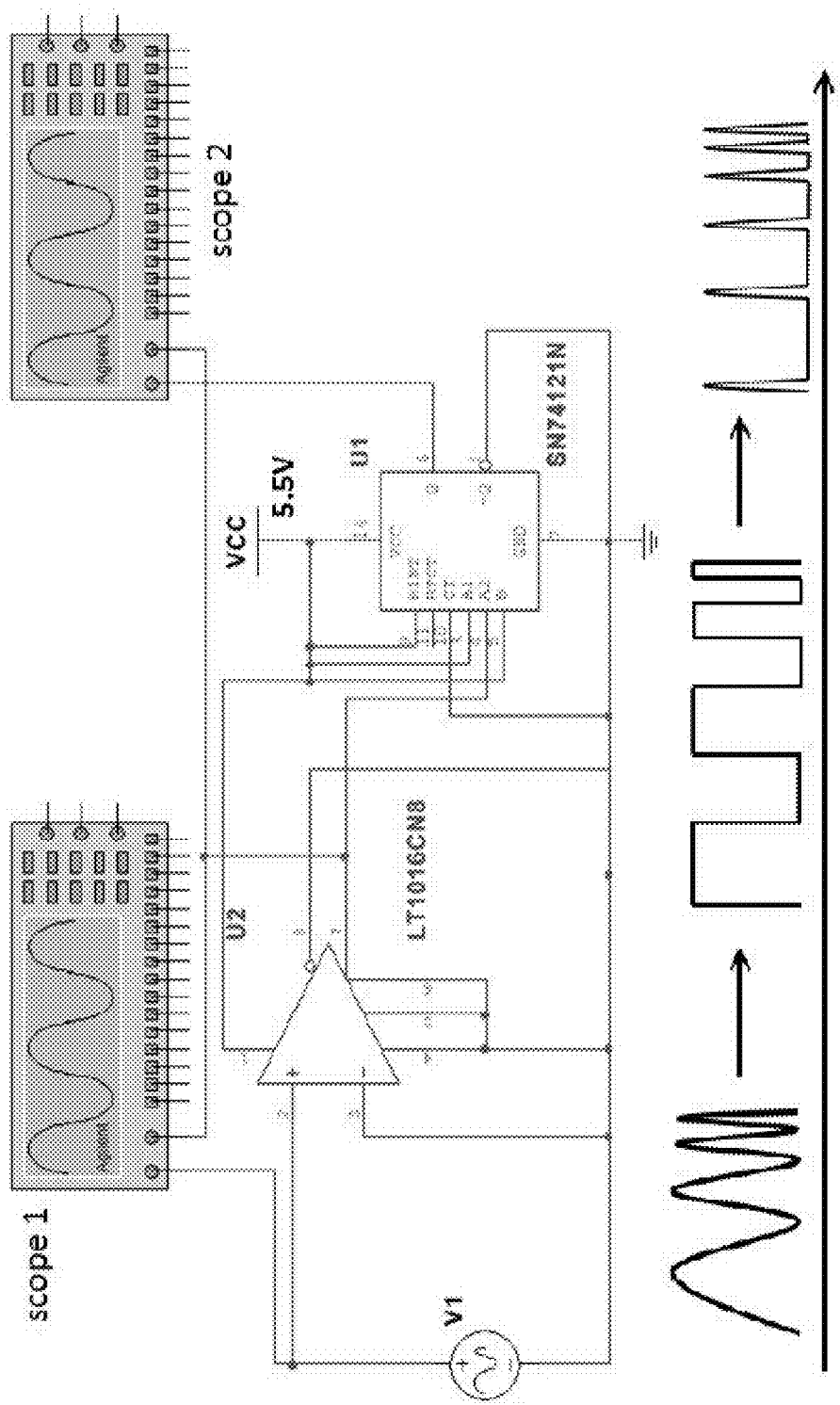
FIG. 24 illustrates an EPG circuit schematic created in NI Multisim along with an example waveform.

The EPG circuit was designed and simulated in NI MULTISIM, an electronic work-bench built around SPICE software simulation to accurately model circuit behavior. The schematic is shown in FIG. 24 along with a graphical representation of how a FM sinusoid propagates through the circuit. The EPG consists of three main parts: a swept sinusoidal AC source, a comparator, and a one-shot multi-vibrator.

Circuit Description

The AC source is a chirp waveform output from a 33220A signal generator which is connected to a LT1016CN8 comparator referenced to ground. The AC signal is $V_1$ and the reference level is $V_2$. When $V_1 \geq V_2$ the output is $V_{cc}$, 5.5V. Otherwise, the signal is grounded to 0.0V. This turns the chirp sine wave into a swept-square wave with distinct rising and falling edges. These edges are used as triggers for the pulse generator. The LT1016 has unused reference pins that must be grounded in order to function correctly. The trigger signal from the comparator is sent to the SN74121N monostable one-shot multivibrator that outputs the electrical pulses.

The SN74121N is a voltage oscillator that can flip between two states, $V_{cc}$ and ground, when triggered by a clock edge. Only the ground state is stable, however, and the high state is unstable. A falling edge trigger pushes the multivibrator into the unstable state, setting the output high for a specific time determined by a programmable RC constant $\tau$. For the EPG, $\tau=30$ ns, and because the swept-square waveform functions as the trigger signal, every falling edge outputs a 30 ns wide electrical pulse with an amplitude of $V_\pi=5.5V$.

NI Multisim Test

Figure 25:
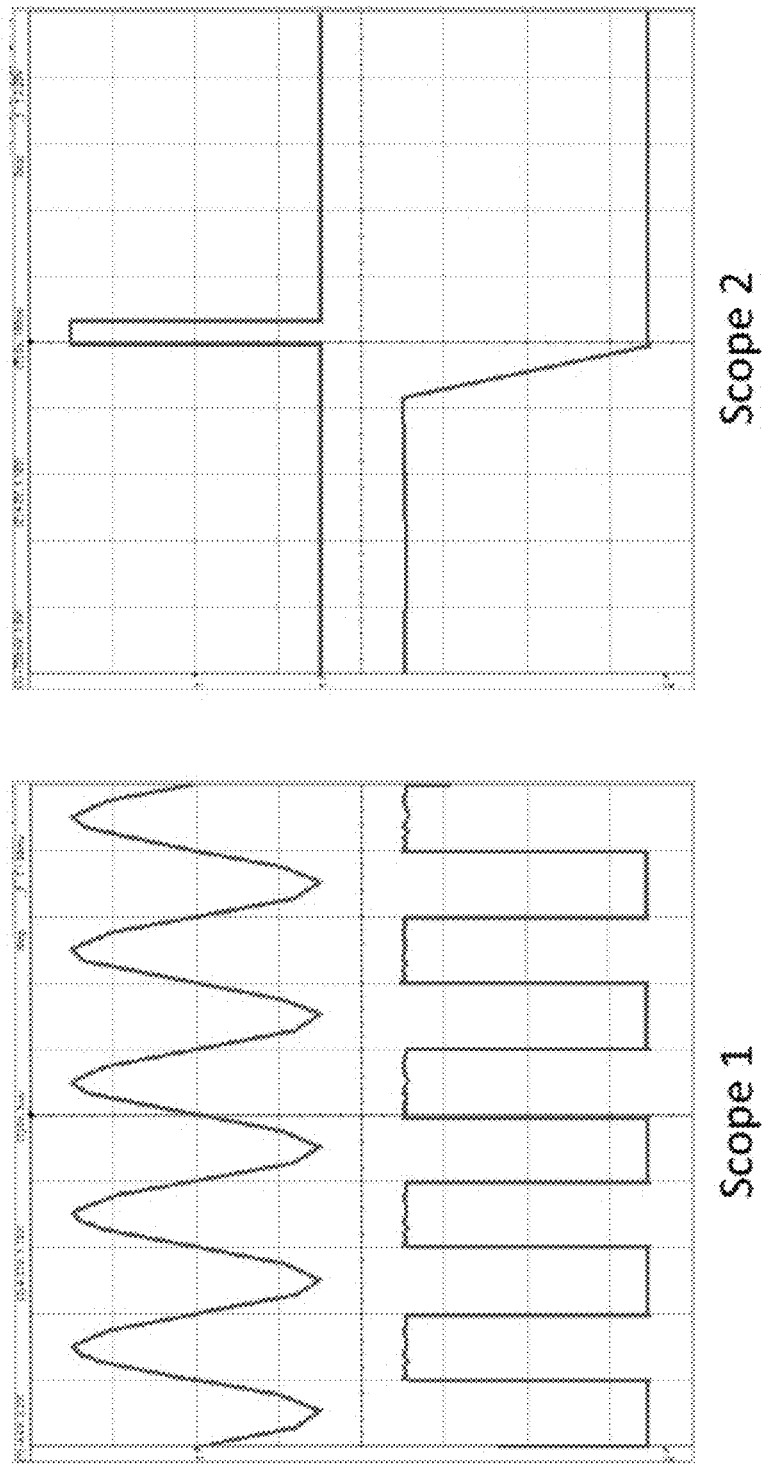
FIG. 25 illustrates a Multisim simulation showing the output of scope one and two.

The schematic shown in FIG. 24 was simulated in NI MULTISIM, and the results are shown in FIG. 25. The SPICE models for the SN74121N and LT1016CN8 were downloaded and imported from an NI chipset database. The AC signal input and comparator output is shown with Scope 1 and tests the square-wave conversion. The falling edge trigger from the LT1016 and a single 30 ns wide pulse is displayed by Scope 2. The output has a perfect impulse shape due to the simulation parameters not including a realistic load.

(5.3.2) Pulse Generation Testing

Figure 26A:
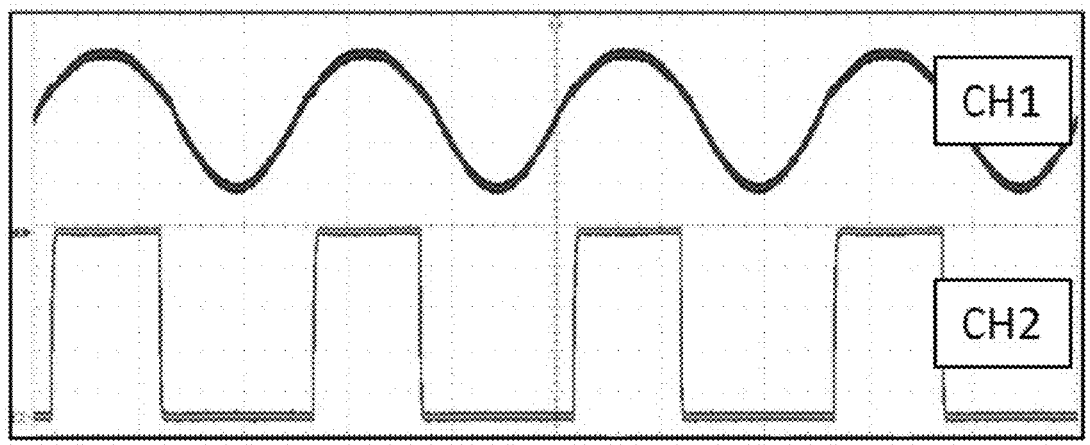
FIGS. 26A and 26B illustrate a results of EPG circuit testing showing a clock signal generation with CH1 connected to the input FM sweep and CH2 connected to the LT1016 output (FIG. 26A) and pulse generation with CH1 connected to SN74121 input and CH2 connected to the EPG output (FIG. 26B).
Figure 26B:
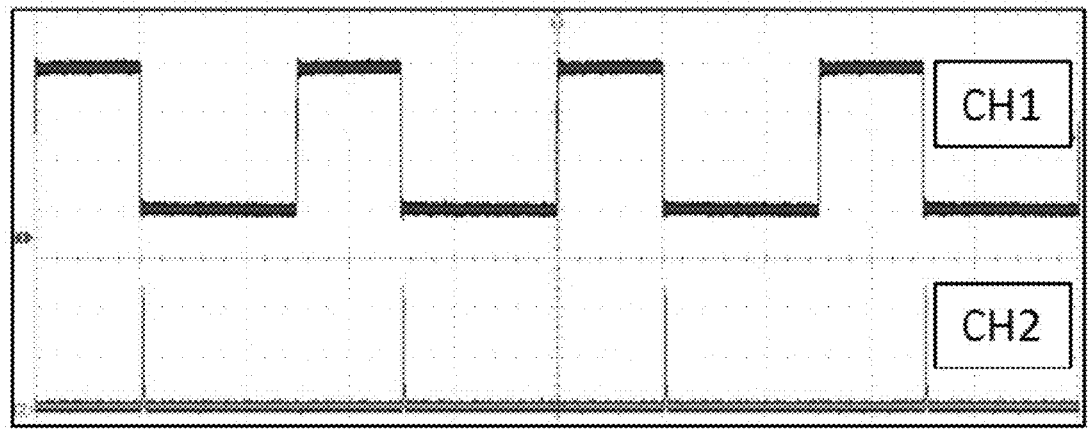

The EPG circuit in FIG. 24 was constructed on a breadboard for testing. The input was attached to a 1.0 MHz sine wave and the output connected to the test bench. An oscilloscope was used to probe various points of the circuit in order to test all the parts and confirm overall function. The oscilloscope outputs are shown in FIGS. 26A and 26B. Shown in FIG. 26A are probes connected to the input and output of the LT1016 converting the sinusoid into a clock signal. Additionally, the SN74121 functionality is demonstrated by capturing the input clock signal and the output pulses, which are confirmed to be 30 ns long and are shown in FIG. 26B.

Figure 27:
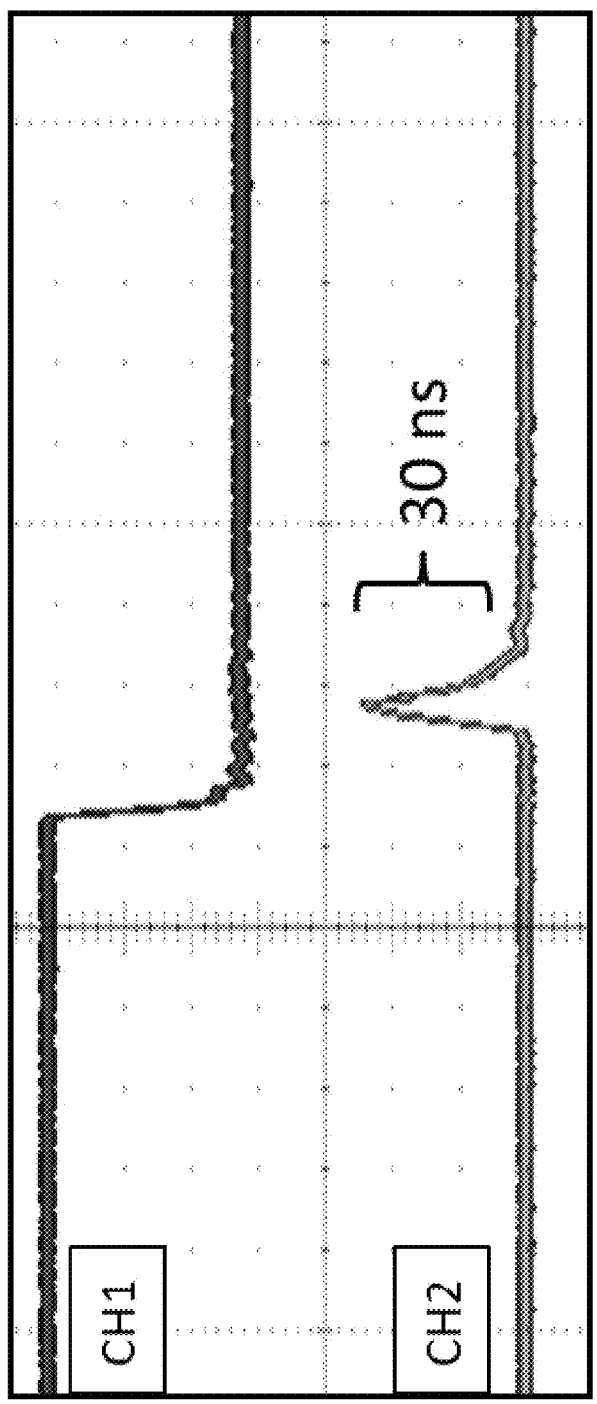
FIG. 27 illustrates a single falling edge (CH1) with electrical pulse (CH2).
Figure 28:
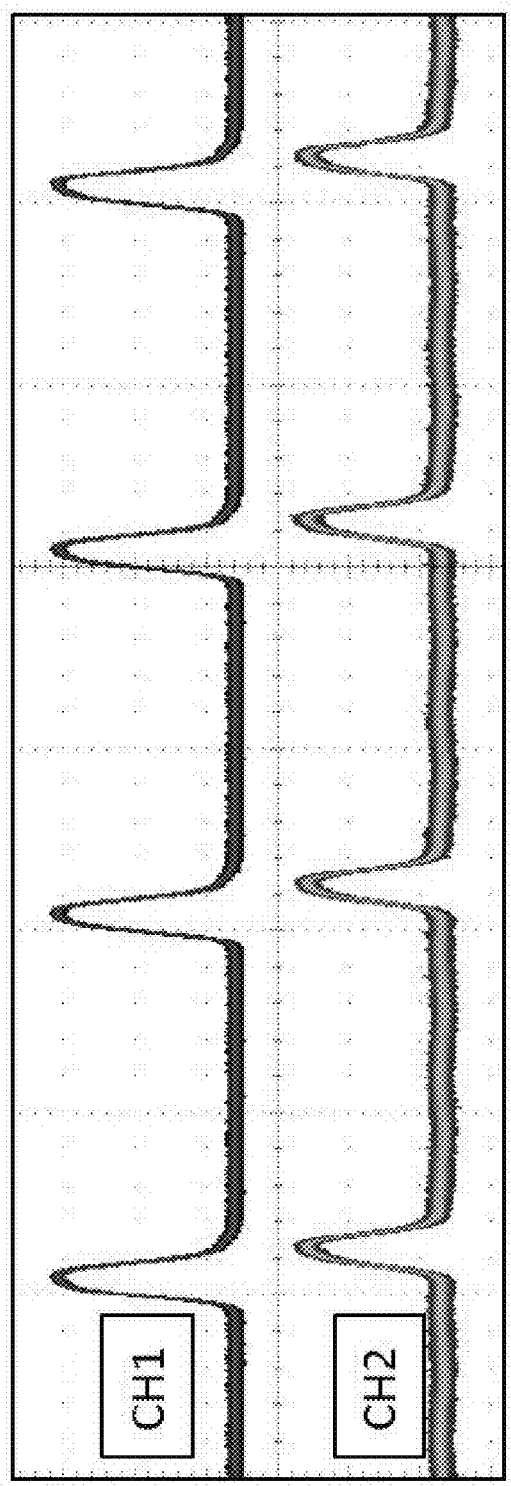
FIG. 28 illustrates electrical pulses (CH1) and the corresponding optical pulses (CH2).

A detailed examination of a single falling edge and timing pulse is shown in FIG. 27. These tests indicate the EPG circuit is functioning correctly. Lastly, the oscilloscope is attached to measure both the output electrical pulses and the output optical pulses. The MZI is coupled with a PIN photodiode in order to measure the optical pulses by converting them into electrical signals. This is shown in FIG. 28 with both the electrical pulses and their corresponding optical pulses. The optical pulses slightly lag the electrical pulses, but otherwise, the MZI output response mimics the driving signal.

The design, construction, and testing of the hardware NYFR prototype and components were described discussed in this section. The prototype used COTS components to implement a scaled down photonic NYFR that functions as a proof-of-concept build. Testing confirmed the individual components and their functionality. Test results from the functioning NYFR prototype with target RF signals is detailed in the next section.

(6) Prototype Test and Evaluation

The hardware prototype testing, evaluation, and results of the DM-NYFR shown in FIG. 21 is covered in this chapter. Multiple modulation schemes are tested with the first MZI stage to confirm the FM optical pulse train output. The primary results are from time-frequency spectrogram captures of target signals from the RF signal generator. Additionally, the signal processing methodology of de-noising, thresholding, and edge detection which made the incepted signals human readable is discussed in this chapter.

(6.1) FM Optical Pulse Testing

Four FM presets are used as modulation schemes for the sampling pulse train. The FM presets are listed in Table 6.1 below where $t_m$ is the modulation period, $\Delta F$ is the sweep bandwidth, and $f_c$ is the starting frequency for the sweep. All modulations are linear sawtooth chirps instead of triangular chirps, which were chosen due to hardware limitations with the signal generator. The varying bandwidths of the FM chirp signal presets allows a wide spectrum of target RF waveforms to be folded by the NYFR. Higher frequency signals are intercepted more efficiently with smaller sweep bandwidths, whereas larger sweep bandwidths perform better for lower frequency signals. The relationship between sweep bandwidth and compressed signal bandwidth is explored in detail in Section 6.3 below along with the effects of using a non-ideal modulation sweep bandwidth preset.

TABLE 6.1

Pulse Train FM Presets

| Preset | Parameters |
| --- | --- |
| Preset 1 | $t_m = 2$ ms $\Delta F = 25$ kHz $f_c = 100$ kHz |
| Preset 2 | $t_m = 2$ ms $\Delta F = 15$ kHz $f_c = 100$ kHz |
| Preset 3 | $t_m = 2$ ms $\Delta F = 10$ kHz $f_c = 100$ kHz |
| Preset 4 | $t_m = 2$ ms $\Delta F = 5$ kHz $f_c = 100$ kHz |

Figure 29B:
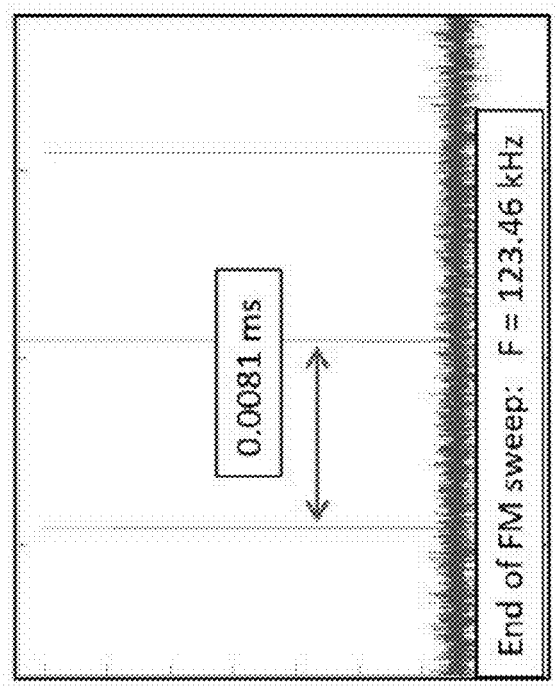
FIGS. 29A and 29B illustrate a FM optical pulse train PRI measured at a beginning of the sweep and near the end of the sweep, respectively.
Figure 29A:
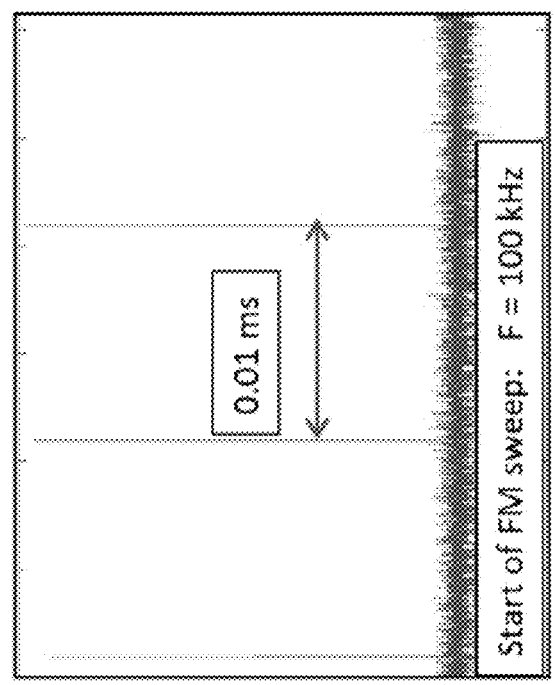

Oscilloscope captures are used to analyze the pulse-repetition interval (PRI) over a modulation sweep. This is shown in FIGS. 29A and 29B, which highlights the changing PRI at the beginning of the modulation sweep and near the end of the modulation sweep. A PRI of 0.01 ms corresponds to the starting frequency of 100 kHz, while the PRI of 0.0081 ms corresponds to a repetition frequency of 123.46 kHz.

Figure 30:
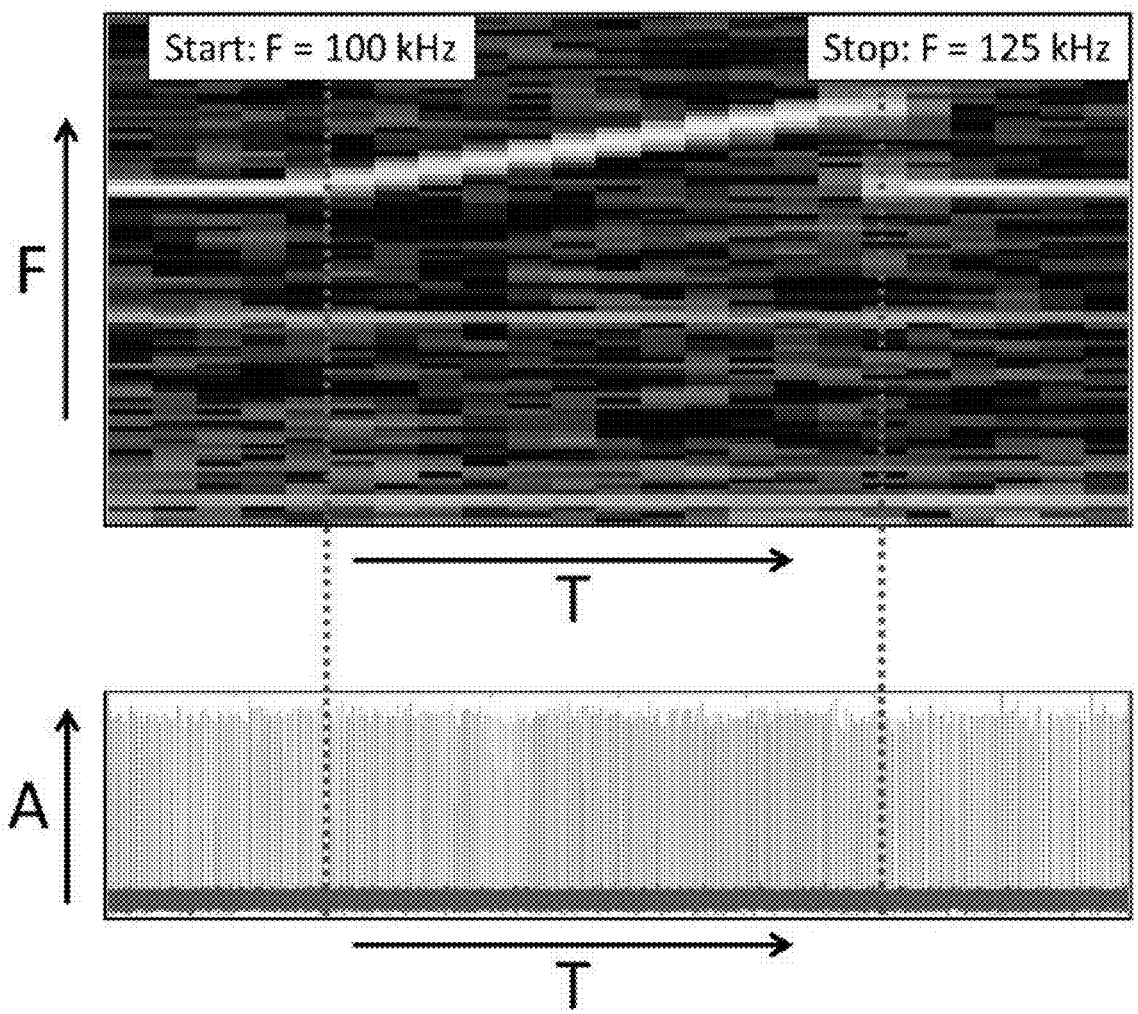
FIG. 30 illustrates a time-frequency spectrogram of FM optical pulses compared against amplitude-time oscilloscope capture.

Additionally, the captured oscilloscope output was analyzed in MATLAB in order to plot a time-frequency representation of the optical pulse train. The results are shown in FIG. 30, which overlays the time-domain oscilloscope capture with the frequency-domain spectrogram to show the modulation bandwidth of 25 kHz. The test result confirmed the operation of the optical pulse generation circuitry when the input signal is linearly chirped.

(6.2) Signal Processing Methodology

Figure 31:
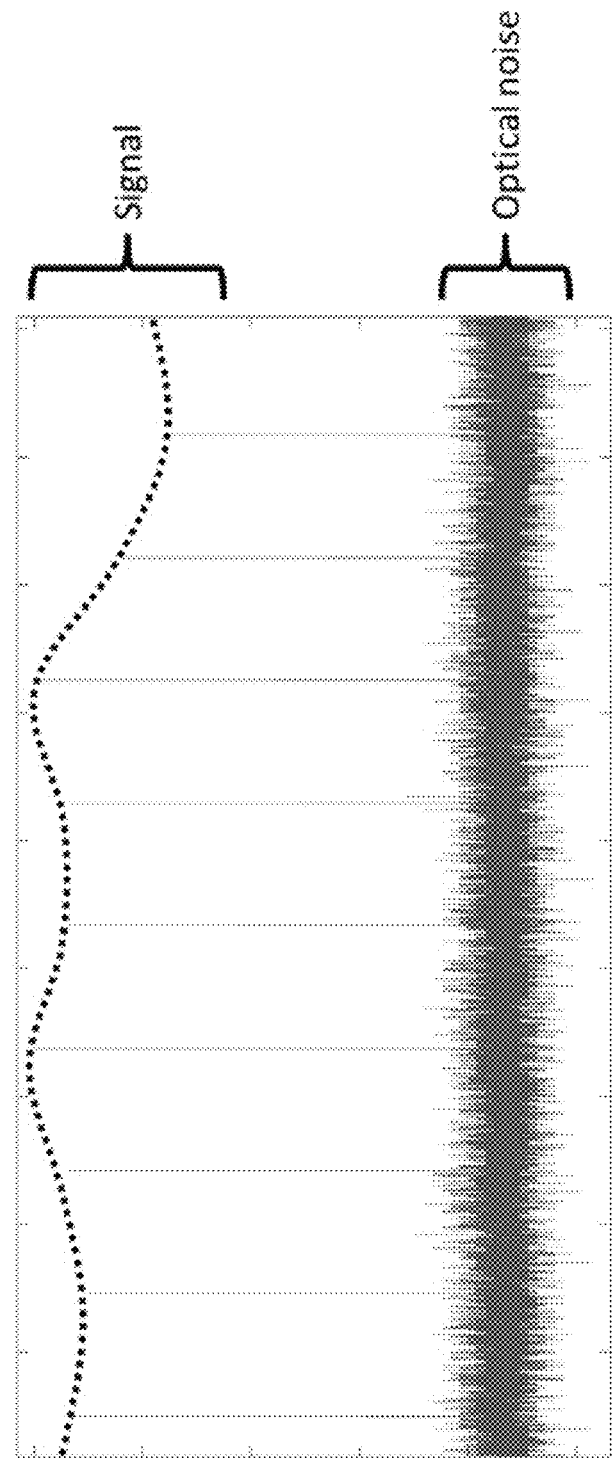
FIG. 31 illustrates an example NYFR capture illustrating both the signal and optical noise, according to an exemplary embodiment of this disclosure.

The signal processing methodology, specifically noise removal and thresholding, that is required due to the high noise floor of the optical signals is covered in this section. This is due to the low optical power on the input of MZI2 as well as characteristics associated with the MZI functionality. Each MZI has roughly a 3 dB loss between the input optical intensity and the output optical intensity. As the modulators are added in series, power loss increases, resulting in low incident power on the detectors. Another factor for the high noise floor when using MZIs is the imperfect extinction ratio that prevents total destructive interference. The ideal case of the MZI transfer function is illustrated in FIG. 3; however, in actual operation it is impossible to completely reduce the output intensity to zero and as a result some laser output is always present. Lastly, relative intensity noise (RIN) arises from power instabilities and vibrations within the CW laser cavity. With a low sampling signal duty cycle, the time-averaged noise power is larger than the signal power, and de-noising is a necessity. This is shown in FIG. 31.

Figure 32:
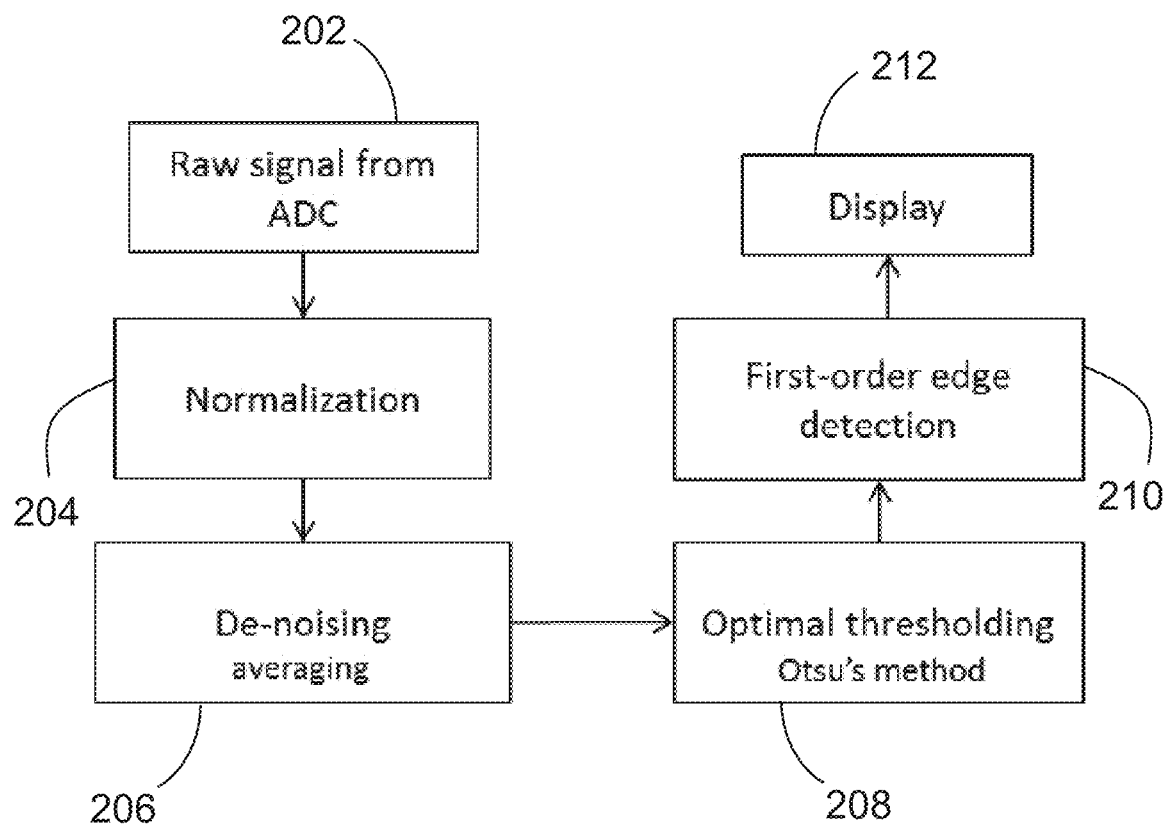
FIG. 32 is a block diagram of NYFR image processing steps, according to an exemplary embodiment of this disclosure.

The folded signal includes optical noise which needs to be filtered before analysis can take place. Additionally, thresholding and edge detection are implemented to make the undersampled signals distinguishable. The image processing block diagram is shown in FIG. 32 and details the DSP steps to refine the NYFR output.

The raw ADC signal 202 is first normalized 204 and then passed into a noise removal block 206 that uses squared averaging to compute a cutoff value below which the signal is set to zero. The noise power $P_{noise}$ is defined as $$P_{noise} = \frac{\sum_{i=1}^{n}(S[i]-\bar{S})^2}{n} \quad (6.1)$$

where S[i] is the n sized signal array and i is the index corresponding to a data point.

The signal is de-noised by setting the signal array to $$S[i] = \begin{cases} S[i], & \text{if } S[i] \geq P_{noise} \\ 0, & \text{if } S[i] < P_{noise} \end{cases} \quad (6.2)$$

which removes much of the optical noise.

Figure 33:
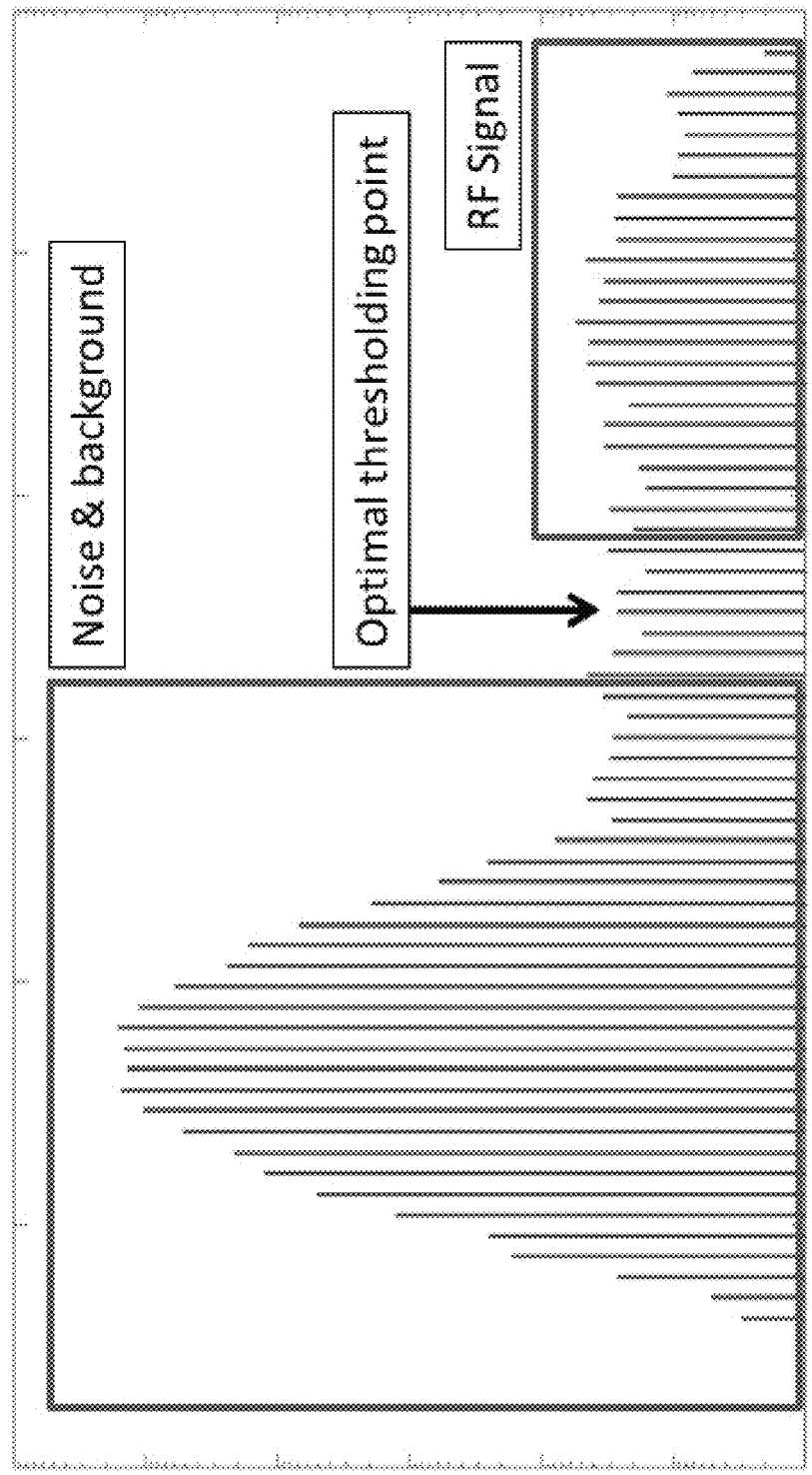
FIG. 33 illustrates an example NYFR capture histogram illustrating Otsu's method of optimal thresholding, according to an exemplary embodiment of this disclosure.

After initial processing, the signal is thresholded 208 in order to facilitate edge detection. Otsu's method of optimal thresholding is used to isolate the signal from the background noise by identifying the 0th and 1st order cumulative moments of an n-sized histogram. The maximum variance of the class separability between the two histogram moments is the optimal thresholding point (see M. Nixon and A. Aguado, *Feature Extraction and Image Processing*, 1st ed. Jordon Hill, Oxford: Newnes, 2004, pp. 76-79). This is shown graphically in FIG. 33, which is a histogram of a NYFR capture with Otsu's point labeled. Lastly, a simple edge detection method 210 used binarization to convert the signal into a two-state array depending on the average power after thresholding and a display 212. Anything less than the average power after thresholding was set to zero, which highlighted the folded signal slope. All signal processing steps were implemented with MATLAB. As a result of the signal processing steps, both the MZI optical noise and RIN was effectively removed from the ADC captures and the signals were able to be correctly unfolded.

(6.3) Single-Tone Test Results

Selected DM-NYFR tests using a single frequency tone as the target RF signal are shown in this section. The sampling modulation presets used are listed in Table 6.1. Target RF signals are successfully undersampled and extracted using DSP, confirming the prototype's functionality.

(6.3.1) Selected Tests

Select tests with full DSP methodology are presented in this subsection in order to highlight the NYFR functionality. The first selected test was a 225 kHz RF signal with preset three as the modulation scheme. The results are shown in FIGS. 34A-34D, which details both the final signal and the image processing steps. All displays are time-frequency spectrograms computed in MATLAB showing a full ΔF frequency sweep and Nyquist zones N=0, −1.

Figure 34A:
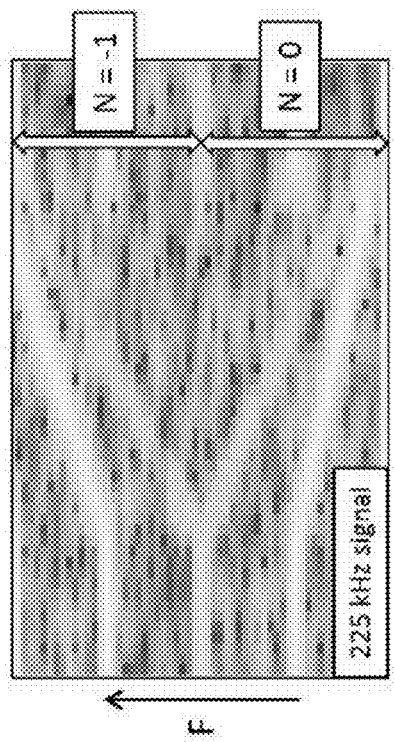
FIGS. 34A-34D illustrate a 225 kHz test with preset three showcasing the DSP steps.

The capture in FIG. 34A is the raw received signal from the ADC block of the NYFR. The 225 kHz signal is masked by noise and is not discernible from the image.

Figure 34B:
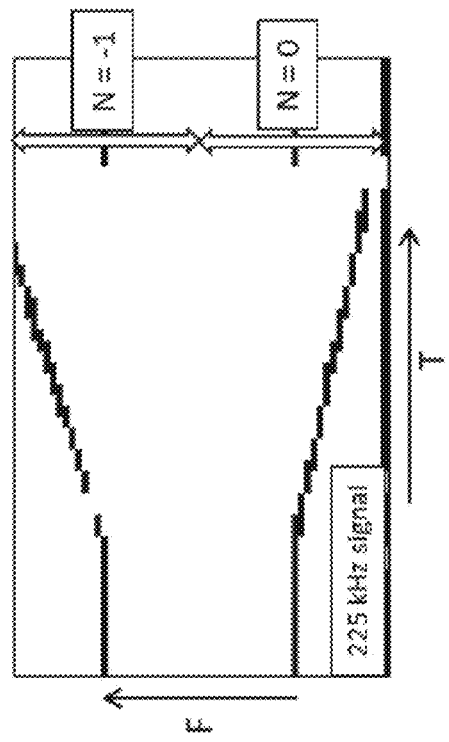

In FIG. 34B it is shown the DM-NYFR signal after preliminary de-noising and normalization. At this stage the target signal is faintly visible from the background.

Figure 34C:
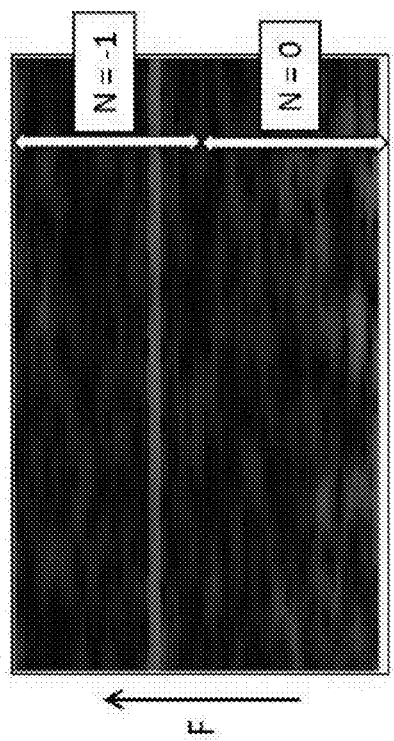

The next capture, FIG. 34C, is after the application of optimal thresholding, which removes almost all of the clutter and leaves the target signal clearly identifiable.

Figure 34D:
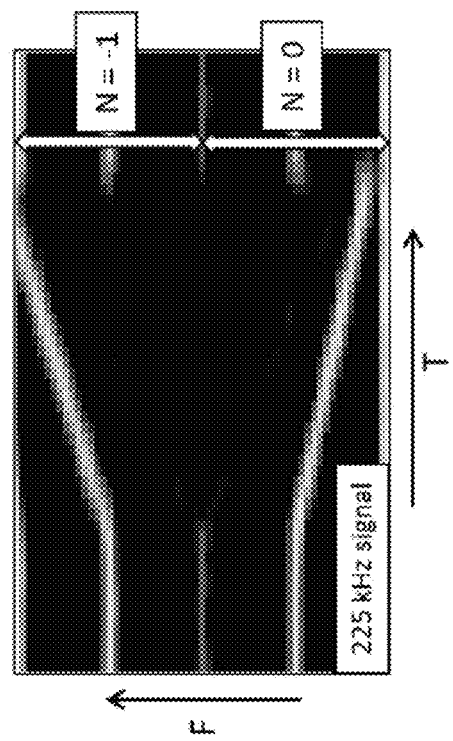
Figure 35:
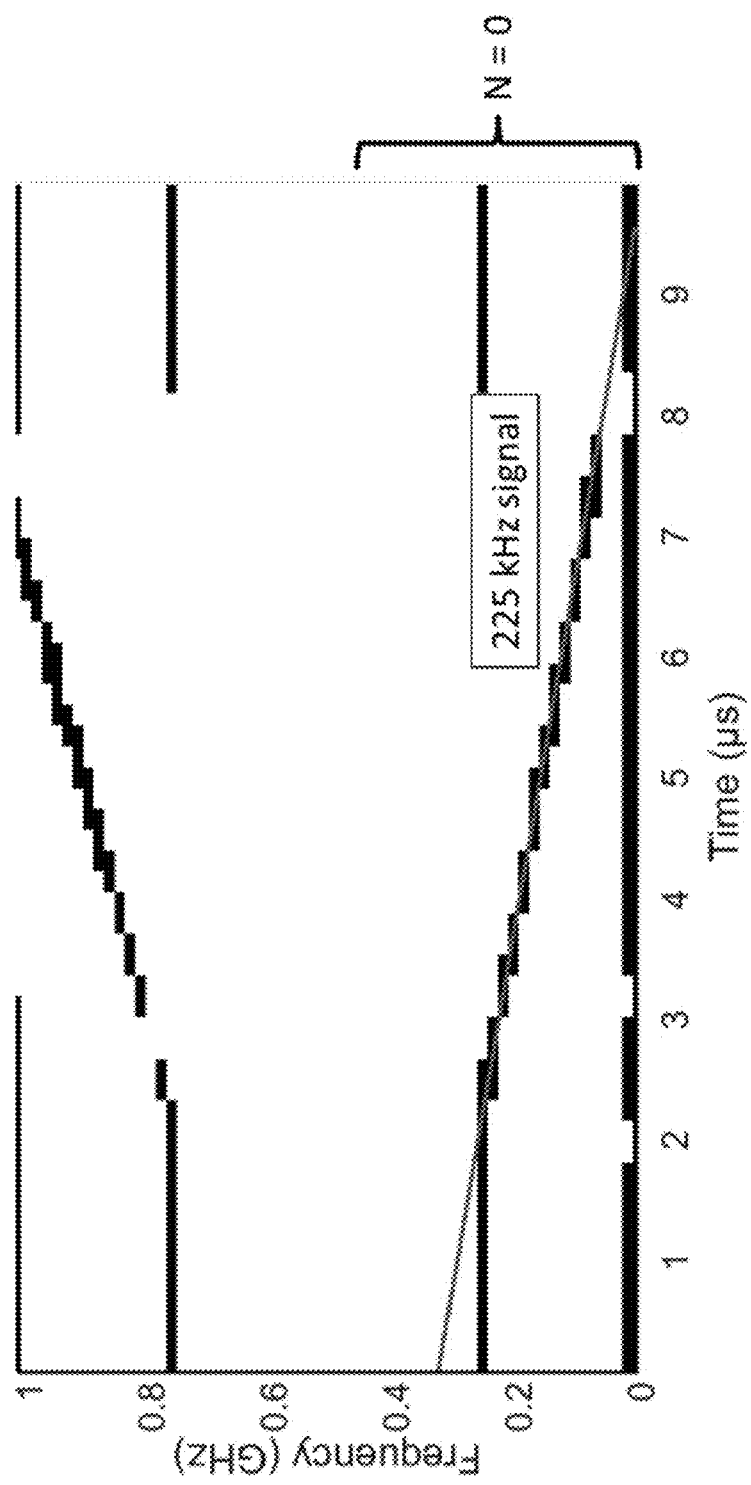
FIG. 35 illustrates a 225 kHz signal with a fitted slope for unfolding, according to an exemplary embodiment of this disclosure.

FIG. 34D is an illustration of the final output of the DSP block and is used in conjunction with the unfolding methodology described in Section 4.1 above using equations (2.6) and (2.7). This is shown in FIG. 35 as a red line fit to the slope of the signal, which was used to successfully extract the correct original frequency of the target RF waveform.

Figure 36A:
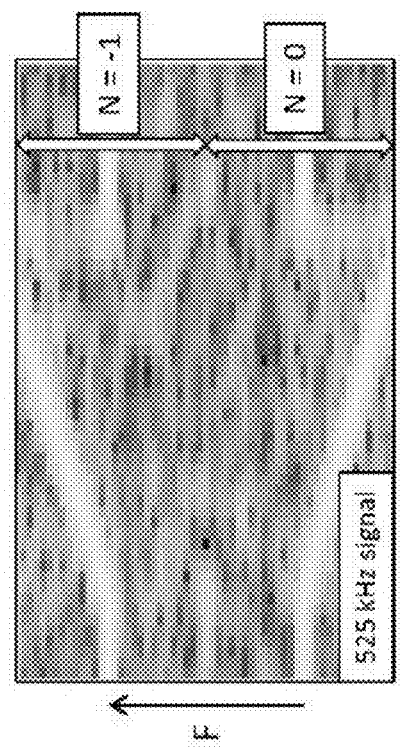
FIGS. 36A-D illustrate a 525 kHz test with preset four showcasing the DSP steps.
Figure 36B:
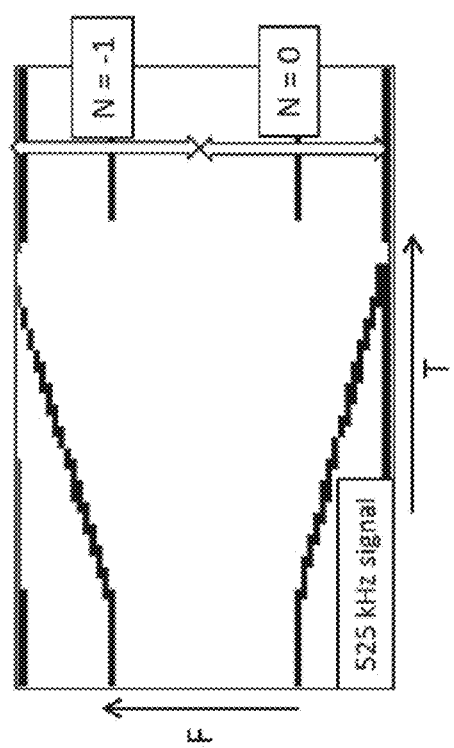
Figure 36C:
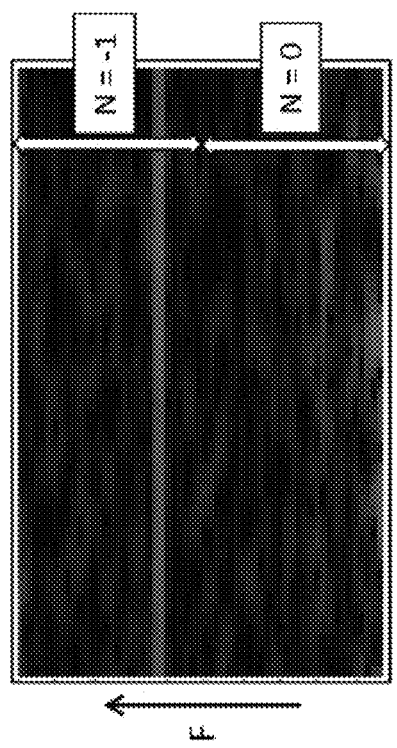
Figure 36D:
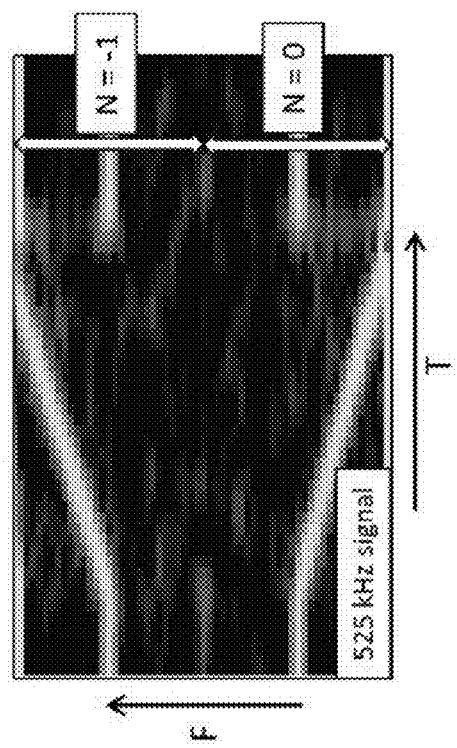

The second selected test was a 525 kHz RF signal with preset four as the modulation scheme and is shown in FIGS. 36A-36D as a series of time-frequency spectrograms. The results confirm the NYFR's operation by replicating the 225 kHz test. Clear progression is shown through each DSP block culminating in a distinguishable signal that is unfolded into its original Nyquist zone. Interestingly, in FIG. 36A shown is the same weak tone signal in Nyquist zone N=−1 that is present in FIG. 36A. This single frequency anomaly is not associated with any target signal and disappears when the noise is removed. This tone likely arises from a periodic oscillation in the optical noise stemming from the MZI. The modulators have a cosine-squared pattern transfer function as described in equation (3.3), which causes spurious frequencies. Another explanation is laser RIN vibrations resonating in the laser cavity. Although this does not appear to affect the DM-NYFR performance, these tones did not appear in the rSOFT simulations, and this underscores the importance of hardware prototyping.

The modulation sweep bandwidth OF has a direct effect on the output modulation slope and can adversely alter the results. A common occurrence when dealing with a large modulation slope is Nyquist zone overflow. The imparted modulation $S_m$ is modeled as $$S_m = f_c + M\Delta F \quad (6.3)$$

where $f_c$ is the center frequency of modulation, OF is the sweep bandwidth, and M is a scale factor from the original signed Nyquist zone.

Figure 37:
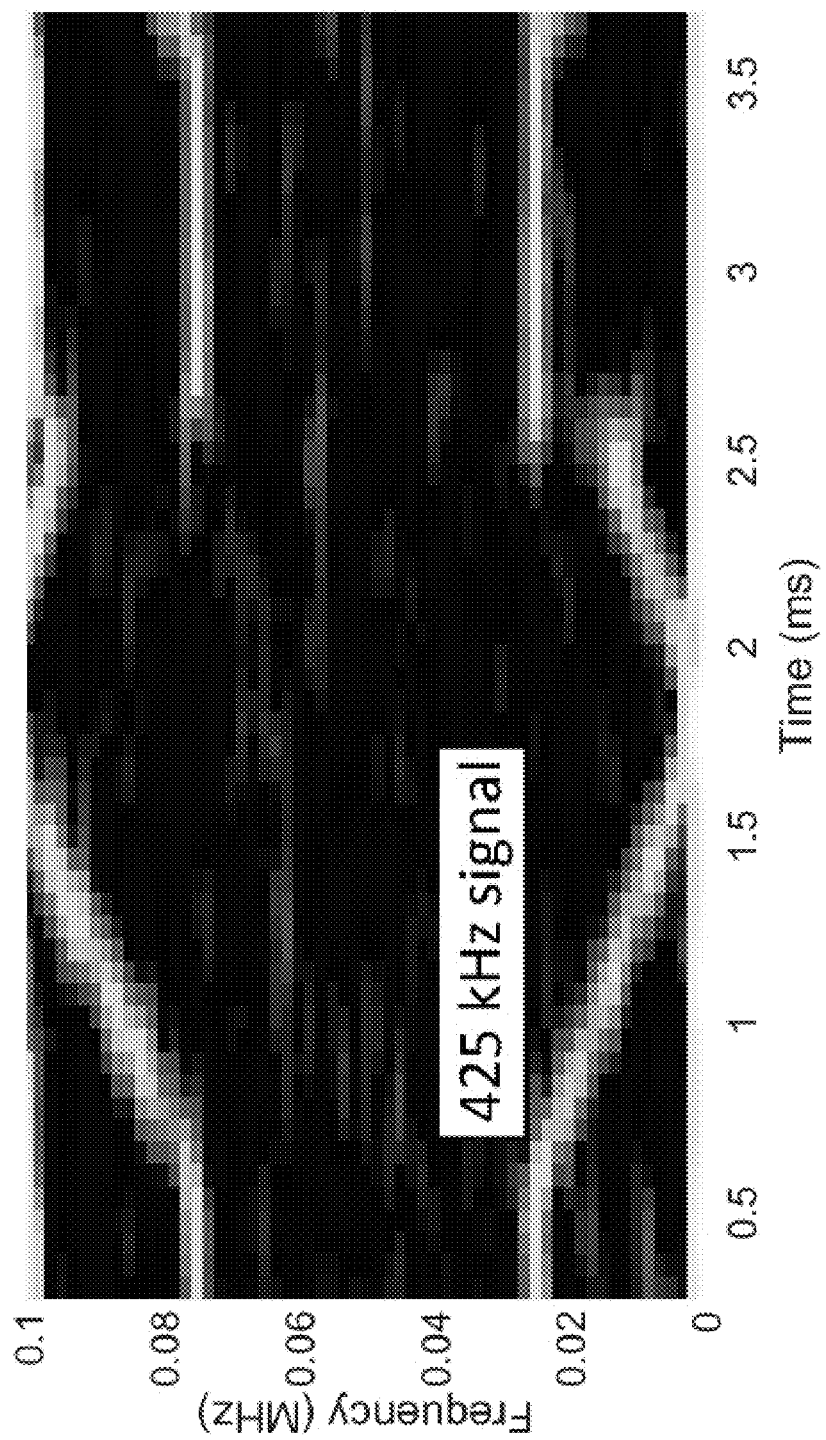
FIG. 37 illustrates a Nyquist zone overflow at 1.75 ms, according to an exemplary embodiment of this disclosure.

As a result, $S_m$ grows as either the target RF frequency or modulation sweep increases. This can cause an overflow effect where a signal modulation crosses the bounds of a Nyquist zone, changing the slope value and sign. Depending on the capture size, detection and accounting for this overflow can be performed. This is shown in FIG. 37, where a 425 kHz signal is modulated with a 10 kHz OF. The overflow is evident at the 1.75 ms point, when the slope reflects back into the N=0 Nyquist zone; however, due to the capture size of 4.0 ms, this was detected and corrected. It is recommended that the capture time $t_c$ is at least twice the modulation time $t_m$ such that $t_c > 2 t_m$.

(7) Conclusion

In conclusion, the disclosed photonic compressed sensing Nyquist folding receivers provide increased bandwidths, sampling speeds, sensitivities, and EMF noise immunity that optical devices possess. Two design architectures, the DM and SM NYFR, were described, the SM-NYFR primarily presented as a technology demonstrator, while the DM-NYFR is the primary exemplary embodiment, thereby enabling direct digitization and analysis of wideband signals from the RF spectrum.

The design was successfully simulated in OPTSIM in order to confirm functionality. Computer simulations showcase the photonic NYFR's ability to detect and recover signals an order of magnitude larger than the sampling frequency. The DM-NYFR uses two optical modulators. The first generates an FM optical impulse train, and the second incepts the signal as an envelope. The pulses are generated with an EPG outputting $V_\pi$ amplitude 30-ns wide pulses triggered every falling clock edge. The clock is frequency modulated with the specific NYFR scheme. After the signals are modulated, they are coupled into a PIN photodiode sampled by an ADC at the Nyquist rate of $2\omega_s$. Digital signal processing de-noised and thresholded the signals, which were then unfolded to recover their original Nyquist zone. Results with the hardware prototype show proof-of-concept and confirm the NYFR architecture. Target signals tested included both single tone and pulsed RF waveforms outside of the Nyquist criterion, which were successfully unfolded.

The present disclosure has been described with reference to exemplary embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

What is claimed is:

1. A photonic Nyquist Folding Receiver (NYFR) System for compressed sensing of a radio frequency (RF) environment, the photonic NYFR system comprising:
   a continuous wave (CW) laser source generating a CW laser output with a fixed wavelength;
   an electrical modulation signal source generating an electrical modulation impulse train signal output which is linearly swept to vary an amplitude and frequency of the electrical modulation impulse train;
   a wideband radio frequency (RF) antenna operatively associated amplifier generating a wideband electrical RF signal representative of a received RF signal;
   a first modulator operatively connected to the CW laser output and the electrical modulation impulse train signal output, the first modulator converting the CW laser to a sampling frequency modulated (FM) optical pulse train with a linearly swept pulse repetition frequency (PRF) and optical pulse intensity as a function of the frequency and amplitude of the electrical modulation impulse train signal, and the first modulator outputting to an output the sampling FM optical pulse train;
   a second modulator operatively connected to receive the wideband electrical RF signal generated by the wideband RF antenna, and operatively connected to the first modulator output to receive the sampling FM optical pulse train, the second modulator modulating the amplitude of the sampling optical pulses with the wideband electrical RF signal generated by the wideband RF antenna, thereby encoding the RF signal as an amplitude modulated (AM) envelope of the sampling optical pulse train;
   a photonic to electrical converter operatively connected to the second modulator, the photonic to electrical converter converting the AM envelope of the sampling FM optical pulse train to a representative electrical signal; and
   a low pass interpolation filter (LPF) operatively connected to the photonic to electrical converter to receive the representative electrical signal of the AM envelope of the sampling FM optical pulse train, the LPF outputting a Nyquist band compressed representation of the AM envelope of the sampling FM optical pulse train.

2. The photonic NYFR System according to claim 1, wherein the first and second modulators are Mach-Zehnder Interferometers (MZIs).

3. The photonic NYFR System according to claim 1, wherein the CW laser source generates a CW laser output with a wavelength of 1550 nm.

4. The photonic NYFR System according to claim 1, wherein the photonic to electrical converter is a P into N (PIN) photodiode and operatively associated low noise amplifier (LNA) which converts the AM envelope of the sampling FM optical pulse train to a representative electrical current.

5. The photonic NYFR System according to claim 1, further comprising:
   an analogue to digital converter (ADC) operatively connected to the LPF, the ADC digitizing the Nyquist band compressed representation of the AM envelope of the sampling FM optical pulse train at a Nyquist rate; and
   a digital signal processor (DSP) operatively connected to the ADC, the DSP unfolding and extracting RF information from the digitized Nyquist band compressed representation of the AM envelope of the sampling FM optical pulse train.

6. The photonic NYFR System according to claim 5, wherein the RF information includes one or more of pulse rate, carrier frequency, phase variation and frequency variation.

7. The photonic NYFR System according to claim 1, wherein the electrical modulation signal source generates an electrical modulation impulse train signal output which is a sawtooth waveform with an amplitude varying from $V_{min}$ to $V_{max}$ over a modulation period $t_m$, and the sawtooth waveform is further processed by a voltage controlled oscillator (VCO) generating a chirped sinusoidal waveform from $F_{min}$ to $F_{max}$ with $V_{min}$ mapped to $F_{min}$ and $V_{max}$ mapped to $F_{max}$, and the chirped sinusoidal waveform is further processed by a zero crossing pulse generator to generate an electrical pulse every positive-to-negative transition.

8. The photonic NYFR System according to claim 7, further comprising:
   the analogue to digital converter (ADC) operatively connected to the LPF, the ADC digitizing the Nyquist band compressed representation of the AM envelope of the sampling FM optical pulse train at a Nyquist rate; and
   a digital signal processor (DSP) operatively connected to the ADC, the DSP unfolding and extracting RF information from the digitized Nyquist band, compressed representation of the AM envelope of the sampling FM optical pulse train,
   wherein the RF information includes one or more of pulse rate, carrier frequency, phase variation and frequency variation.

9. A photonic Nyquist Folding Receiver (NYFR) for compressed sensing of a radio frequency (RF) environment, the photonic NYFR comprising:
   an electrical modulation signal source generating an electrical modulation impulse train signal output which is linearly swept to varying an amplitude and frequency of the electrical modulation impulse train;
   a first modulator operatively associated with receiving a continuous wave (CW) laser output and the electrical modulation impulse train signal output, the first modulator converting the CW laser output to a sampling frequency modulated (FM) optical pulse train with a linearly swept pulse repetition frequency (PRF) and optical pulse intensity as a function of the frequency and amplitude of the electrical modulation impulse train signal and the first modulator outputting to an output the sampling FM optical pulse train;
   a second modulator operatively associated with receiving a wideband electrical RF signal generated by a wideband RF antenna, and operatively connected to the first modulator output to receive the sampling FM optical pulse train, the second modulator modulating the amplitude of the sampling optical pulses with the wideband electrical RF signal generated by the wideband RF antenna, thereby encoding the RF signal as an amplitude modulated (AM) envelope of the sampling optical pulse train;
   a photonic to electrical converter operatively connected to the second modulator, the photonic to electrical converter converting the AM envelope of the sampling FM optical pulse train to a representative electrical signal; and
   a low pass interpolation filter (LPF) operatively connected to the photonic to electrical converter to receive the representative electrical signal of the AM envelope of the sampling FM optical pulse train, the LPF outputting a Nyquist band compressed representation of the AM envelope of the sampling FM optical pulse train.

10. The photonic NYFR System according to claim 9, wherein the first and second modulators are Mach-Zehnder Interferometers (MZIs).

11. The photonic NYFR System according to claim 9, wherein the CW laser source generates a CW laser output with a wavelength of 1550 nm.

12. The photonic NYFR System according to claim 9, wherein the photonic to electrical converter is a P into N (PIN) photodiode and operatively associated low noise amplifier (LNA) which converts the AM envelope of the sampling FM optical pulse train to a representative electrical current.

13. The photonic NYFR System according to claim 9, further comprising:
   an analogue to digital converter (ADC) operatively connected to the LPF, the ADC digitizing the Nyquist band compressed representation of the AM envelope of the sampling FM optical pulse train at a Nyquist rate; and
   a digital signal processor (DSP) operatively connected to the ADC, the DSP unfolding and extracting RF information from the digitized Nyquist band compressed representation of the AM envelope of the sampling FM optical pulse train.

14. The photonic NYFR System according to claim 13, wherein the RF information includes one or more of pulse rate, carrier frequency, phase variation and frequency variation.

15. The photonic NYFR System according to claim 9, wherein the electrical modulation signal source generates an electrical modulation impulse train signal output which is a sawtooth waveform with an amplitude varying from $V_{min}$ to $V_{max}$ over a modulation period $t_m$, and the sawtooth waveform is further processed by a voltage controlled oscillator (VCO) generating a chirped sinusoidal waveform from $F_{min}$ to $F_{max}$ with $V_{min}$ mapped to $F_{min}$ and $V_{max}$ mapped to $F_{max}$, and the chirped sinusoidal waveform is further processed by a zero crossing pulse generator to generate an electrical pulse every positive-to-negative transition.

16. The photonic NYFR System according to claim 15, further comprising:
   the analogue to digital converter (ADC) operatively connected to the LPF, the ADC digitizing the Nyquist band compressed representation of the AM envelope of the sampling FM optical pulse train at a Nyquist rate; and
   a digital signal processor (DSP) operatively connected to the ADC, the DSP unfolding and extracting RF information from the digitized Nyquist band compressed representation of the AM envelope of the sampling FM optical pulse train,
   wherein the RF information includes one or more of pulse rate, carrier frequency, phase variation and frequency variation.

17. A photonic Nyquist Folding Receiver (NYFR) System for compressed sensing of a radio frequency (RF) environment, the photonic NYFR system comprising:
   a continuous wave (CW) laser source configured to generate a CW laser output with a fixed wavelength;
   an electrical modulation signal source configured to generate an electrical modulation impulse train signal output which is linearly swept to vary an amplitude and frequency of the electrical modulation impulse train;
   a wideband radio frequency (RF) antenna system configured to generate a wideband electrical RF signal representative of a received RF signal;
   a first modulator operatively connected to the CW laser output and the electrical modulation impulse train signal output, the first modulator configured to convert the CW laser to a sampling frequency modulated (FM) optical pulse train with a linearly swept pulse repetition frequency (PRF) and optical pulse intensity as a function of the frequency and amplitude of the electrical modulation impulse train signal, and the first modulator configured to output to an output the sampling FM optical pulse train;

a second modulator operatively connected to receive the wideband electrical RF signal generated by the wideband RF antenna, and operatively connected to the first modulator output to receive the sampling FM optical pulse train, the second modulator configured to modulate the amplitude of the sampling optical pulses with the wideband electrical RF signal generated by the wideband RF antenna, thereby encoding the RF signal as an amplitude modulated (AM) envelope of the sampling optical pulse train;

a photonic to electrical converter operatively connected to the second modular, the photonic to electrical converter configured to convert the AM envelope of the sampling FM optical pulse train to a representative electrical signal; and a low pass interpolation filter (LPF) operatively connected to the photonic to electrical converter configured to receive the representative electrical signal of the AM envelope of the sampling FM optical pulse train, the LPF configured to output a Nyquist band compressed representation of the AM envelope of the sampling optical pulse train.

18. The photonic NYFR System according to claim 17, wherein the first and second modulators are Mach-Zehnder Interferometers (MZIs).

19. The photonic NYFR System according to claim 17, wherein the CW laser source configured to generate a CW laser output with a wavelength of 1550 nm.

20. The photonic NYFR System according to claim 17, wherein the photonic to electrical converter is a P into N (PIN) photodiode and operatively associated low noise amplifier (LNA) which converts the AM envelope of the sampling FM optical pulse train to a representative electrical current.

21. The photonic NYFR System according to claim 17, further comprising:

an analogue to digital converter (ADC) operatively connected to the LPF, the ADC digitizing the Nyquist band compressed representation of the AM envelope of the sampling FM optical pulse train at a Nyquist rate; and a digital signal processor (DSP) operatively connected to the ADC, the DSP unfolding and extracting RF information from the digitized Nyquist band compressed representation of the AM envelope of the sampling FM optical pulse train.

22. The photonic NYFR System according to claim 21, wherein the RF information includes one or more of pulse rate, carrier frequency, phase variation and frequency variation.

23. The photonic NYFR System according to claim 17, wherein the electrical modulation signal source generates an electrical modulation impulse train signal output which is a sawtooth waveform with an amplitude varying from $V_{min}$ to $V_{max}$ over a modulation period $t_m$, and the sawtooth waveform is further processed by a voltage controlled oscillator (VCO) generating a chirped sinusoidal waveform from $F_{min}$ to $F_{max}$ with $V_{min}$ mapped to $F_{min}$ and $V_{max}$ mapped to $F_{max}$, and the chirped sinusoidal waveform is further processed by a zero crossing pulse generator to generate an electrical pulse every positive-to-negative transition.

24. The photonic NYFR System according to claim 23, further comprising:

the analogue to digital converter (ADC) operatively connected to the LPF, the ADC digitizing the Nyquist band compressed representation of the AM envelope of the sampling FM optical pulse train at a Nyquist rate; and a digital signal processor (DSP) operatively connected to the ADC, the DSP unfolding and extracting RF information from the digitized Nyquist band compressed representation of the AM envelope of the sampling FM optical pulse train, wherein the RF information includes one or more of pulse rate, carrier frequency, phase variation and frequency variation.

\* \* \* \* \*